US009163308B2

(12) United States Patent
Bi et al.

(10) Patent No.: US 9,163,308 B2
(45) Date of Patent: Oct. 20, 2015

(54) APPARATUS FOR COATING FORMATION BY LIGHT REACTIVE DEPOSITION

(75) Inventors: Xiangxin Bi, San Ramon, CA (US);
Ronald J. Mosso, Fremont, CA (US);
Shivkumar Chiruvolu, Sunnyvale, CA (US); Sujeet Kumar, Newark, CA (US);
James T. Gardner, San Jose, CA (US);
Seung M. Lim, Livermore, CA (US);
William E. McGovern, LaFayette, CA (US)

(73) Assignee: NanoGram Corporation, Milpitas, CA (US)

( * ) Notice: Subject to any disclaimer, the term of this patent is extended or adjusted under 35 U.S.C. 154(b) by 533 days.

(21) Appl. No.: 12/512,774

(22) Filed: Jul. 30, 2009

(65) Prior Publication Data
US 2009/0288601 A1 Nov. 26, 2009

Related U.S. Application Data

(60) Division of application No. 10/414,443, filed on Apr. 15, 2003, now abandoned, which is a continuation of application No. PCT/US01/32413, filed on Oct. 16, 2001, which is a continuation-in-part of application (Continued)

(51) Int. Cl.
*C23C 16/00* (2006.01)
*B05B 5/00* (2006.01)
(Continued)

(52) U.S. Cl.
CPC .............. *C23C 16/402* (2013.01); *B05B 7/228* (2013.01); *B22F 1/0018* (2013.01);
(Continued)

(58) Field of Classification Search
CPC ...... B05B 7/228; B05B 7/0483; B05B 7/226; C23C 16/483; C23C 14/457; B05D 3/06; B05D 3/61; B05D 1/06; B05D 1/12; B01J 19/08; B22F 1/0018; B82Y 30/00

USPC ......... 118/620, 722, 50.1, 641, 503; 427/215, 427/219, 227, 561, 572, 596; 219/121; 414/217
See application file for complete search history.

(56) References Cited

U.S. PATENT DOCUMENTS 3,408,982 A * 11/1968 Capita .......................... 118/730
3,806,570 A    4/1974 Flamenbaum et al.
(Continued)

FOREIGN PATENT DOCUMENTS

EP       0 355 657 A1    2/1990
GB       2 185 494 A     7/1987
(Continued)

OTHER PUBLICATIONS

Barbarossa et al., "Effect of temperature gradient on sintering kinetics of doped silica waveguides by flame hydrolysis deposition", SPIE vol. 1794 Integrated Optical Circuits II, pp. 191-197, 1992.
(Continued)

*Primary Examiner* — Karl Kurple
(74) *Attorney, Agent, or Firm* — Peter S. Dardi; Dardi & Herbert, PLLC

(57) ABSTRACT

Light reactive deposition uses an intense light beam to form particles that are directly coated onto a substrate surface. In some embodiments, a coating apparatus comprising a non-circular reactant inlet, optical elements forming a light path, a first substrate, and a motor connected to the apparatus. The reactant inlet defines a reactant stream path. The light path intersects the reactant stream path at a reaction zone with a product stream path continuing from the reaction zone. The substrate intersects the product stream path. Also, operation of the motor moves the first substrate relative to the product stream. Various broad methods are described for using light driven chemical reactions to produce efficiently highly uniform coatings.

13 Claims, 21 Drawing Sheets

Related U.S. Application Data

No. 09/715,935, filed on Nov. 17, 2000, now Pat. No. 7,575,784.

(60) Provisional application No. 60/241,200, filed on Oct. 17, 2000.

(51) Int. Cl.
| | |
|---|---|
| C23C 16/40 | (2006.01) |
| C23C 18/12 | (2006.01) |
| B05B 7/22 | (2006.01) |
| B22F 1/00 | (2006.01) |
| C23C 16/48 | (2006.01) |
| C23C 24/10 | (2006.01) |
| C23C 26/02 | (2006.01) |
| B05D 3/00 | (2006.01) |
| B05C 9/14 | (2006.01) |
| B05D 3/06 | (2006.01) |

(52) U.S. Cl.
CPC ............ C23C 16/482 (2013.01); C23C 16/483 (2013.01); C23C 18/1266 (2013.01); C23C 24/10 (2013.01); C23C 26/02 (2013.01); *B05C 9/14* (2013.01); *B05D 3/06* (2013.01)

(56) References Cited

U.S. PATENT DOCUMENTS

| | | | | |
|---|---|---|---|---|
| 3,840,391 A * | 10/1974 | Spitz et al. | | 427/565 |
| 3,858,547 A * | 1/1975 | Bergfelt | | 118/730 |
| 3,883,336 A | 5/1975 | Randall | | |
| 3,923,484 A | 12/1975 | Randall | | |
| 3,932,162 A | 1/1976 | Blankenship | | |
| 3,934,061 A | 1/1976 | Keck et al. | | |
| 3,947,654 A * | 3/1976 | Fairbairn | | 219/121.85 |
| 4,011,067 A | 3/1977 | Carey, Jr. | | |
| 4,038,370 A | 7/1977 | Tokimoto et al. | | |
| 4,089,735 A * | 5/1978 | Sussmann | | 117/97 |
| 4,113,844 A | 9/1978 | Tokimoto et al. | | |
| 4,119,509 A | 10/1978 | Szoke | | |
| 4,121,537 A * | 10/1978 | Maruyama et al. | | 118/664 |
| 4,140,912 A | 2/1979 | Bressan et al. | | |
| 4,200,669 A * | 4/1980 | Schaefer et al. | | 427/596 |
| 4,265,932 A * | 5/1981 | Peters et al. | | 427/582 |
| 4,336,119 A * | 6/1982 | Gillery | | 204/192.13 |
| 4,395,440 A * | 7/1983 | Abe et al. | | 427/180 |
| 4,482,134 A * | 11/1984 | Uda et al. | | 266/217 |
| 4,485,759 A * | 12/1984 | Brandolf | | 118/503 |
| 4,494,968 A * | 1/1985 | Bhagavatula et al. | | 65/386 |
| 4,536,252 A * | 8/1985 | McDonald et al. | | 438/707 |
| 4,568,565 A * | 2/1986 | Gupta et al. | | 427/583 |
| 4,581,248 A * | 4/1986 | Roche | | 427/554 |
| 4,681,640 A | 7/1987 | Stanley | | |
| 4,693,211 A * | 9/1987 | Ogami et al. | | 118/725 |
| 4,726,320 A * | 2/1988 | Ichikawa | | 118/722 |
| 4,732,793 A * | 3/1988 | Itoh | | 118/620 |
| 4,735,677 A | 4/1988 | Kawachi et al. | | |
| 4,772,356 A * | 9/1988 | Schumaker et al. | | 117/89 |
| 4,782,787 A | 11/1988 | Roche | | |
| 4,814,289 A | 3/1989 | Baeuerle | | |
| 4,816,133 A * | 3/1989 | Barnett | | 204/298.06 |
| 4,836,417 A * | 6/1989 | Uchiyama et al. | | 222/63 |
| 4,838,983 A * | 6/1989 | Schumaker et al. | | 117/89 |
| 4,843,030 A * | 6/1989 | Eden et al. | | 117/90 |
| 4,868,005 A | 9/1989 | Ehrlich et al. | | |
| 4,947,463 A * | 8/1990 | Matsuda et al. | | 219/121.85 |
| 5,009,367 A * | 4/1991 | Nielsen | | 239/3 |
| 5,013,706 A | 5/1991 | Schramm et al. | | 502/309 |
| 5,043,548 A * | 8/1991 | Whitney et al. | | 219/121.47 |
| 5,060,595 A | 10/1991 | Ziv et al. | | |
| 5,085,166 A | 2/1992 | Oka et al. | | |
| 5,094,915 A * | 3/1992 | Subramaniam | | 428/408 |
| 5,108,952 A | 4/1992 | Matsuhashi | | |
| 5,126,165 A * | 6/1992 | Akihama et al. | | 427/572 |
| 5,133,286 A * | 7/1992 | Choo et al. | | 118/725 |
| 5,174,826 A | 12/1992 | Mannava et al. | | |
| 5,186,872 A * | 2/1993 | Nishiwaki et al. | | 264/5 |
| 5,208,431 A * | 5/1993 | Uchiyama et al. | | 219/121.65 |
| 5,246,745 A | 9/1993 | Baum et al. | | |
| 5,254,832 A * | 10/1993 | Gartner et al. | | 219/121.66 |
| 5,276,012 A | 1/1994 | Ushida et al. | | |
| 5,279,986 A * | 1/1994 | Maloney et al. | | 117/88 |
| 5,306,447 A | 4/1994 | Marcus et al. | | |
| 5,328,514 A * | 7/1994 | Inoue et al. | | 118/722 |
| 5,364,219 A * | 11/1994 | Takahashi et al. | | 414/217 |
| 5,385,594 A | 1/1995 | Kanamori et al. | | |
| 5,441,569 A * | 8/1995 | Veligdan et al. | | 118/723 MP |
| 5,514,350 A | 5/1996 | Kear et al. | | |
| 5,529,809 A * | 6/1996 | Glovan et al. | | 427/422 |
| 5,536,324 A * | 7/1996 | Fuchita | | 118/726 |
| 5,547,716 A * | 8/1996 | Thaler | | 427/577 |
| 5,551,966 A | 9/1996 | Hirose et al. | | |
| 5,556,442 A | 9/1996 | Kanamori et al. | | |
| 5,622,750 A | 4/1997 | Kilian et al. | | |
| 5,650,361 A * | 7/1997 | Radhakrishnan | | 438/779 |
| 5,652,021 A | 7/1997 | Hunt et al. | | |
| 5,679,159 A * | 10/1997 | Olson | | 118/500 |
| 5,739,910 A * | 4/1998 | Castor | | 356/369 |
| 5,744,777 A | 4/1998 | Bernecki et al. | | |
| 5,770,126 A | 6/1998 | Singh et al. | | |
| 5,814,152 A * | 9/1998 | Thaler | | 118/641 |
| 5,837,316 A * | 11/1998 | Fuchita | | 427/191 |
| 5,858,465 A | 1/1999 | Hunt et al. | | |
| 5,863,604 A | 1/1999 | Hunt et al. | | |
| 5,874,134 A | 2/1999 | Rao et al. | | |
| 5,885,904 A | 3/1999 | Mehta et al. | | |
| 5,938,979 A | 8/1999 | Kambe et al. | | |
| 5,958,348 A * | 9/1999 | Bi et al. | | 422/186.04 |
| 5,993,549 A * | 11/1999 | Kindler et al. | | 118/308 |
| 5,997,947 A * | 12/1999 | Burns et al. | | 427/240 |
| 5,997,956 A | 12/1999 | Hunt et al. | | |
| 6,011,981 A | 1/2000 | Alvarez et al. | | |
| 6,013,318 A | 1/2000 | Hunt et al. | | |
| 6,017,630 A * | 1/2000 | Tanaka et al. | | 428/402 |
| 6,024,824 A * | 2/2000 | Krech | | 156/279 |
| 6,032,871 A | 3/2000 | Borner et al. | | |
| 6,037,006 A * | 3/2000 | Chakrabarti et al. | | 427/294 |
| 6,074,888 A | 6/2000 | Tran et al. | | |
| 6,097,144 A | 8/2000 | Lehman | | |
| 6,110,291 A * | 8/2000 | Haruta et al. | | 118/726 |
| 6,116,184 A * | 9/2000 | Solayappan et al. | | 118/50.1 |
| 6,120,857 A * | 9/2000 | Balooch et al. | | 427/596 |
| 6,235,118 B1 * | 5/2001 | Hayashi | | 118/708 |
| 6,251,488 B1 * | 6/2001 | Miller et al. | | 427/596 |
| 6,254,928 B1 | 7/2001 | Doan | | |
| 6,258,201 B1 * | 7/2001 | Krech | | 156/279 |
| 6,280,802 B1 * | 8/2001 | Akedo et al. | | 427/561 |
| 6,290,735 B1 * | 9/2001 | Kambe et al. | | 51/307 |
| 6,370,165 B1 * | 4/2002 | Badzian et al. | | 372/7 |
| 6,440,504 B1 * | 8/2002 | Akiyama | | 427/569 |
| 6,531,187 B2 * | 3/2003 | Akedo | | 427/475 |
| 6,759,284 B2 * | 7/2004 | Kang et al. | | 438/151 |
| 6,827,634 B2 * | 12/2004 | Akedo | | 451/54 |
| 6,890,624 B1 * | 5/2005 | Kambe et al. | | 428/195.1 |
| 6,915,179 B2 * | 7/2005 | Emoto | | 700/121 |
| 6,984,404 B1 | 1/2006 | Talton et al. | | 424/490 |
| 6,994,894 B2 * | 2/2006 | Hofmeister | | 427/596 |
| 7,114,910 B2 * | 10/2006 | Stalder | | 415/1 |
| 7,524,537 B2 * | 4/2009 | Anderson et al. | | 427/448 |
| 7,587,829 B2 * | 9/2009 | King et al. | | 30/346.54 |
| 8,544,408 B2 * | 10/2013 | Ewers | | 118/308 |
| 2003/0228415 A1 | 12/2003 | Bi et al. | | |
| 2004/0048453 A1 * | 3/2004 | Kang et al. | | 438/486 |
| 2006/0108450 A1 | 5/2006 | Klinkenberg et al. | | 239/525 |
| 2006/0288937 A1 * | 12/2006 | Dando et al. | | 118/722 |
| 2007/0003694 A1 * | 1/2007 | Chiruvolu et al. | | 427/180 |
| 2011/0300306 A1 * | 12/2011 | Mohanty | | 427/554 |

(56) References Cited

U.S. PATENT DOCUMENTS

| | | | | |
|---|---|---|---|---|
| 2012/0267347 | A1* | 10/2012 | Arjakine et al. | 219/121.64 |
| 2013/0004673 | A1* | 1/2013 | Ikeda | 427/421.1 |

FOREIGN PATENT DOCUMENTS

| | | |
|---|---|---|
| GB | 2 032 588 | 5/1990 |
| JP | 62-205279 | 9/1987 |
| JP | 63-011673 | 1/1988 |
| JP | 63053273 A | 3/1988 |
| JP | 01309956 | 12/1989 |
| JP | 02-088775 | 3/1990 |
| JP | 02088775 A | 3/1990 |
| JP | 5-313221 | 11/1993 |
| JP | 6116743 | 4/1994 |
| JP | 6144867 | 5/1994 |
| JP | 08-091994 | 4/1996 |
| JP | 10280152 | 10/1998 |
| JP | 11-509476 | 8/1999 |
| JP | 2000-008166 | 1/2000 |
| JP | 2000-212766 | 8/2000 |
| JP | 2005-031321 A | 2/2005 |
| WO | 94/26425 A1 | 11/1994 |
| WO | 98/37961 A1 | 9/1998 |
| WO | 99/23189 A1 | 5/1999 |
| WO | 99/61244 A1 | 12/1999 |
| WO | 00/26151 A1 | 5/2000 |
| WO | 02/27754 A3 | 4/2002 |

OTHER PUBLICATIONS

Barbarossa et al., "High-silica cascaded three-waveguide couplers for wideband filtering by Flam Hydrolysis on Si", SPIE vol. 1583 Integrated Optical Circuits, pp. 122-128, 1991.

Barbarossa et al., "Optical damage threshold of P2O5 and GeO2—P2O5-doped silica waveguides", SPIE vol. 1794 Integrated Optical Circuits II, pp. 185-190, 1992.

Barbarossa et al., "High-silica low-loss three waveguide couplers on Si by Flame Hydrolysis Deposition", SPIE vol. 1513 Glasses for Optoelectronics II, pp. 37-43, 1991.

Besling et al., Laser-Induced Chemical Vapor Deposition of Nanostructured Silicon Carbonitride Thin Films, 1997, pp. 544-553, Laboratory for Applied Inorganic Chemistry, Delft University of Technology, Julianalaan 136, 2628 BL Delft, The Netherlands.

Bilenchi et al., CO2 Laser-Assisted Deposition of Boron and Phosphorus-Doped Hydrogenated Amorphous Silicon, American Institute of Physics 1985, pp. 279-281.

Bilenchi et al., Hydrogenated Amorphous Silicon Growth by CO2 Laser Photodissociation of Silane, American Institute of Physics 1982, pp. 6479-6481.

Bornard et al., LiNbO3 Thin Films Deposited on Si Substrates: a Morphological Development Study, Materials Chemistry and Physics, pp. 571-577, Elsevier Science B.V. 2002.

Center for Nano Particle Control, Website Mansoo Choi, Associate Professor of Mechanized Engineering, Seoul National University, Jun. 2000.

Ichinose et al., Deposition of LaMO3 (M=Co, Cr, Al) Films by Spray Pyrolysis in Inductively Coupled Plasma, Journal of Crystal Growth, pp. 59-64, Elsevier Science B.V. 1994.

Ichinose et al., Deposition of LaMO3 (M=Co, Cr, Al)-Oriented Films by Spray Combustion Flame Technique, Jpn. J. Appl. Phys. vol. 33 (1994), pp. 5907-5910.

International Preliminary Examination Report (PCT/US01/32413) dated Mar. 4, 2003.

International Search Report (PCT/US01/32413) dated Feb. 27, 2002.

Interrogatory from the Japanese Patent Office dated Mar. 5, 2009 (Japanese Patent Application No. 2002-535816) received from the Japanese Associate on Mar. 23, 2009.

Jervis, Metal Film Deposition by Gas-Phase Laser Pyrolysis of Nickel Tetracarbonyl, American Institute of Physics 1985, pp. 1400-1401.

Kim et al., Deposition of MgO Thin Films by Modified Electrostatic Spray Pyrolysis Method, Thin Solid Films 376 (2000), pp. 110-114, Elsevier Science S.A. 2000.

Lebedev et al., "Laser distillation-deposition synthesis of silica glasses with variable concentrations of oxygen deficient centers", SPIE vol. 2498, pp. 65-71, 1995.

Liang et al., "Laser synthesize silicon-based and ferro-based nano powders", SPIE vol. 3862, pp. 17-21, 1999.

Magee et al., Laser-Induced Conversion of Molecular Precursors to Thin Films and Deposited Layers, American Chemical Society 1990, pp. 232-235.

Maric et al., Electrolyte Materials for Intermediate Temperature Fuel Cells Produced via Combustion Chemical Vapor Condensation, Electrochemical and Solid-State Letters, 6 (5) 2003, pp. A91-A95.

Maxwell, "Photosensitivity & rare-earth doping in flame hydrolysis deposited planar silica waveguides", SPIE vol. 2695, pp. 16-29, 1996.

Meunier et al, Hydrogenated Amorphous Silicon Produced by Laser Induced Chemical Vapor Deposition of Silane, American Institute of Physics 1983, pp. 273-275.

Meunier et al, Laser-Induced Chemical Vapor Deposition of Hydrogenated Amorphous Silicon. I. Gas-Phase Process Model, American Institute of Physics 1987, pp. 2812-2821.

Meunier et al, Laser-Induced Chemical Vapor Deposition of Hydrogenated Silicon. II. Film Properties, American Institute of Physics 1987, pp. 2822-2829.

Oljaca et al., Deposition of BaxSr1-x TiO3 in Atmospheric Pressure Flame: Combustion Monitoring and Optimization of Thin Film Properties, Surface Engineering, vol. 19, No. 1, 2003, pp. 51-57.

Preliminary Office Action dated Mar. 3, 2009, from the Korean Patent Office (Korean Patent Application No. 10-2008-7015100).

Rabii et al., "Recent advances in the fabrication of hollow glass waveguides", SPIE vol. 3262, pp. 103-107, 1998.

Sun et al, "Building passive components with silica waveguides", SPIE vol. 3795, pp. 313-319, 1999.

Supplementary European Search Report (EP 01 98 7697) dated Mar. 3, 2008.

Tsukamoto et al., "A New Ceramics Coating Techniqu for SOFC Using the ETL Laser Spraying Process", Solid State Ionics, 40/41 (1990) 103-106.

Vukasinovic et al., Closed Loop Controlled Deposition of BaxSr1-x TiO3 Thin Films in Spray Flames, Surface Engineering, vol. 19, No. 3, 2003, pp. 179-184.

Xiao et al., Silicon nitride synthesis by Laser Pyrolysis of an Aerozol-Dispersed Precursor, Mat. Res. Soc. Symp. Proc. vol. 168, 1990, pp. 299-304.

Notice of Rejection (JP2002-53516) dated Nov. 12, 2009.

Allen et al. "Abstract: Laser chemical vapor deposition of metals and insulators" J. Vac. Technol., 16(2), Mar./Apr. 1979, p. 431.

* cited by examiner

APPARATUS FOR COATING FORMATION BY LIGHT REACTIVE DEPOSITION

CROSS REFERENCE TO RELATED APPLICATIONS

This application is a divisional of U.S. patent application Ser. No. 10/414,443 now abandoned to Bi et al. filed on Apr. 15, 2003, entitled "Coating Formation By Reactive Deposition," incorporated herein by reference, which is a continuation of International Application PCT/US01/32413, designating the U.S. filed on Oct. 16, 2001 to Bi et al., entitled "Coating Formation By Reactive Deposition," incorporated herein by reference, which claims priority to U.S. Provisional Patent Application No. 60/241,200, filed on Oct. 17, 2000 to Bi et al., entitled "Coating Formation By Reactive Deposition," incorporated herein by reference, and which is a continuation-in-part of U.S. patent application Ser. No. 09/715,935, now U.S. Pat. No. 7,575,784 filed Nov. 17, 2000 to Bi et al., entitled "Coating Formation By Reactive Deposition," incorporated herein by reference.

FIELD OF THE INVENTION

The invention relates to the formation of a coating on the surface of a substrate, for example, for eventual formation of optical devices or electrical devices. In particular, the invention relates to highly uniform particle coatings on substrates and to efficient ways of forming highly uniform particle coatings that can be further processed to form glasses and other highly uniform coatings on a substrate.

BACKGROUND OF THE INVENTION

The consolidation or integration of mechanical, electrical and optical components into integral devices has created enormous demands on material processing. Furthermore, the individual components integrated in the devices are shrinking in size. Therefore, there is considerable interest in the formation of specific compositions applied to substrates. In order to form optical devices with high quality optical coatings from these materials, the coatings must be highly uniform. Interest in forming highly uniform materials for these coatings has sparked the development of processes.

Presently used optical communication light wavelengths are from 1.3 to 1.6 microns. Optical waveguides generally have dimensions many times the wavelength. Thus, optical structures can have dimensions from a few microns to about 100 microns depending on optical mode requirements and other factors.

An explosion of communication and information technologies including internet-based systems has motivated a worldwide effort to implement fiber optical communication networks to take advantage of a very large bandwidth. The capacity of optical fiber technology can be expanded further with implementation of Dense Wavelength Division Multiplexing technology. With increasing demands more channels are needed to fulfill the system functions. Integrated components can be used to replace discrete optical components to supply the desired capacity.

Optical components can be integrated onto a planar chip-type base similar to an electronic integrated circuit. By placing the optical components onto an integrated chip such as a silicon wafer, many optical components can be squeezed into a very small footprint. For the mass production of these integrated optical chips, existing semiconductor technology, such as lithography and dry etching, can be involved advantageously in appropriate steps of the production process.

The production of integrated optical components requires the deposition of high quality optical materials onto the substrate surface. Furthermore, the optical materials must be fashioned into specific devices. In particular, a promising technology for the integration of optical components centers around the production of planar waveguides. Semiconductor approaches have been used to form the waveguides following the deposition of optical materials.

Basic characteristics of optical film coatings include surface quality, film uniformity and optical quality. Optical quality refers to small enough absorption and scattering loss to achieve desired levels of transmission. Optical quality also includes the uniformity of optical properties, such as index of refraction and bi-refringence properties. In addition, optical quality includes interface quality, such as the interface between the core layers and cladding layers. Current benchmarks are established, for example, by glass fibers, planar waveguide glass, lithium niobate, and InP. For silica ($SiO_2$) suitable forms include a glass, while for other materials single crystal forms have the highest quality optical transmission.

Several approaches have been used and/or suggested for the deposition of the optical materials. These approaches include, for example, flame hydrolysis deposition, chemical vapor deposition, physical vapor deposition, sol-gel chemical deposition and ion implantation. Flame hydrolysis deposition has become the leader for commercial implementation of planar waveguides. Flame hydrolysis and forms of chemical vapor deposition have also been successful in the production of glass fibers for use as fiber optic elements. Flame hydrolysis deposition involves the use of a hydrogen-oxygen flame to react gaseous precursors to form particles of the optical material as a coating on the surface of the substrate. Subsequent heat treatment of the coating can result in the formation of a uniform optical material, which generally is a glass material.

No clear approach has been established as the leading contender for production of the next generation of integrated optical components that will have stricter tolerances for uniformity and purity. Flame hydrolysis deposition is efficient, but cannot be easily adapted to obtain more uniform coatings. Chemical vapor deposition involves the deposition of radicals, molecules and/or atoms onto the substrate surface rather than particles. Chemical vapor deposition can achieve very uniform materials, but the process is extremely slow. If attempts are made to increase the rates, the film quality is compromised, which reduces any advantage of the chemical vapor deposition process.

At the same time, approaches have been developed for the production of highly uniform submicron and nanoscale particles by laser pyrolysis. Highly uniform particles are desirable for the fabrication of a variety of devices including, for example, batteries, polishing compositions, catalysts, and phosphors for optical displays. Laser pyrolysis involves an intense light beam that drives the chemical reaction of a reactant stream to form highly uniform particles following the rapid quench of the stream after leaving the laser beam.

SUMMARY OF THE INVENTION

In a first aspect, the invention pertains to a coating apparatus comprising a noncircular reactant inlet, optical elements forming a light path, a first substrate, and a motor connected to the apparatus. The reactant inlet defines a reactant stream path. The light path intersects the reactant stream path at a reaction zone with a product stream path continuing from the reaction zone. The substrate intersects the product stream path. Also, operation of the motor moves the first substrate relative to the product stream.

In another aspect, the invention pertains to a method of coating a substrate, the method comprising reacting a reactant stream, directing a product stream to a substrate, and moving the substrate relative to the product stream to coat the substrate. The reaction of the reactant stream is performed by directing a focused radiation beam at the reactant stream to produce a product stream comprising particles downstream from the radiation beam. In these embodiments, the reaction is driven by energy from the radiation beam. The coating method can be incorporated into a method of forming a glass coating. The glass coating is formed by heating a particle coating at a temperature and for a period of time sufficient to fuse the particles into a glass. The method of forming the glass coating can be used in a method of forming an optical component on a substrate surface. The method for forming the optical component further includes removing a portion of a glass coating to form the optical component.

In a further aspect, the invention pertains to a method of coating a substrate comprising generating a reactant stream, reacting the reactant stream to form a product stream of particles, and directing the stream of particles to a substrate, wherein flow of the product stream is maintained other than by pumping on the substrate. In some embodiments, the reactant stream has a cross section perpendicular to the propagation direction characterized by a major axis and a minor axis, the major axis being at least a factor of two greater than the minor axis.

In addition, the invention pertains to a method of coating a substrate having a diameter greater than about 5 cm, the method comprising reacting a reactant stream to form a product stream comprising product particles and depositing a stream of particles. The particles are deposited simultaneously over the entire surface of the substrate. In some embodiments, at least about 5 grams per hour of particles are deposited onto the substrate.

Furthermore, the invention pertains to a method of coating a substrate comprising simultaneously generating multiple product streams by chemical reaction driven by a light beam. Then, the multiple product streams are deposited simultaneously on a moving substrate at sequential locations on the substrate.

Also, the invention pertains to a method of coating a substrate comprising reacting a reactant stream to form a product stream of particles at a high-throughput rate, and depositing this product stream of particles onto a substrate. The invention further pertains to a high-rate method of producing a coated substrate comprising reacting a reactant stream to form a product stream of particles, and depositing this product stream of particles onto a substrate wherein the substrate and the particle flow move relative to each other at a high rate (e.g., at a rate greater than about 1 substrate per minute).

In an additional aspect, the invention pertains to a method for coating a substrate comprising reacting a flowing reactant stream to form a stream of product particles and depositing at least a portion of the product particles onto a substrate. The deposition of the particles is performed at a deposition rate of at least about 5 g/hr.

In further aspects, the invention pertains to a method for coating a substrate comprising reacting a flowing reactant stream to form a stream of product particles and depositing a least a portion of the product particles onto a substrate. The deposition of the product particles comprises moving the substrate relative to the stream of product particles at a rate of at least about 0.1 centimeters per second.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DETAILED DESCRIPTION OF THE ILLUSTRATIVE EMBODIMENTS

Figure 1:
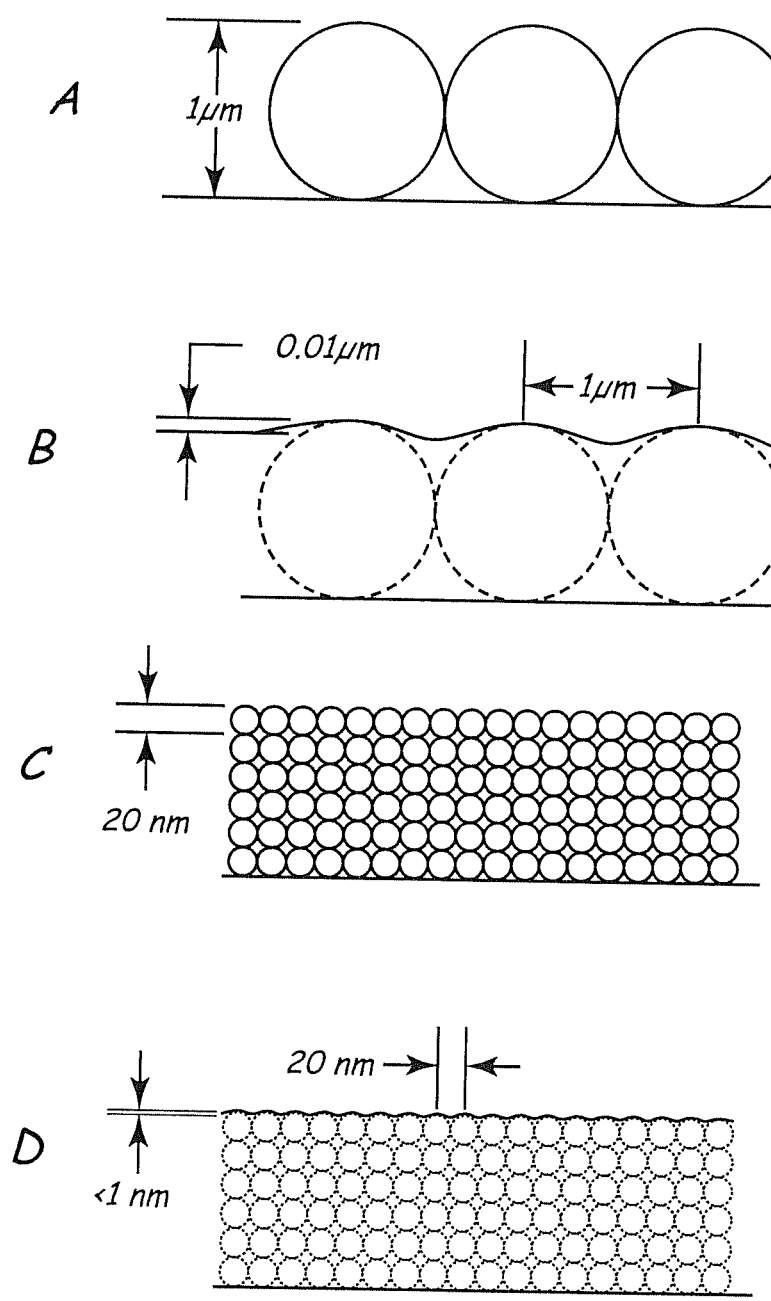
FIG. 1A is a schematic illustration of a particle coating formed with 1 micron diameter particles.
FIG. 1B is a schematic illustration of a continuous coating formed by heat treating the particle coating in FIG. 1A.
FIG. 1C is a schematic illustration of a particle coating formed with 20 nm diameter particles.
FIG. 1D is a schematic illustration of a continuous coating formed by heat treating the particle coating of FIG. 1C.

An improved coating process is based on the use of radiation to drive and mediate a chemical reaction to form highly uniform particles that are deposited onto a substrate to form a coating. The particle production feature of the invention can take advantage of various compositions and processing improvements that have been developed for radiation-based particle formation, especially using laser pyrolysis. Light reactive deposition, as described herein, is an adaptation of laser pyrolysis for the immediate deposition of particles onto a surface. In particular, a wide range of reaction precursors can be used in either gaseous and/or aerosol form, and a wide range of highly uniform product particles can be efficiently produced. Following deposition of the particle coating, the substrate and coating can be heated to fuse the particles into a highly uniform continuous coating. The resulting coating can be further processed into components, especially optical components. The heating process can be adjusted to yield a glass.

For the production of particles, laser pyrolysis apparatuses have included a collector system to collect particles for subsequent use. The present approaches for light reaction deposition involve the direct coating onto a substrate without separate collection of the particles. Furthermore, if the reaction zone is positioned near the substrate surface, the particles can be hot when they contact the surface. Thus, the particles are never segregated as a particle collection prior to forming the coating on a substrate.

The substrate can be porous or non-porous. Generally, the substrate is flat, sturdy and has a high melting point. The substrate can be heated during or prior to the deposition to reduce thermal stress of to stimulate compaction of the particles during the deposition prior to a subsequent melting process to consolidate the particles into a uniform layer. Alternatively, the substrate can be cooled or maintained at a temperature cooler than the particle stream such that the hot particles are attracted to the surface. The direct coating approach described herein is in contrast with collection on a porous filter for subsequent separation of the particles from the filter material. The particles coated on the substrate can be further processed into a uniform coating with desired characteristics.

In some embodiments, the reactant flow is directed through a reaction zone to produce a product flow that is directed toward a substrate open to the atmosphere. The reaction zone includes the intersection of the reactant flow with a focused radiation beam. The product stream acts as a flat particle spray. The reaction zone can be enclosed in a chamber to form a spray nozzle. The pressure of the reactant stream drives the flow of the product stream toward the substrate. The reactant flow generally is at a pressure greater than 760 torr if the deposition is performed at atmospheric pressure.

In other embodiments, the coating is performed within a coating chamber sealed from the ambient atmosphere. The coating chamber can be separate from but connected to the reaction chamber, or the coating chamber can be integral with the reaction chamber such that the particles are produced in the same chamber in which the coating is formed on the substrate. For embodiments with a separate coating chamber, the coating chamber can be connected to the reaction chamber through a conduit. A pump can be connected to the coating chamber to maintain overall flow and an appropriate pressure through the system. Alternatively, the flow of reactants and diluents into the chamber can maintain the flow. To perform the coating, the substrate is placed to contact the product particle stream. Product particles stick to the surface while remaining gases and any remaining particles are carried away by the flow.

If the coating is performed within the particle production chamber, the radiation can intersect with reactants at a reaction zone near the opening from the nozzle delivering the reactants. The substrate surface to be coated is placed just beyond the reaction zone. The distance between the reaction zone and the nozzle and between the reaction zone and the substrate can be made adjustable. The optimal distances can be evaluated empirically. Generally, in these embodiments the particles are deposited shortly after they are produced.

After the initial coating process, a layer of particles is located on the coated surface. Having formed a particle coating on the substrate, a binder or other additives can be applied to the particles to stabilize the particle coating. A variety of organic polymers can be used as a binder. Alternatively, the binder or additives can be added during the particle deposition process. The binder or additive can be used to enhance particle-substrate adhesion, to enhance particle-particle adhesion, to lower the sintering temperature, to form an etching barrier to assist with subsequent etching, or to contribute other desired characteristics to the coating. In some embodiments, the additives are removed prior to or during a heat treatment step to consolidate the powders into a solid layer.

In other alternative embodiments, the substrate with the particle coating can be heated to melt and fuse the particles into a continuous layer. Other elements such as titanium, boron, phosphorous and geranium can be added to lower the melting point of the materials to assist with consolidation of the powders into a continuous layer. However, the use of nanoparticles can significantly lower the melting point without the need for the use of additives to lower the melting or flow temperature. Thus, the deposition of nanoparticles has a significant potential advantage over the deposition of larger particles.

Since the packing of particles results in a considerable thickening even with submicron particles, the thickness of the coating generally shrinks considerably due to the fusing of the particles during the consolidation step. For example, the powders can form a layer as thick as a few millimeters that generally shrinks down to less than about 100 microns following the consolidation into a solid layer. There is a corresponding increase in the density. An amorphous, i.e., glass, coating or a crystalline coating can result following cooling of the consolidated layer, depending on the composition of the particles and the precise heating and cooling conditions. It is typical to form a glass since polycrystalline materials that can form may not have sufficiently good optical properties due to scattering.

In particular, the quench rate should be controlled to produce a consolidated material with desired properties. The quench is typically not too fast since a fast quench can introduce stresses in the glass that can result in cracking of the glass. If the quench is too slow, crystallites can form that scatter light. $SiO_2$ forms a glass that transmits light with a 1.55 micron wavelength. While a sufficient temperature to melt the particles may be relatively high, the heating temperature generally is selected to avoid melting the substrate.

In some embodiments, light reactive deposition is used to produce submicron or nanoscale particles that are directed to a non-porous surface to perform the coating. In light reactive deposition, a reactant stream is pyrolyzed by an intense light beam, such as a laser beam. While a laser beam is a convenient energy source, other intense, focused light sources can be used in light reactive deposition. The intense light source drives the reaction, in contrast with combustion reactions driven by heat from the chemical reaction itself. The energy from the light source drives the reaction even if the reaction is exothermic since the light energy results in completion of the reaction within a small reaction zone. Light reactive deposition can provide for formation of phases of materials that are difficult to form under thermodynamic equilibrium conditions. As the reactant stream leaves the light beam, the product particles are rapidly quenched.

A basic feature of successful application of light reactive deposition for the production of particles is production of a reactant stream containing appropriate chemical precursors and a radiation absorber. The chemical precursors can be sufficient radiation absorbers such that no separate radiation absorber is needed. The chemical precursors supply the atomic constituents for the product particles. The reaction conditions can be varied to produce product particles with a desired stoichiometry and structure. As described further below, laser pyrolysis has been successfully applied for the production of a wide variety of product particles. By analogy, these same particle compositions can be generated using light reactive deposition.

In some embodiments, the light reactive deposition apparatus includes an extended reactant inlet such that a stream of particles is generated within a flowing sheet forming a reactant/product stream. Using an extended reactant inlet, a line of particles can be simultaneously deposited. Also, a higher particle production rate can be maintained without sacrificing control of the product particle properties or deposition uniformity. Thus, by depositing a line of particles, the coating process can be performed more rapidly. The reactant inlet can have dimensions selected to coat the entire substrate in a single pass.

Light reactive deposition has considerable advantage for the production of particles for coating substrate surfaces. First, light reactive deposition can be used in the production of a large range of product particles. Thus, the composition of the coating can be adjusted in a variety of ways. Furthermore, light reactive deposition can produce very small particles with a high production rate. When small particles are coated onto the surface of the substrate, a smoother coating with a more uniform thickness results.

Figure 35:
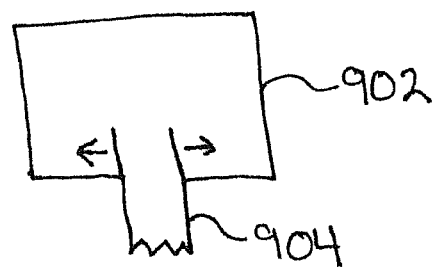
FIG. 35 is a schematic depiction of a reactant inlet movable relative to a deposition chamber.

In some embodiments, the non-porous substrate and the product particle stream are moved relative to each other to generate the coating on the surface. The rate of the relative motion can be selected to provide a desired coating thickness. Generally, this relative motion is accomplished by mounting the non-porous substrate on a stage or conveyor. The stage or conveyor can be motorized and programmed to move at a selected rate. Movement of the stage or conveyor can sweep the product stream across the surface of the substrate to deposit a uniform coating of particles across the surface. FIG. 35 is a schematic depiction of a nozzle (904) that is movable (shown by arrows) relative to a reaction chamber (902).

In some embodiments, the product particle stream is defocused to produce a uniform cloud of product particles. The distance between the particle nozzle and the substrate is far enough that the particles lose the direct momentum to the substrate. The particles can be sprayed into an open volume to form a cloud of particles. External fields, such as, thermal gradients and electric field gradients, can be used to pull the particles toward the surface where the particles condense into a coating. External fields can also be used to defocus the particle beam to form the particle cloud. The particle cloud is directed at the substrate surface to deposit the coating simultaneously across the all or a desired portion of the surface of the substrate. Thus, a large uniform coating can be applied without needing moving parts to sweep the substrate.

In some embodiments, the system is configured for the coating of multiple substrates without opening the internal components of the apparatus to the ambient atmosphere. For example, a plurality of substrates can be mounted on a stage. Following completion of coating of one substrate, the stage advances the coated substrate out of the way and positions another substrate to be coated next. Particle production can be momentarily stopped during the positioning of a subsequent substrate or particle production can be continued with a modest amount of waste of the particles that are generated when there is no substrate in position for deposition.

Alternatively, the substrates can be mounted on a conveyor. Similar to the stage embodiment, the conveyor moves the substrate relative to the product particle stream to coat the substrate with a uniform layer of particles. Once a substrate is coated, the conveyor moves another substrate into position and moves the coated substrate to another station for further processing of the coated substrate within the chamber. In particular, a coated substrate can be moved to a continuous flow furnace for heat processing.

There are at least two mechanisms that can lead to surface roughness. First, since the glass melt is a viscous liquid at the consolidation temperature, a long time may be required for the melted glass to diffuse uniformly to other areas. Local density variation due to non-uniform diffusion naturally causes surface roughness as the melt is quenched into a solid. Inn addition, non-uniform densities can result from process instability in the particle deposition process that results in different particle properties across the substrate surface. Variation in particle formation can lead to surface roughness since the consolidation process may not eliminate the non-uniformity reflected in the deposited particles. Therefore, it is important to produce not only small and uniform particles, but also to control process stability to deposit these particles uniformly across the substrate surface.

Coating formation with smaller and more uniform particles can result in a more uniform continuous coating following further processing. This is visually shown in a representation in FIG. 1. Referring to FIG. 1A, a monolayer coating with 1 micron particles is shown schematically. Upon melting and subsequent cooling, a continuous layer is formed with corrugations along the top surface with about 0.01 micron variations at a wavelength of about 1 micron, as shown in FIG. 1B.

While coatings generally are formed with thicknesses many times the particle diameters, comparable results would be expected with thicker coatings. The corrugations reflect some characteristics of the particles, such as size and uniformity, and may also reflect the uniformity of the deposition process with respect to the evenness of the coating. In summary, the formation of a continuous coating by the melting of solid powders has a particle deposition step, a heating step and a quenching step. The melt formed in the heating step has a high viscosity. The presence of the substrate generally limits the heating temperature, such that a high temperature melt cannot be formed that would flow rapidly to form a smooth surface.

Referring to FIG. 1C, a hypothetical coating formed with 20 nm particles is shown schematically. Upon fusing or annealing to form a uniform coating, the variations on the surface are less than a nanometer (0.001 microns) with a period of about 20 nm. This increased smoothness and uniformity generally is maintained through further processing steps. In summary, light reactive deposition provides a rapid and efficient approach for the production of a wide variety of coating materials suitable for the production of higher quality coatings. Of course, to achieve the advantages of small, uniform particles, the deposition should be controlled to uniformly deposit the particles onto the substrate.

As described in the examples below, silicon oxide glass coatings following heating have been formed that have a root mean square surface roughness, as measured by atomic force microscopy, of about 0.25 to about 0.5 nm. Thus, the surfaces are smoother than are thought to be obtained by flame hydrolysis deposition and roughly comparable to smoothnesses obtainable by chemical vapor deposition. These smooth glass coating applied by light reactive deposition (LRD) were deposited at relatively high deposition rates by moving the substrate through the product stream. Thus, LRD has already demonstrated the ability to be an efficient and effective approach for the formation of very high quality glass coatings.

For the production of discrete devices or structures on the substrate surface formed by the coating, various patterning approaches can be used. For example, conventional approaches from integrated circuit manufacturing, such as photolithography and dry etching, can be used to pattern the coating following deposition.

Before or after patterning, the coating can be heat processed to transform the coating from a layer of discrete particles into a continuous layer. In some embodiments, particles in the coating are heated to consolidate the particles into a glass. Glass formation is particularly desirable for the production of optical devices. Alternatively, a crystalline coating can be formed from the particle coating by heating under conditions to anneal the particles to form crystals. The heating and quenching times can be adjusted to change the properties of the consolidated coatings.

In addition to the formation of optical devices, particle coatings applied by light reactive deposition are useful for a variety of other applications. For example, iron oxide particles and/or iron carbide particles can be formed into a coating with a binder for electromagnetic shielding. These coatings are described in U.S. Pat. No. 5,938,979 to Kambe et al., entitled "Electromagnetic Shielding," incorporated herein by reference. Photocatalytic coatings are described in copending and commonly assigned U.S. Pat. No. 6,099,798 to Kambe et al., entitled "Ultraviolet Light Block And Photocatalytic Materials," incorporated herein by reference. Prior applications of nanoparticle coating have required the harvesting of the particles prior to the production of the coating using the particles. The present improvements couple the particle generation process with the deposition process that provides for the production of desired materials that are incorporated into high quality coatings.

In some applications, the particles are used to form optical devices on the surface of the substrate. For example, high-silica glass can be used to form optical waveguides, optical fiber guides and optical device guides on a silicon surface. The optical waveguides need to have a different index of refraction from the materials surrounding them. Layers with different compositions and corresponding indices of refraction can be deposited. Dopants can be introduced to effect the changes in index of refraction.

To form the particular optical devices desired, one or more layers of particles are deposited onto the surface. The layer contacting the surface is an undercladding layer. A core layer is placed onto the undercladding layer, and an over-cladding layer is placed onto the core layer. In one embodiment, the undercladding layer and the over-cladding layer are formed from $SiO_2$ and the core layer is formed from doped $SiO_2$. The composite of the layers can be referred to as a film.

The core layer can be etched to form the desired optical devices. Photolithography and other appropriate patterning approaches can be used to pattern the core layer for the etching process. The processing to form integrated optical devices is described further below. See also, U.S. Pat. No. 4,735,677 to Kawachi et al., entitled "Method For Fabricating Hybrid Optical Integrated Circuit," incorporated herein by reference.

A. Particle Production

As described above, light reactive deposition involves the generation of particles using a radiation beam. The particles are subsequently deposited onto a substrate. In some embodiments, the particles remain very hot when they contact the surface since the reaction zone is positioned near the substrate. Light reactive deposition incorporates features of laser pyrolysis for the production of submicron and nanoscale particles. The particles generally can include crystalline particles and/or amorphous particles that are suitable for subsequent processing into a finished coating.

Figure 2:
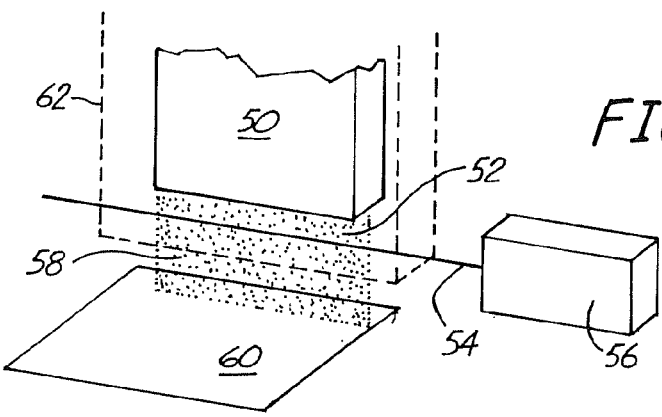
FIG. 2 is a schematic diagram of a light reactive deposition apparatus for performing the coating deposition under ambient atmospheric conditions.

The coating can be performed onto a substrate exposed to the ambient atmosphere or the coating can be performed within a coating chamber isolated from the ambient atmosphere. If the coating is performed exposed to the ambient atmosphere, the reactant stream generally is generated at greater than atmospheric pressure. The product particles can be directed directly to the substrate or through a nozzle that isolates a reaction chamber at a pressure greater than atmospheric. Referring to FIG. 2, a reactant nozzle 50 generates a reactant stream 52 that intersects a focused light beam 54 from a light source 56. Product particles 58 are generated that are directed at a substrate 60. Substrate 60 is exposed to the ambient atmosphere. An optional enclosure 62, shown in FIG. 2 with phantom lines, can be used to enclose reactant nozzle 50 and the reactant zone at the intersection of light beam 54 and reactant stream 52.

In alternative embodiments, light reactive deposition can be used to generate particles that are directed to a coating apparatus to form a coating on a substrate. If a separate coating chamber is used, the outflow from the reaction chamber leads to a conduit that directs the particles to a coating chamber. Alternatively, the coating deposition can be performed directly within the reaction chamber.

Figure 3:
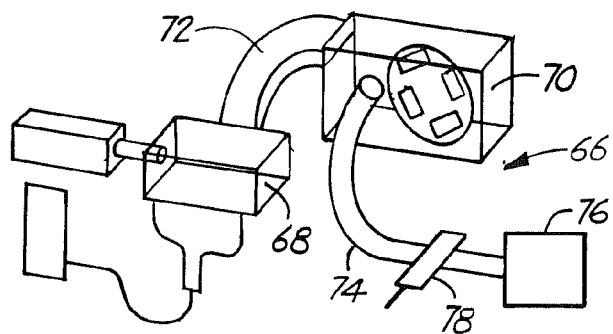
FIG. 3 is a schematic diagram of a light reactive deposition apparatus formed with a particle production apparatus connected to a separate coating chamber through a conduit.

If a separate coating chamber is used, conventional constructions of the reaction chamber can be used. The collection system is then replaced by the coating chamber. An appropriate conduit can be used to connect the two chambers. Referring to FIG. 3, the coating apparatus 66 comprises a reaction apparatus 68, a coating chamber 70, a conduit 72 connecting the reaction apparatus with coating chamber 70, an exhaust conduit 74 leading from coating chamber 70 and a pump 76 connected to exhaust conduit 74. A valve 78 can be used to control the flow to pump 76. Valve 78 can be, for example, a manual needle valve or an automatic throttle valve. Valve 78 can be used to control the pumping rate and the corresponding chamber pressures. Pump 76 generally is vented to the atmosphere either directly or through a scrubber, recycler or the like.

Figure 4:
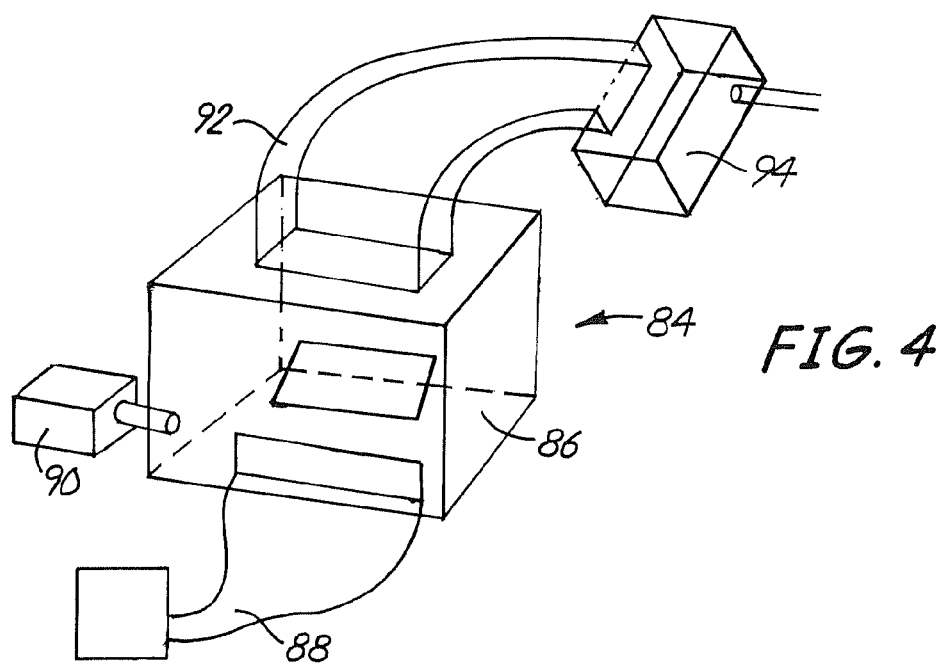
FIG. 4 is a schematic diagram of a light reactive deposition apparatus in which a particle coating is applied to a substrate within the particle production chamber.

If the coating is performed within the reaction chamber, the structure of the reaction chamber generally is modified accordingly to provide an appropriate flow through the chamber. In particular, the chamber can be designed to account for potential relative motion of the substrate and changing directions of flows within the chamber, as described further below. Such an apparatus 84 is shown schematically in FIG. 4. The reaction/coating chamber 86 is connected to a reactant supply system 88, a radiation source 90 and an exhaust 92. Exhaust 92 can be connected to a pump 94, although the pressure from the reactants themselves can maintain flow through the system.

In some embodiments, the momentum of the particles from the reaction chamber is directed at the substrate to perform the coating process. The substrate and the particle flow move relative to each other to apply the coating across the substrate surface. Additional substrates can be moved into and out from the flow to process multiple substrates. In alternative embodiments, forces are applied to disperse the particles into a uniform cloud such that the entire surface or a significant portion of the substrate surface can be simultaneously coated. This cloud based coating can be performed open to the ambient atmosphere, within the reaction chamber or within a separate coating chamber.

As described in detail below, laser pyrolysis apparatuses have been designed for the production of commercial quantities of nanoscale powders. These apparatuses can be adapted for coating formation either in a separate coating chamber or within the reaction chamber. Alternatively or in addition, the invention provides that the rate of production and/or deposition of the particles can be varied substantially, depending on a number of factors (e.g., the starting materials being utilized, the desired reaction product, the reaction conditions, the deposition efficiency, and the like, and suitable combinations thereof). Thus, in one embodiment, the rate of particle production can vary in the range(s) from about 5 grams per hour of reaction product to about 10 kilograms per hour of desired reaction product. Specifically, using apparatuses described herein, coating can be accomplished at particle production rates of up to at least about 10 kilograms per hour (kg/hr), in other embodiments at least about 1 kg/hr, in other embodiments with lower production rates at least about 25 grams per hour (g/hr) and in additional embodiments at least about 5 g/hr. A person of ordinary skill in the art will recognize that production rates intermediate between these explicit production rates are contemplated and are within the present disclosure. Exemplary rates of particle production (in units of grams produced per hour) include not less than about 5, 10, 50, 100, 250, 500, 1000, 2500, 5000, or 10000.

Not all of the particles generated are deposited on the substrate. In general the deposition efficiency depends on the relative speed of the substrate through the product stream with the particles, for embodiments based on moving the substrate through a sheet of product particles. At moderate relative rates of substrate motion, coating efficiencies of about 15 to about 20 percent have been achieved, i.e. about 15 to about 20 percent of the produced particles are deposited on the substrate surface. Routine optimization can increase this deposition efficiency further. At slower relative motion of the substrate through the product particle stream, deposition efficiencies of at least about 40% have been achieved. In some embodiments, the rates of particle production are such that at least about 5 grams per hour, or alternatively or in addition, at least about 25 grams per hour, of reaction product are deposited on the substrate. In general, with the achievable particle production rates and deposition efficiencies, deposition rates can be obtained of at least about 5 g/hr, in other embodiments at least about 25 g/hr, in further embodiments at least from about 100 g/hr to about 5 kg/hr and in still other embodiment from about 250 g/hr to about 2.5 kg/hr. A person of ordinary skill in the art will recognize that deposition rates between these explicit rates are contemplated and are within the present disclosure. Exemplary rates of particle deposition (in units of grams deposited per hour) include not less than about 5, 10, 25, 50, 100, 250, 500, 1000, 2500, or 5000.

Alternatively or in addition, the invention provides that the rate of the movement of the substrate and the particle flow relative to each other can vary substantially, depending on the desired specifications for the coated substrate. Thus, in one embodiment, the rate can be measured on an absolute scale, and can vary in the range(s) from about 0.001 inches per second to about 12 inches per second, or even more. Further, in another embodiment, the rate can be measured on a scale relative to the substrate being coated, and can vary in the range(s) from about 1 substrate per minute to about 1 substrate per second.

For appropriate embodiments using a sheet of product particles, the rate of substrate motion generally is a function of the selected deposition rate and the desired coating thickness as limited by the ability to move the substrate at the desired rate while obtaining desired coating uniformity. Due to the high deposition rates achievable with light reactive deposition, extremely fast coating rates are easily achievable. These coating rates by LRD are dramatically faster than rates that are achievable by competing methods. In particular, at particle production rates of about 10 kg/hr, an eight-inch wafer can be coated with a thickness of about 10 microns of powder in approximately one second even at a deposition efficiency of only about 2.5 percent, assuming a powder density of about 10% of the bulk density. A person of ordinary skill in the art can calculate with simple geometric principles a particular coating rate based on the deposition rate, the desired thickness and the density of powder on the substrate.

In particular, apparatus designs based on an actuator arm moving a substrate through the product particle stream within a reaction chamber, as described herein, can straightforwardly move a substrate at rates to coat an entire eight-inch wafer in about 1 second or less. Generally, in embodiments of particular interest that take advantage of the rapid rates achievable, substrates are coated at rates of at least about 0.1 centimeters per second (cm/s), in additional embodiments at least about 0.5 cm/s, in other embodiments at least about 1 cm/s, in further embodiments from about 2 cm/s to about 30 cm/s, and in other embodiments from about 5 cm/s to about 30 cm/s. A person of ordinary skill in the art will recognize that coating rates intermediate between these explicit rates are contemplated and are within the present disclosure.

1. Particle Generation Generally

As with laser pyrolysis, the reaction conditions determine the qualities of the particles produced by light reactive deposition. The reaction conditions for light reactive deposition can be controlled relatively precisely in order to produce particles with desired properties. The appropriate reaction conditions to produce a certain type of particles generally depend on the design of the particular apparatus. Furthermore, some general observations on the relationship between reaction conditions and the resulting particles can be made.

Increasing the light intensity or laser power results in increased reaction temperatures in the reaction region as well as a faster quenching rate. A rapid quenching rate tends to favor production of high energy phases, which may not be obtained with processes near thermal equilibrium. Similarly, increasing the chamber pressure also tends to favor the production of higher energy structures. Also, increasing the concentration of the reactant serving as the oxygen source in the reactant stream favors the production of particles with increased amounts of oxygen.

Reactant flow rate and velocity of the reactant gas stream are inversely related to particle size so that increasing the reactant gas flow rate or velocity tends to result in smaller particle sizes. Light intensity also influences particle size with increased light intensity favoring larger particle formation for lower melting materials and smaller particle formation for higher melting materials. Also, the growth dynamics of the particles have a significant influence on the size of the resulting particles. In other words, different forms of a product compound have a tendency to form different size particles from other phases under relatively similar conditions. Similarly, in multiphase regions at which populations of particles with different compositions are formed, each population of particles generally has its own characteristic narrow distribution of particle sizes.

Laser pyrolysis has become the standard terminology of reactions driven by an intense light radiation with rapid quenching of product after leaving a narrow reaction region defined by the light beam. The name, however, is a misnomer in the sense that a strong, incoherent, but focused light beam can replace the laser for certain chemical precursors with high reactivity under mild heat conditions. Thus, for some chemical reactions, non-laser light can drive the reaction. Also, the reaction is not a pyrolysis in the sense of a thermal pyrolysis. The laser pyrolysis reaction is not thermally driven by the exothermic combustion of the reactants. In fact, the "laser pyrolysis" reaction can be conducted under conditions where no visible flame is observed from the reaction. Similarly, the particle formation process in light reactive deposition is driven by the intense focused light source rather than a thermal process.

Light reactive deposition can be performed with gas/vapor phase reactants. Many metal/metalloid precursor compounds can be delivered into the reaction chamber as a gas. Metalloids are elements that exhibit chemical properties intermediate between or inclusive of metals and nonmetals. Metalloid elements include silicon, boron, arsenic, antimony, and tellurium. Appropriate metal/metalloid precursor compounds for gaseous delivery generally include metal compounds with reasonable vapor pressures, i.e., vapor pressures sufficient to get desired amounts of precursor gas/vapor into the reactant stream. The vessel holding liquid or solid precursor compounds can be heated to increase the vapor pressure of the metal precursor, if desired. Solid precursors generally are heated to produce a sufficient vapor pressure.

A carrier gas can be bubbled through a liquid precursor to facilitate delivery of a desired amount of precursor vapor. Similarly, a carrier gas can be passed over the solid precursor to facilitate delivery of the precursor vapor. In other embodiments, the carrier gas is mixed with the precursor vapor before delivery into the reaction zone. Suitable silicon precursors for vapor delivery include, for example, silicon tetrachloride ($SiCl_4$), trichlorosilane ($Cl_3HSi$), trichloromethyl silane $CH_3SiCl_3$, and tetraethoxysilane ($Si(OC_2H_5)_4$, also known as ethyl silane and tetraethyl silane). The chlorine in these representative precursor compounds can be replaced with other halogens, e.g., Br, I and F.

Suitable dopants for silicon materials include, for example, boron, germanium, phosphorous, titanium, zinc and aluminum. Suitable boron precursors include, for example, boron trichloride ($BCl_3$), diborane ($B_2H_6$), and $BH_3$. Suitable phosphorous precursors include, for example, phosphine ($PH_3$), phosphorus trichloride ($PCl_3$), phosphorus oxychloride ($POCl_3$) and $P(OCH_3)_3$. Suitable germanium precursors include, for example, $GeCl_4$. Suitable titanium precursors include, for example, titanium tetrachloride ($TiCl_4$), and titanium isopropoxide ($Ti[OCH(CH_3)_2]_4$). Suitable liquid zinc precursor compounds include, for example, diethyl zinc ($Zn(C_2H_5)_2$) and dimethyl zinc ($Zn(CH_3)_2$). Suitable solid, zinc precursors with sufficient vapor pressure of gaseous delivery include, for example, zinc chloride ($ZnCl_2$). Suitable liquid, aluminum precursors include, for example, aluminum s-butoxide ($Al(OC_4H_9)_3$). A number of suitable solid, aluminum precursor compounds are available including, for example, aluminum chloride ($AlCl_3$), aluminum ethoxide ($Al(OC_2H_5)_3$), and aluminum isopropoxide ($Al[OCH(CH_3)_2]_3$).

The use of exclusively gas phase reactants is somewhat limiting with respect to the types of precursor compounds that can be used conveniently. Thus, techniques can be used to introduce aerosols containing reactant precursors to the reaction zone. Improved aerosol delivery apparatuses for laser pyrolysis reaction systems are described further in commonly assigned and copending U.S. patent application Ser. No. 09/188,670, now U.S. Pat. No. 6,193,936 to Gardner et al., entitled "Reactant Delivery Apparatuses," filed Nov. 9, 1998, incorporated herein by reference. These aerosol delivery apparatuses can be adapted for performing light reactive deposition.

Using aerosol delivery apparatuses, solid precursor compounds can be delivered by dissolving the compounds in a solvent. Alternatively, powdered precursor compounds can be dispersed in a liquid/dispersant for aerosol delivery. Liquid precursor compounds can be delivered as an aerosol from a neat liquid, a multiple liquid dispersion or a liquid solution. Aerosol reactants can be used to obtain a significant reactant throughput. A solvent/dispersant can be selected to achieve desired properties of the resulting solution/dispersion. Suitable solvents/dispersants include water, methanol, ethanol, isopropyl alcohol, other organic solvents and mixtures thereof. The solvent should have a desired level of purity such that the resulting particles have a desired purity level. Some solvents, such as isopropyl alcohol, are significant absorbers of infrared light from a $CO_2$ laser such that no additional laser-absorbing compound may be needed within the reactant stream if a $CO_2$ laser is used as a light source.

If aerosol precursors are used, the liquid solvent/dispersant can be rapidly evaporated by the light beam in the reaction chamber such that a gas phase reaction can take place. Thus, the fundamental features of the laser pyrolysis reaction are unchanged by the presence of an aerosol. Nevertheless, the reaction conditions are affected by the presence of the aerosol. Below in the Examples, conditions are described for the production of nanoscale silicon dioxide particles using aerosol precursors in a particular reaction chamber. Thus, the parameters associated with aerosol reactant delivery can be explored further based on the description below.

While light reactive deposition is another route to the production of planar glass, two challenges are associated with the aerosol-based process. First, many solvents used for dissolving solid precursors often contain, C, H, O and/or N atoms. These atoms often form bonds with the materials of interest under most synthesis conditions. Water and other byproducts may or may not be removed by a subsequent consolidation heat process. Also, optical glass formation requires high purity chemicals. $SiCl_4$ often needs to be purified through several distillation steps to drive away the water.

A number of suitable solid, metal precursor compounds can be delivered as an aerosol from solution. Suitable silicon precursors for aerosol production include, for example, silicon tetrachloride $Si(Cl_4)$, which is soluble in ether, and trichlorosilane ($Cl_3HSi$), which is soluble in carbon tetrachloride. Suitable dopants can be delivered in an aerosol. For example, zinc chloride ($ZnCl_2$) and zinc nitrate ($Zn(NO_3)_2$) are soluble in water and some organic solvents, such as isopropyl alcohol. Similarly, a boron dopant can be delivered as an aerosol using ammonium borate (($NH_4$)$_2B_4O_7$), which is soluble in water and various organic solvents.

The precursor compounds for aerosol delivery are dissolved in a solution that, in some embodiments, can have a concentration greater than about 0.1 molar. Generally, the greater the concentration of precursor in the solution the greater the throughput of reactant through the reaction chamber. As the concentration increases, however, the solution can become more viscous such that the aerosol may have droplets with larger sizes than desired. Thus, selection of solution concentration can involve a balance of factors in the selection of a suitable solution concentration.

In some embodiments, secondary reactants serving as an oxygen source include, for example, $O_2$, CO, $N_2O$, $H_2O$, $CO_2$, $O_3$ and mixtures thereof. Molecular oxygen can be supplied as air. The secondary reactant compound should not react significantly with the metal precursor prior to entering the reaction zone since this generally would result in the formation of large particles.

Light reactive deposition can be performed with a variety of optical frequencies, using either a laser or other strong focused radiation (e.g., light) source. In some embodiments, light sources operate in the infrared portion of the electromagnetic spectrum. $CO_2$ lasers can be used as sources of light. Infrared absorbers for inclusion in the reactant stream include, for example, $C_2H_4$, isopropyl alcohol, $NH_3$, $SF_6$, $SiH_4$ and $O_3$. $O_3$ can act as both an infrared absorber and as an oxygen source. The radiation absorber, such as the infrared absorber, absorbs energy from the radiation beam and distributes the energy to the other reactants to drive the reaction.

In a typical embodiment, the energy absorbed from the light beam increases the temperature at a tremendous rate, many times the rate that heat generally would be produced by exothermic reactions under controlled condition. While the process generally involves nonequilibrium conditions, the temperature can be described approximately based on the energy in the absorbing region. The light reactive deposition reaction process is qualitatively different from the process in a combustion reactor where an energy source initiates a reaction, but the reaction is driven by energy given off by an exothermic reaction. In a combustion reactor, there is no well defined reaction zone with a boundary. The reaction zone is large and the residence time of the reactants is long. Lower thermal gradients are generally present in the combustion reactor. In contrast, the laser/light driven reactions have extremely high heating and quenching rates. The laser/light intensity is controllable such that the reaction conditions are similarly controllable.

An inert shielding gas can be used to reduce the amount of reactant and product molecules contacting the reactant chamber components. Inert gases can also be introduced into the reactant stream as a carrier gas and/or as a reaction moderator. Appropriate inert shielding gases include, for example, Ar, He and $N_2$.

An appropriate light reactive deposition apparatus can include a reaction chamber isolated from the ambient environment. Alternatively, the reaction zone can be exposed to the ambient atmosphere. If the reaction zone is exposed to the ambient atmosphere, the configuration is similar except that no surrounding walls are present. The discussion below focuses on embodiments in which a reaction chamber is present, although the modification for the case in which the reaction zone is exposed to the ambient atmosphere is a straightforward modification. In addition, if the pressure in the reaction chamber is higher than the ambient pressure, the reaction chamber can be oriented to direct product particles toward a substrate at ambient pressure. For example, in embodiments with an elongated reactant inlet, a sheet of particles can be directed at a substrate.

A reactant inlet connected to a reactant delivery apparatus produces a reactant stream through the reaction chamber. A light beam path intersects the reactant stream at a reaction zone. Generally, the light source, such as a laser, is located external to the reaction chamber, and the light beam enters the reaction chamber through an appropriate window. In some embodiments, the light source can be located within the reaction chamber.

2. Separate Laser Pyrolysis Apparatuses

When the coating is performed in a separate chamber from the particle production chamber, the laser pyrolysis chamber can be based on known designs. The reactant/product stream continues after the reaction zone to an outlet, where the reactant/product stream exits the reaction chamber and passes into the coating chamber. A conduit can be used to connect the reaction chamber and the coating chamber.

Figure 5:
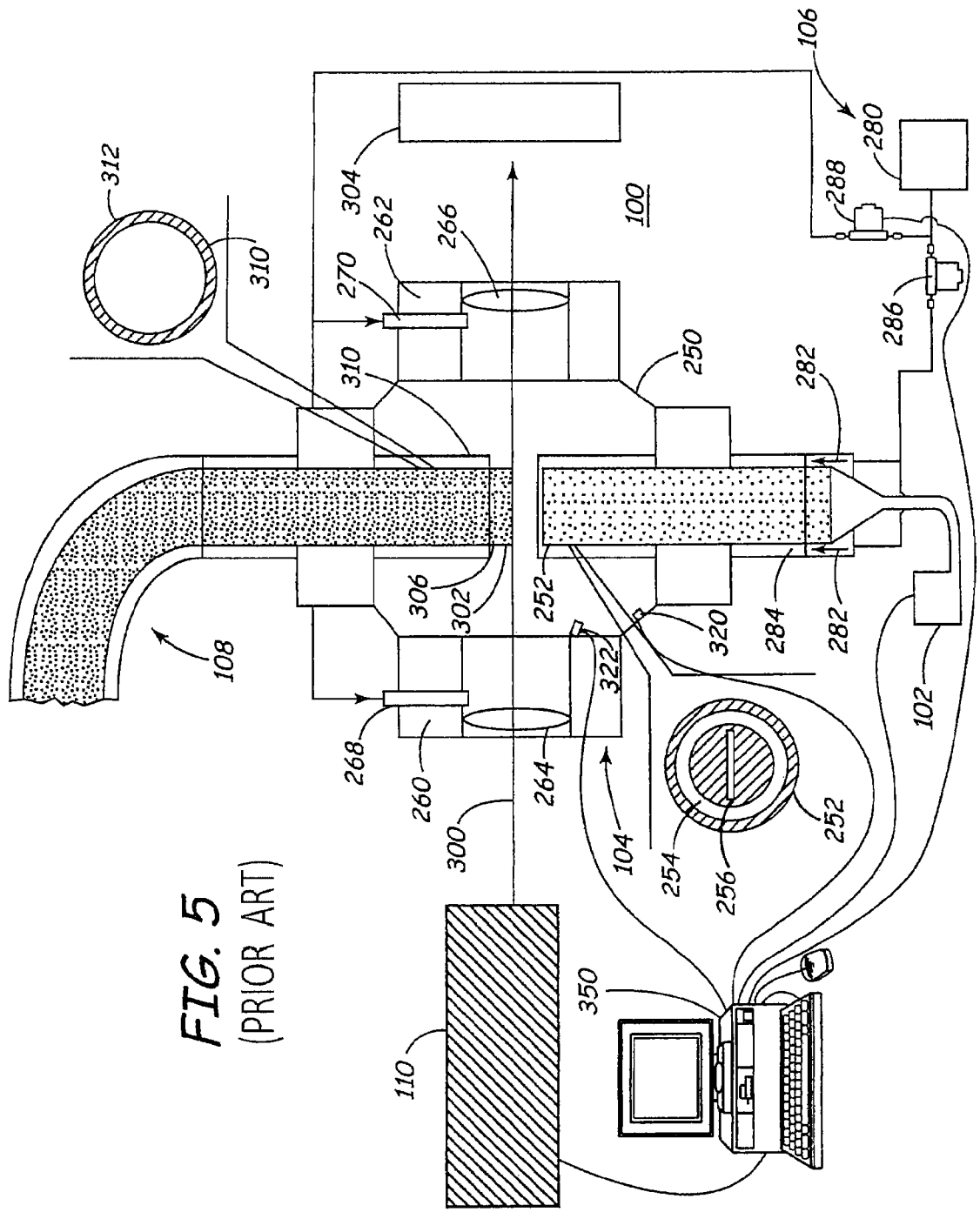
FIG. 5 is a schematic, sectional view of an embodiment of a particle production apparatus, where the cross section is taken through the middle of the light radiation path. The upper insert is a bottom view of the exit nozzle, and the lower insert is a top view of the injection nozzle.

Referring to FIG. 5, a particular embodiment 100 of a particle production chamber for a light reactive deposition system involves a reactant delivery apparatus 102, reaction chamber 104, shielding gas delivery apparatus 106, exhaust conduit 108 and light source 110. A first reaction delivery apparatus described below can be used to deliver exclusively gaseous reactants. An alternative reactant delivery apparatus is described for delivery of one or more reactants as an aerosol.

Figure 6:
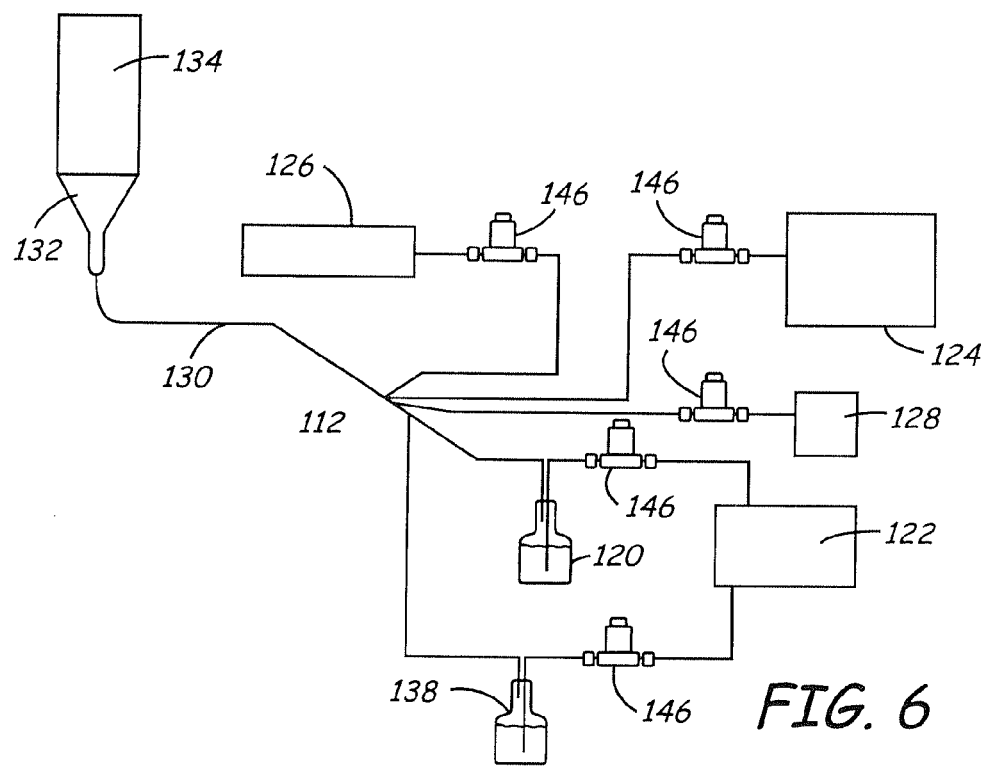
FIG. 6 is a schematic, side view of a reactant delivery apparatus for the delivery of vapor reactants to the particle production apparatus of FIG. 5.

Referring to FIG. 6, a first embodiment 112 of reactant delivery apparatus 102 includes a source 120 of a precursor compound. For liquid or solid reactants, a carrier gas from one or more carrier gas sources 122 can be introduced into precursor source 120 to facilitate delivery of the reactant. Precursor source 120 can be a liquid holding container, a solid precursor delivery apparatus or other suitable container. The carrier gas from carrier gas source 122 can be either an infrared absorber and/or an inert gas.

The gases from precursor source 120 are mixed with gases from infrared absorber source 124, inert gas source 126, and/or secondary reactant source 128 by combining the gases in a single portion of tubing 130. The gases are combined a sufficient distance from reaction chamber 104 such that the gases become well mixed prior to their entrance into reaction chamber 104. The combined gas in tube 130 passes through a duct 132 into channel 134, which is in fluid communication with a reactant inlet into reaction chamber 104.

A second reactant can be supplied from second reactant source 138, which can be a liquid reactant delivery apparatus, a solid reactant delivery apparatus, a gas cylinder or other suitable container or containers. As shown in FIG. 6, second reactant source 138 delivers a second reactant to duct 132 by way of tube 130. Alternatively, second reactant source can deliver the second reactant into a second duct such that the two reactants are delivered separately into the reaction chamber where the reactants combine at or near the reaction zone. Mass flow controllers 146 can be used to regulate the flow of gases within the reactant delivery system of FIG. 6.

As noted above, the reactant stream can include one or more aerosols. The aerosols can be formed within reaction chamber 104 or outside of reaction chamber 104 prior to injection into reaction chamber 104. If the aerosols are produced prior to injection into reaction chamber 104, the aerosols can be introduced through reactant inlets comparable to those used for gaseous reactants, such as reactant inlet 134 in FIG. 6.

Figure 7:
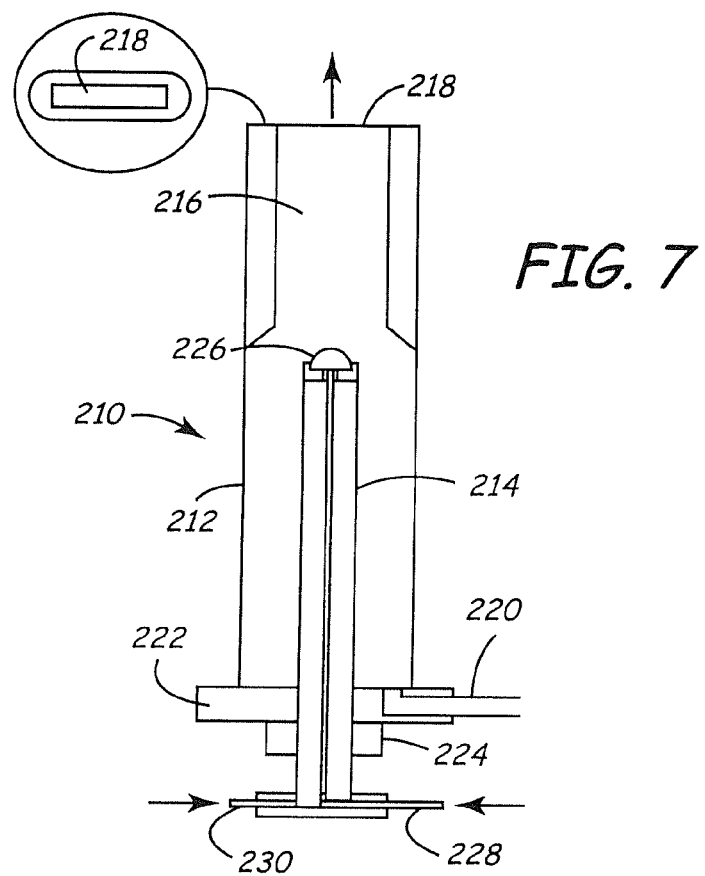
FIG. 7 is a schematic, side view of a reactant delivery apparatus for the delivery of an aerosol reactant to the particle production apparatus of FIG. 5. The insert is a top view of the outer nozzle.

Referring to FIG. 7, embodiment 210 of the reactant supply system 102 can be used to supply an aerosol to duct 132. Reactant supply system 210 includes an outer nozzle 212 and an inner nozzle 214. Outer nozzle 212 has an upper channel 216 that leads to a rectangular outlet 218 at the top of outer nozzle 212, as shown in the insert in FIG. 7. Rectangular nozzle has selected dimensions to produce a reactant stream of desired expanse within the reaction chamber. Outer nozzle 212 includes a drain tube 220 in base plate 222. Drain tube 220 is used to remove condensed aerosol from outer nozzle 212. Inner nozzle 214 is secured to outer nozzle 212 at fitting 224.

The top of the nozzle can be a twin orifice internal mix atomizer 226. Liquid is fed to the atomizer through tube 228, and gases for introduction into the reaction chamber are fed to the atomizer through tube 230. Interaction of the gas with the liquid assists with droplet formation.

Referring to FIG. 5, reaction chamber 104 includes a main chamber 250. Reactant supply system 102 connects to the main chamber 250 at injection nozzle 252. Reaction chamber 104 can be heated to a surface temperature above the dew point of the mixture of reactants and inert components at the pressure in the apparatus.

The end of injection nozzle 252 has an annular opening 254 for the passage of inert shielding gas, and a reactant inlet 256 (left lower insert) for the passage of reactants to form a reactant stream in the reaction chamber. Reactant inlet 256 can be a slit, as shown in the lower inserts of FIG. 5. Annular opening 254 has, for example, a diameter of about 1.5 inches and a width along the radial direction from about $\frac{1}{8}$ in to about $\frac{1}{16}$ in. The flow of shielding gas through annular opening 254 helps to prevent the spread of the reactant gases and product particles throughout reaction chamber 104.

Tubular sections 260, 262 are located on either side of injection nozzle 252. Tubular sections 260, 262 include ZnSe windows 264, 266, respectively. Windows 264, 266 are about 1 inch in diameter. Windows 264, 266 can be cylindrical lenses with a focal length equal to the distance between the center of the chamber to the surface of the lens to focus the light beam to a point just below the center of the nozzle opening. Windows 264, 266 can have an antireflective coating. Appropriate ZnSe lenses are available from Laser Power Optics, San Diego, Calif. Tubular sections 260, 262 provide for the displacement of windows 264, 266 away from main chamber 250 such that windows 264, 266 are less likely to be contaminated by reactants and/or products. Window 264, 266 are displaced, for example, about 3 cm from the edge of the main chamber 250.

Windows 264, 266 are sealed with a rubber o-ring to tubular sections 260, 262 to prevent the flow of ambient air into reaction chamber 104. Tubular inlets 268, 270 provide for the flow of shielding gas into tubular sections 260, 262 to reduce the contamination of windows 264, 266. Tubular inlets 268, 270 are connected to shielding gas delivery apparatus 106.

Referring to FIG. 5, shielding gas delivery system 106 includes inert gas source 280 connected to an inert gas duct 282. Inert gas duct 282 flows into annular channel 284 leading to annular opening 254. A mass flow controller 286 regulates the flow of inert gas into inert gas duct 282. If reactant delivery system 112 of FIG. 6 is used, inert gas source 126 can also function as the inert gas source for duct 282, if desired. Referring to FIG. 5, inert gas source 280 or a separate inert gas source can be used to supply inert gas to tubes 268, 270. Flow to tubes 268, 270 can be controlled by a mass flow controller 288.

Light source 110 is aligned to generate a light beam 300 that enters window 264 and exits window 266. Windows 264, 266 define a light path through main chamber 250 intersecting the flow of reactants at reaction zone 302. After exiting window 266, light beam 300 strikes power meter 304, which also acts as a beam dump. An appropriate power meter is available from Coherent Inc., Santa Clara, Calif. Light source 110 can be a laser or an intense conventional light source such as an arc lamp. In some embodiments, light source 110 is an infrared laser, especially a CW $CO_2$ laser such as an 1800 watt maximum power output laser available from PRC Corp., Landing, N.J.

Reactants passing through reactant inlet 256 in injection nozzle 252 initiate a reactant stream. The reactant stream passes through reaction zone 302, where reaction involving the metal precursor compounds takes place. Heating of the gases in reaction zone 302 is extremely rapid, roughly on the order of 105 degree C./sec depending on the specific conditions. The reaction is rapidly quenched upon leaving reaction zone 302, and particles 306 are formed in the reactant/product stream. The nonequilibrium nature of the process allows for the production of nanoparticles with a highly uniform size distribution and structural homogeneity.

The path of the reactant stream continues to exit nozzle 310. Exit nozzle 310 has a circular opening 312, as shown in the upper insert of FIG. 5. Circular opening 312 feeds into exit conduit 108.

The chamber pressure is monitored with a pressure gauge 320 attached to the main chamber. The chamber pressure for the production of the desired oxides generally can be in the range(s) from about 80 Torr to about 1000 Torr. Pressures above 760 Torr can be used for coating onto a substrate at atmospheric pressures. In addition, infrared emission from the reaction zone can be monitored with a broadband infrared detector 322.

Exhaust conduit 108 leads to a coating chamber or to a substrate at ambient pressure. The structure of appropriate coating chambers is described further below.

The apparatus can be controlled by a computer 350. Generally, the computer controls the light source and monitors the pressure in the reaction chamber. The computer can be used to control the flow of reactants and/or the shielding gas. Computer 350 can integrate control of the reaction chamber, the coating chamber and pump.

Figure 8:
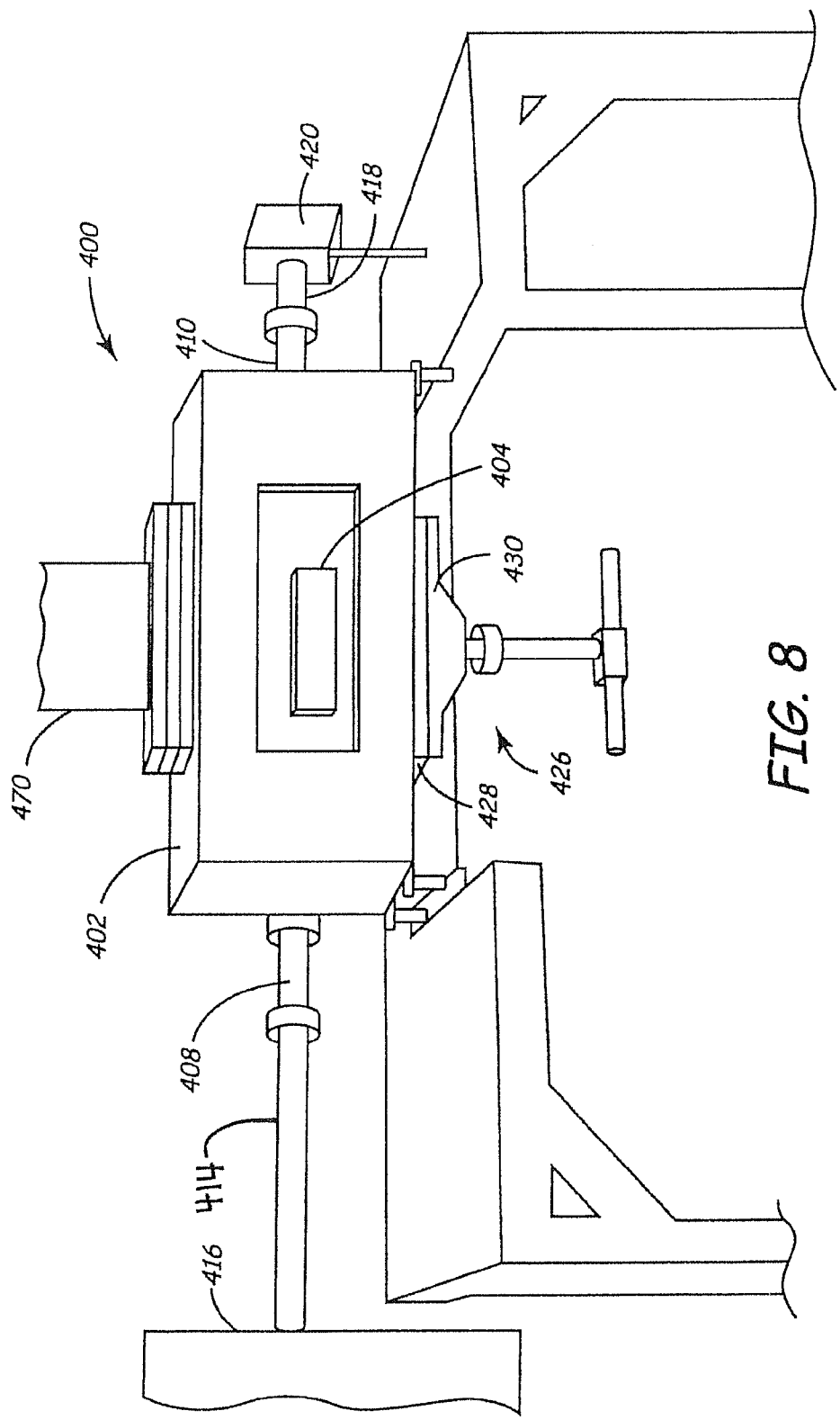
FIG. 8 is a perspective view of an alternative embodiment of a particle production apparatus.

An alternative embodiment of a particle production apparatus is shown in FIG. 8. Particle production apparatus 400 includes a reaction chamber 402. The reaction chamber 402 has a shape of a rectangular parallelepiped. Reaction chamber 402 extends with its longest dimension along the light beam. Reaction chamber 402 has a viewing window 404 at its side, such that the reaction zone can be observed during operation.

Reaction chamber 402 has tubular extensions 408, 410 that define an optical path through the reaction chamber. Tubular extension 408 is connected with a seal to a cylindrical lens. Tube 414 connects laser 416 or other optical source with the lens. Similarly, tubular extension 410 is connected with a seal to tube 418, which further leads to beam dump/light meter 420. Thus, the entire light path from laser 416 to beam dump 420 is enclosed.

Figure 9:
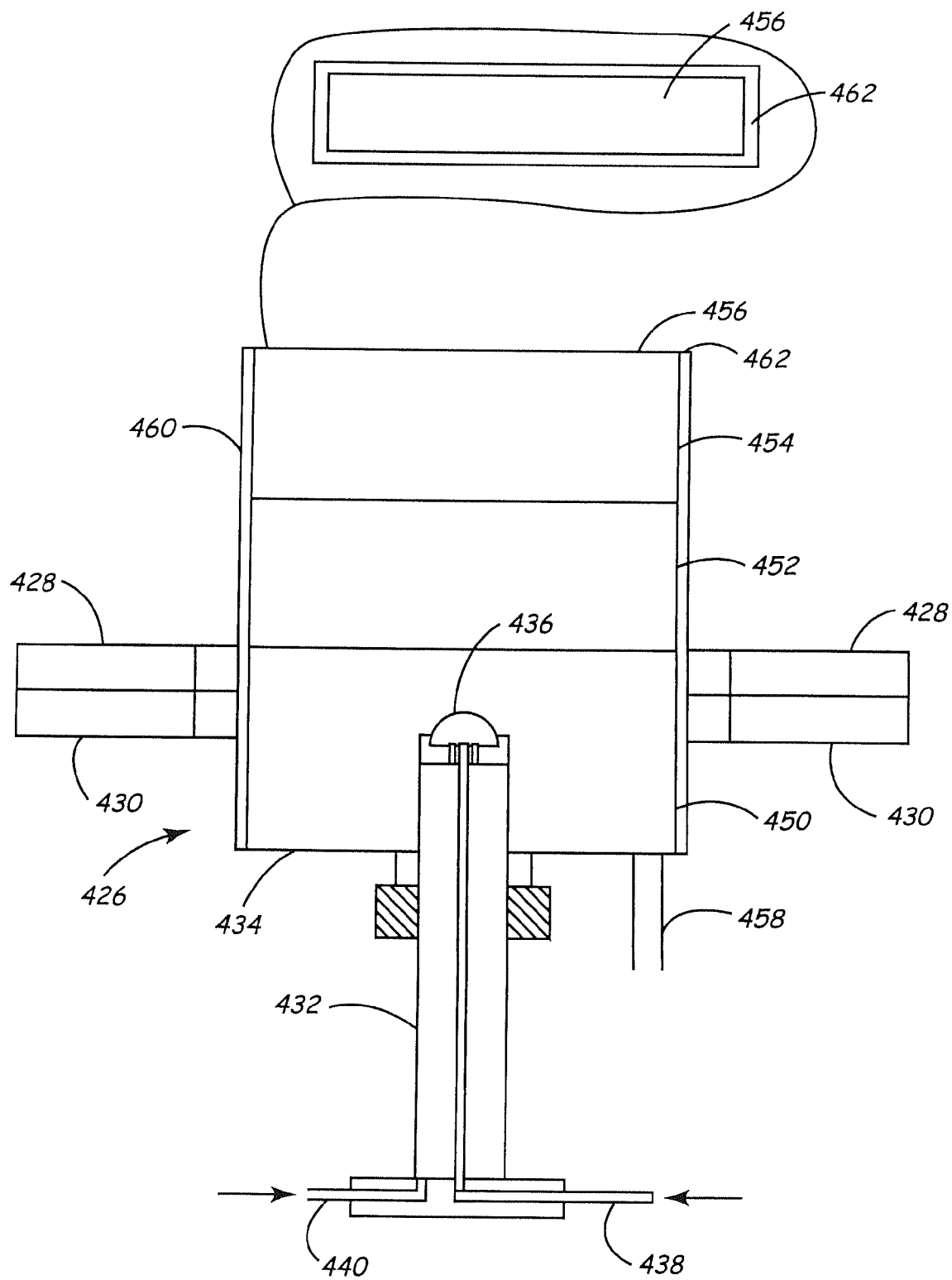
FIG. 9 is a sectional view of the inlet nozzle of the alternative particle production apparatus of FIG. 8, the cross section being taken along the length of the nozzle through its center. The insert is a top view of the nozzle.
Figure 10:
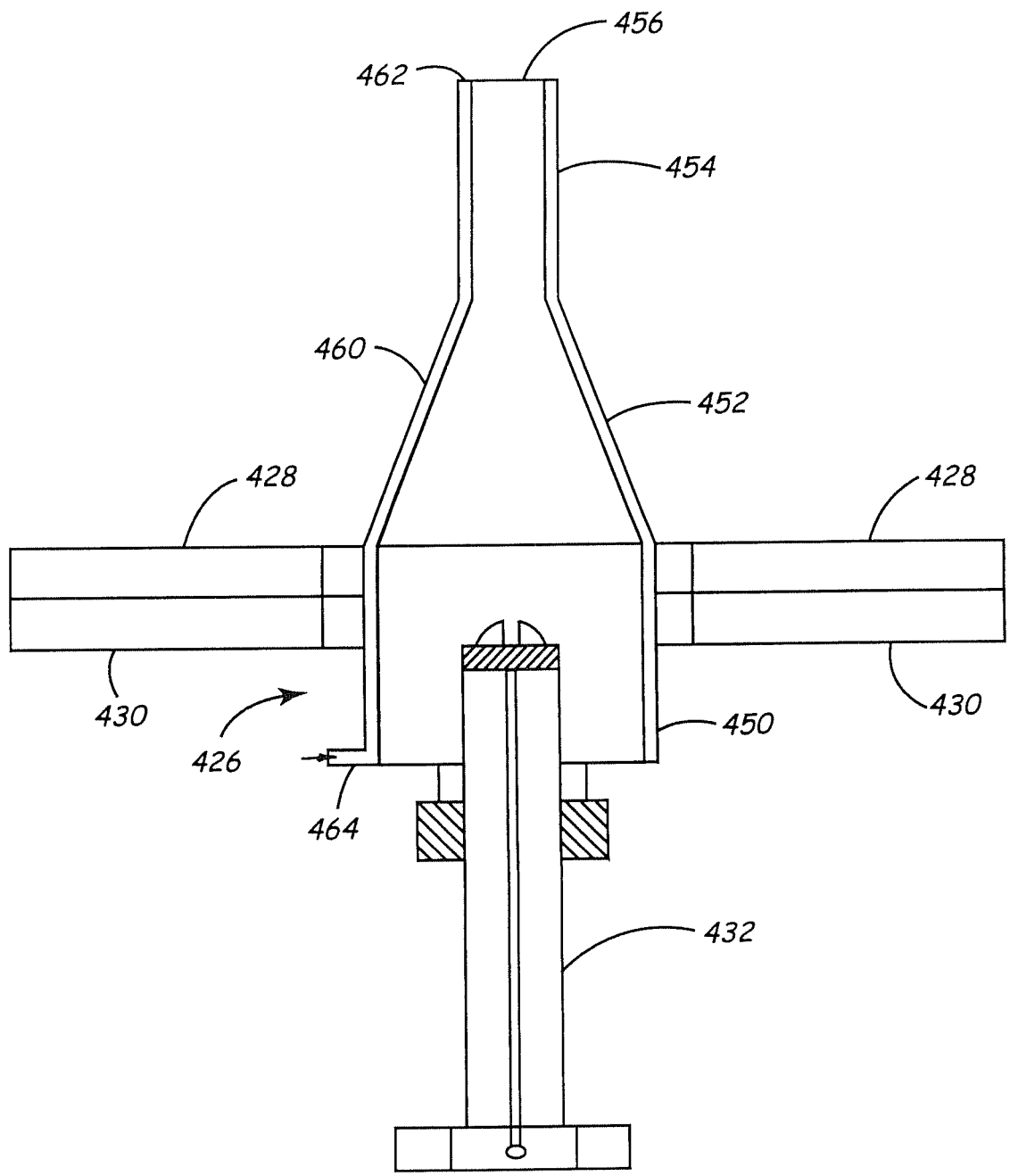
FIG. 10 is a sectional view of the inlet nozzle of the alternative particle production apparatus of FIG. 8, the cross section being taken along the width of the nozzle through its center.

Inlet nozzle 426 connects with reaction chamber 402 at its lower surface 428. Inlet nozzle 426 includes a plate 430 that bolts into lower surface 428 to secure inlet nozzle 426. Referring to FIGS. 9 and 10, inlet nozzle 426 includes an inner nozzle 432 and an outer nozzle 434. Inner nozzle 432 can have a twin orifice internal mix atomizer 436 at the top of the nozzle. Suitable gas atomizers are available from Spraying Systems, Wheaton, Ill. The twin orifice internal mix atomizer 436 has a fan shape to produce a thin sheet of aerosol and gaseous precursors. Liquid is fed to the atomizer through tube 438, and gases for introduction into the reaction chamber are fed to the atomizer through tube 440. Interaction of the gas with the liquid assists with droplet formation.

Outer nozzle 434 includes a chamber section 450, a funnel section 452 and a delivery section 454. Chamber section 450 holds the atomizer of inner nozzle 432. Funnel section 452 directs the aerosol and gaseous precursors into delivery section 454. Delivery section 450 leads to an about 3 inch by 0.5 inch rectangular outlet 456, shown in the insert of FIG. 9. Outer nozzle 434 includes a drain 458 to remove any liquid that collects in the outer nozzle. Outer nozzle 434 is covered by an outer wall 460 that forms an shielding gas opening 462 surrounding outlet 456. Inert gas is introduced through inlet 464.

Referring to FIG. 8, exit nozzle 470 connects to apparatus 400 at the top surface of reaction chamber 402. Exit nozzle 470 forms a conduit leading to a coating chamber or to a substrate at ambient pressure.

Another alternative design of a particle production apparatus has been described in U.S. Pat. No. 5,958,348 to Bi et al., entitled "Efficient Production of Particles by Chemical Reaction," incorporated herein by reference. This alternative design is intended to facilitate production of commercial quantities of particles by laser pyrolysis. Additional embodiments and other appropriate features for commercial capacity laser pyrolysis apparatuses are described in copending and commonly assigned U.S. patent application Ser. No. 09/362,631 to Mosso et al., entitled "Particle Production Apparatus," incorporated herein by reference. Many features described in this copending application can be incorporated into a particle production apparatus for light reactive deposition.

In one embodiment of a high capacity particle production apparatus, the reaction chamber and reactant inlet are elongated significantly along the light beam to provide for an increase in the throughput of reactants and products. The embodiments described above for the delivery of gaseous reactants and aerosol reactants can be adapted for the elongated reaction chamber design. Additional embodiments for the introduction of an aerosol with one or more aerosol generators into an elongated reaction chamber is described in commonly assigned and copending U.S. patent application Ser. No. 09/188,670, now U.S. Pat. No. 6,193,936 to Gardner et al., entitled "Reactant Delivery Apparatuses," incorporated herein by reference.

In general, the particle production apparatus with the elongated reaction chamber and reactant inlet is designed to reduce contamination of the chamber walls, to increase the production capacity and to make efficient use of resources. To accomplish these objectives, the elongated reaction chamber provides for an increased throughput of reactants and products without a corresponding increase in the dead volume of the chamber. The dead volume of the chamber can become contaminated with unreacted compounds and/or reaction products. Furthermore, an appropriate flow of shielding gas confines the reactants and products within a flow stream through the reaction chamber. The high throughput of reactants makes efficient use of the light energy.

Figure 11:
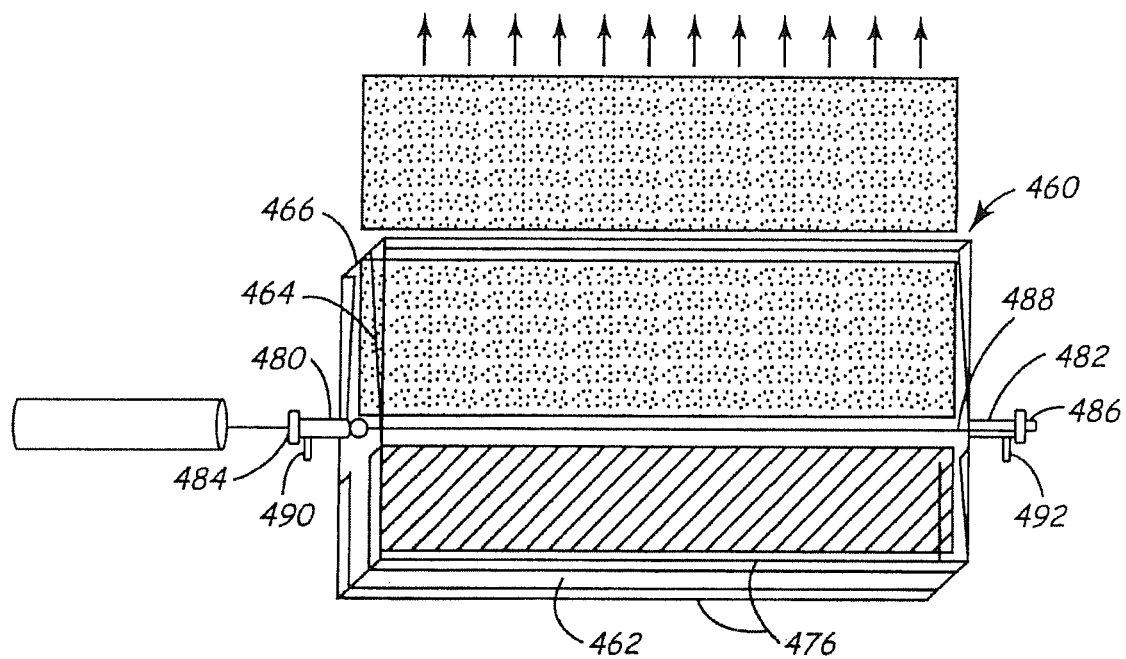
FIG. 11 is a perspective view of an embodiment of an elongated reaction chamber for performing light reactive deposition.

The design of the improved reaction chamber 460 is shown schematically in FIG. 11. A reactant inlet 462 leads to main chamber 464. Reactant inlet 462 conforms generally to the shape of main chamber 464. Main chamber 464 includes an outlet 466 along the reactant/product stream for removal of particulate products, any unreacted gases and inert gases. Shielding gas inlets 476 are located on both sides of reactant inlet 462. Shielding gas inlets are used to form a blanket of inert gases on the sides of the reactant stream to inhibit contact between the chamber walls and the reactants or products. The dimensions of elongated reaction chamber 464 and reactant inlet 462 can be designed for high efficiency particle production. Reasonable dimensions for reactant inlet 462 for the production of ceramic nanoparticles, when used with a 1800 watt CO2 laser, are from about 5 mm to about 1 meter.

Tubular sections 480, 482 extend from the main chamber 464. Tubular sections 480, 482 hold windows 484, 486 to define a light beam path 488 through the reaction chamber 460. Tubular sections 480, 482 can include inert gas inlets 490, 492 for the introduction of inert gas into tubular sections 480, 482.

Outlet 466 leads to a conduit leading to a coating chamber. There is not necessarily a change in dimension that demarcates a transition from the reaction chamber to a conduit to the coating chamber. The reaction zone is located within the reaction chamber, and the conduit can but does not necessarily involve a change in direction of the flow.

3. Particle Coating Deposition External to the Particle Production Chamber

If the coating process is not performed within the reaction chamber where particles are produced, the product particles are directed through a conduit to a separate coating chamber or to a coating area with a substrate at ambient pressure. The conduit from the particle production apparatus leads to a particle nozzle that opens into the coating chamber. The coating chamber may or may not be maintained under reduced pressure. The coating process can be performed by moving the substrate and nozzle relative to each other. Alternatively, external forces are applied to disperse the particles into a cloud that is used to simultaneously coat the entire substrate or a significant fraction thereof.

If the chamber is sealed from the ambient environment, one or more substrates can be processed before the coated substrates are harvested from the coating chamber. Alternatively, the coated substrates can be passed through an airlock to a position for further processing or for retrieval of the coated substrates. If the chamber operates near atmospheric pressure, the coated substrates and fresh uncoated substrates can be passed into and out from the chamber at will. In either case, additional processing, such as heat treatment, can be performed in an automated process without intervention or the substrates with particle coatings can be manually directed to specific locations for further processing.

Figure 12:
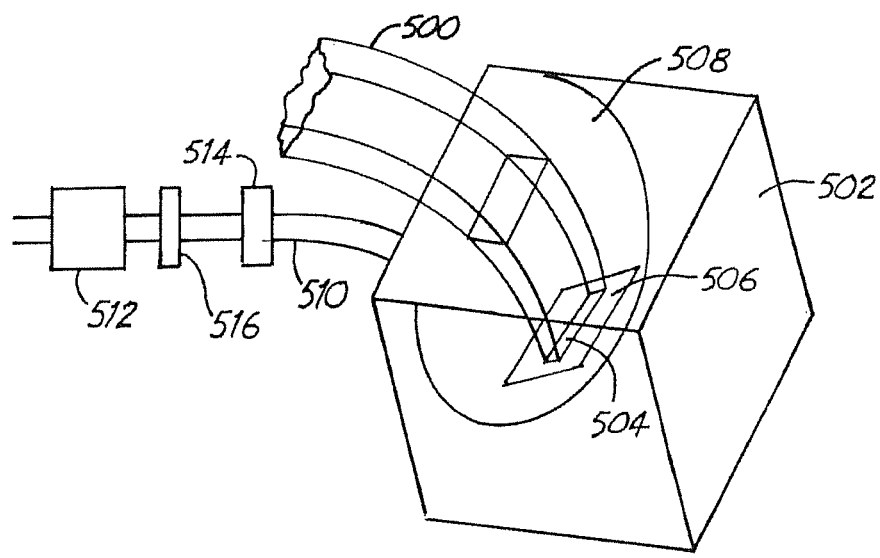
FIG. 12 is a perspective view of a coating chamber where the walls of the chamber are transparent to permit viewing of the internal components.

Referring to FIG. 12, conduit 500 from the particle production apparatus leads to coating chamber 502. Conduit 500 terminates at opening 504 within chamber 502. In some embodiments, opening 504 is located near the surface of substrate 506 such that the momentum of the particle stream directs the particles directly onto the surface. Substrate 506 can be mounted on a stage or other platform 508 to position substrate 506 relative to opening 504. Generally, coating chamber 502 is vented through a channel 510. If coating chamber 502 is maintained at pressures less than atmospheric, channel 510 generally leads to a pump 512. A collection system, filter or scrubber 514 can be placed between the coating chamber 502 and pump 512 to remove particles that did not get coated onto the substrate surface. A manual or automatic valve 516 can be used to control the pumping rate.

Figure 13:
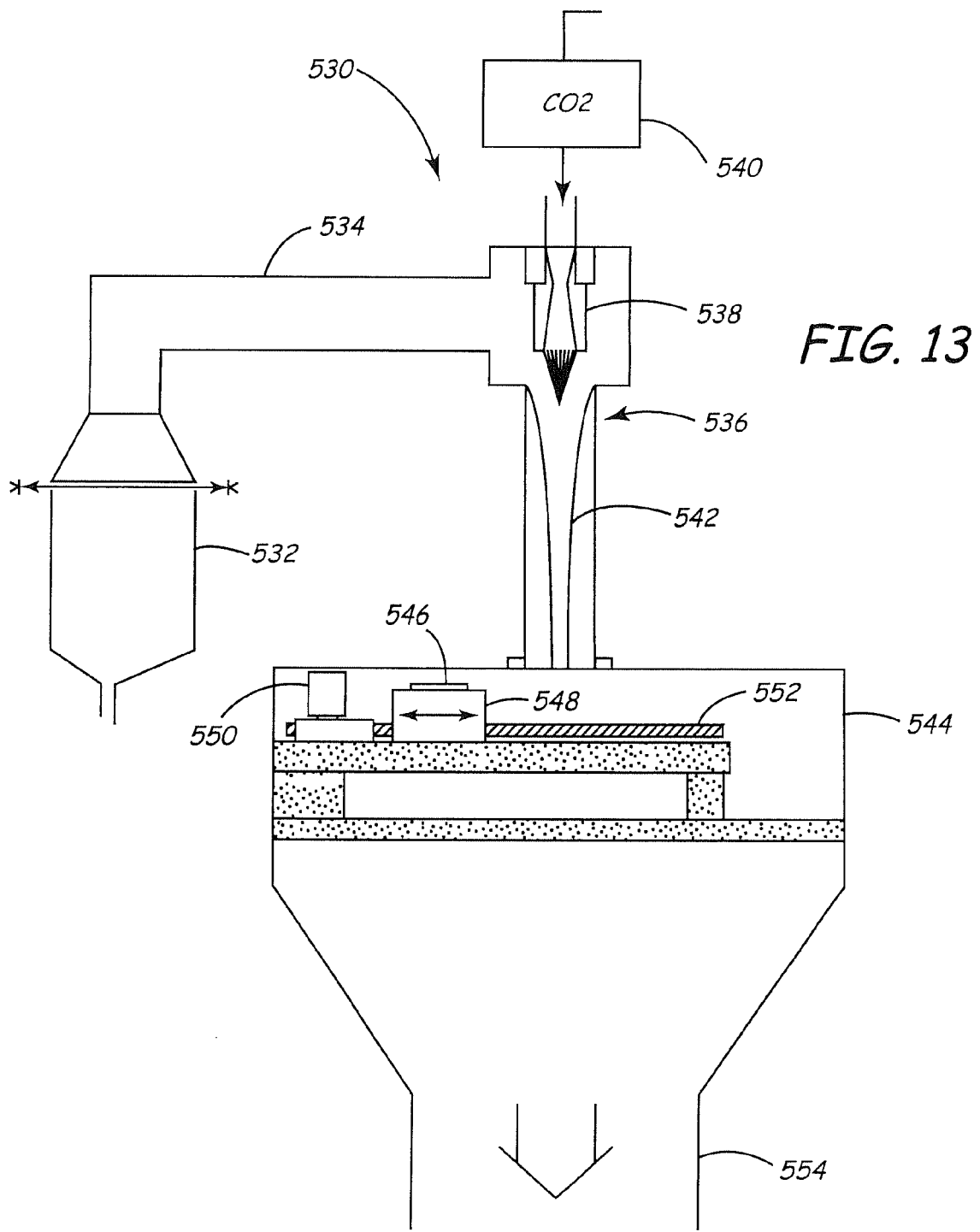
FIG. 13 is a sectional side view of an embodiment of a reaction chamber and coating chamber wherein the coating chamber is at a very different pressure from the reaction chamber.

The coating chamber can operate at a significantly different pressure than the reaction chamber. One apparatus to accomplish this is shown in FIG. 13. In apparatus 530, laser pyrolysis chamber 532 leads to conduit 534. Conduit 534 leads to a venturi tube 536. Venturi tube 536 includes a nozzle 538 connected to an inert gas supply 540. Nozzle 538 leads to a tapered tube 542. The pressure of the inert gas from nozzle 538 creates negative pressure in conduit 534 and reaction chamber 532 and propels the product particles down tapered tube 542.

Tapered tube 542 leads to coating chamber 544. As shown in FIG. 13, substrate 546 is swept past the opening of tapered tube 542 by a moving stage 548. Motor 550 moves stage 548 along track 552. Coating chamber 544 is vented through an exhaust 554.

Figure 14:
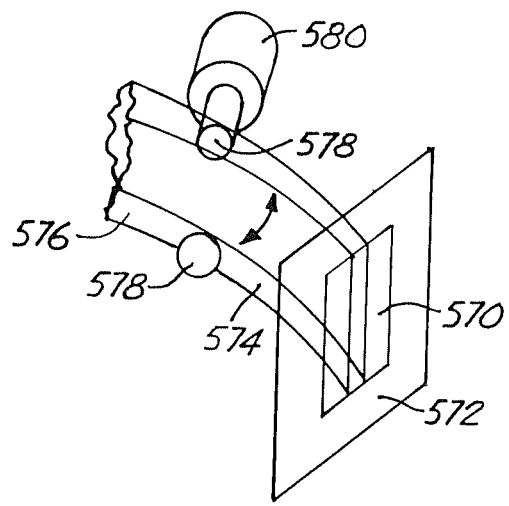
FIG. 14 is a perspective view of a particle nozzle directed at a substrate in which the particle nozzle moves to coat different portions of the substrate.

In general, if a focused particle stream is delivered to the coating chamber, the substrate and the delivery nozzle move relative to each other to sweep the particle stream across the surface of the substrate forming a coating over the surface or portion thereof. In some embodiments, the particle nozzle moves relative to a fixed substrate. Referring to FIG. 14, substrate 570 is mounted onto a stage 572. Stage 572 can be fixed, or stage 572 can move to bring different substrate within the particle flow. In some embodiments, stage 572 includes thermal control features, such that the temperature of substrate 570 can be increased or decreased to a desired value. Particle nozzle 574 moves relative to substrate 570 to direct particles across the substrate surface. As shown in FIG. 14, particle nozzle 574 rotates relative to conduit 576 at hinges 578. Motor 580 is used to control the movement of nozzle 574.

Figure 15:
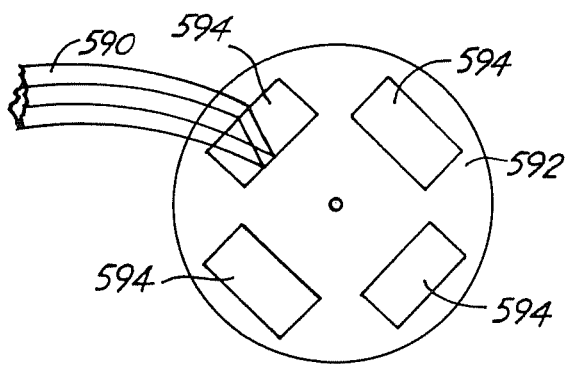
FIG. 15 is perspective view of a particle nozzle directed at a substrate mounted on a rotating stage.

In alternative embodiments, the substrate is moved relative to a fixed nozzle. Referring to FIG. 15, a particle nozzle 590 directs particles toward a stage 592. As shown in FIG. 15, four substrates 594 are mounted on stage 592. More or less substrates can be mounted on a moveable stage with corresponding modifications to the stage and size of the chamber. Movement of stage 592 sweeps the particle stream across a substrate surface and positions particular substrate 594 within the path of nozzle 590. As shown in FIG. 15, a motor is used to rotate stage 592. Stage 592 can include thermal control features that provide for the separate or simultaneous control of the temperature of the substrates on stage 592. Alternative designs involve the linear movement of a stage, as shown in FIG. 13.

Figure 16:
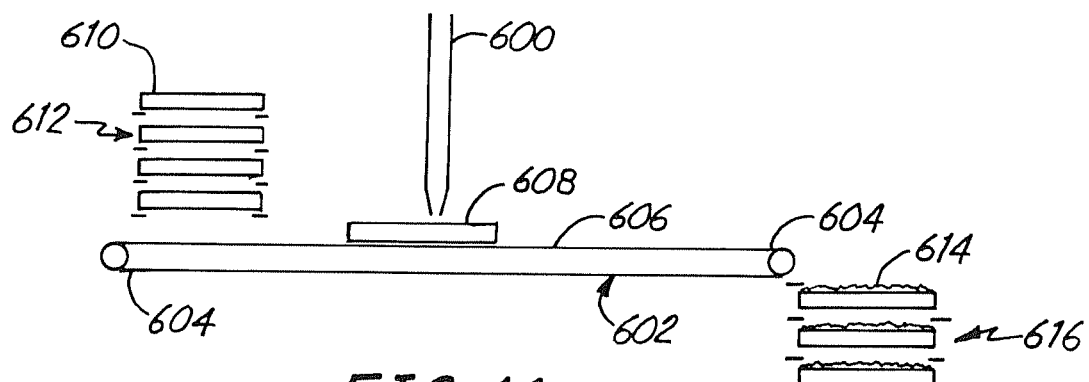
FIG. 16 is a side view of a particle nozzle directed at a substrate on a conveyor.

In an alternative embodiment, a conveyor is used to transport substrates past a particle nozzle as well as to deliver fresh uncoated substrates and remove coated substrate. Referring to FIG. 16, particle nozzle 600 is directed toward conveyor 602. Conveyor 602 includes motorized rollers 604 and a belt 606, although variations in design can be used. Conveyor belt 606 sweeps a substrate 608 past the opening of nozzle 600. As with the stages described above, conveyor 602 can include thermal control features to adjust the temperature of a substrate to desired values. Fresh uncoated substrates 610 can be delivered from a hopper 612. Coated substrates 614 can be stacked in a rack 616.

Figure 17:
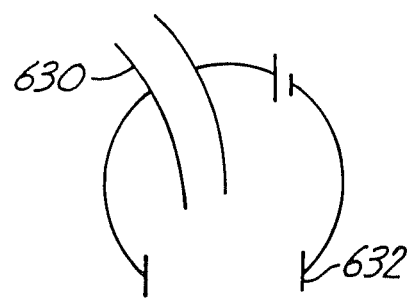
FIG. 17 is a perspective view of a particle nozzle directing particles past transducers that defocus the particle stream.
Figure 17:
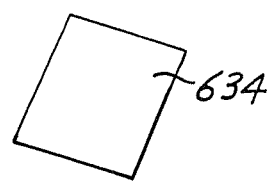

Referring to FIG. 17, particle nozzle 630 delivers the particles to an applied field formed by transducers 632. For example, transducers 632 can be plates connected to a power source to supply an electrostatic field. Alternatively, an electromagnet or a permanent magnet can be used to generate a magnetic field. The electrical or magnetic field disperses the particles into a cloud that can be relatively uniformly dispersed. A cloud of particles then settles onto the surface of substrate 634. Substrate 634 does not have to be moved relative to nozzle 630 to coat the surface. However, substrate 634 can be mounted onto a stage to move different substrate into position.

4. Combination Laser Pyrolysis and Coating Chambers

Figure 18:
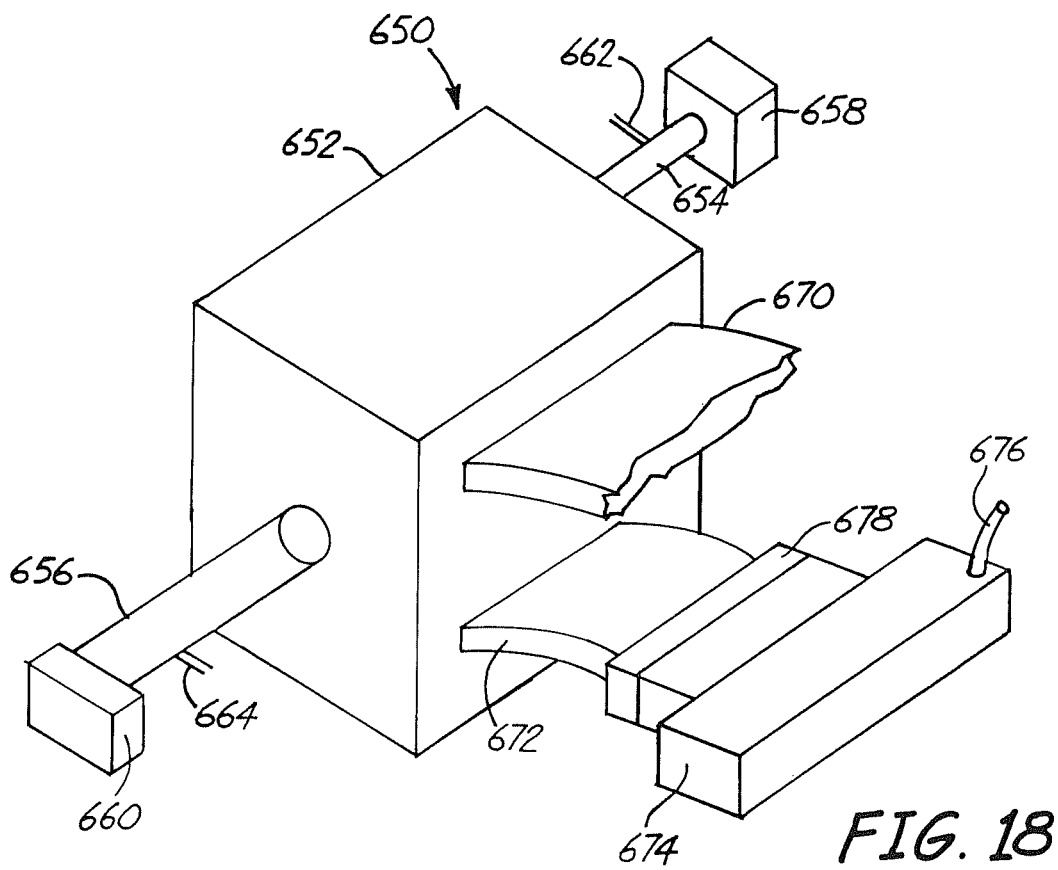
FIG. 18 is a perspective view of a combination particle production chamber and coating chamber.

In some embodiments, the coating is performed within the same chamber in which the particles are produced. An appropriate apparatus 650 for performing the coating within the particle production chamber is shown schematically in FIG. 18. Apparatus 650 includes a chamber 652 and two tubes 654, 656 extending from chamber 652. In this embodiment, tube 654 is connected to a laser 658, although other radiation sources can be used. Tube 656 terminates at a beam dump 660. Tubes 654, 656 extend optical components such as lenses and the like from chamber 652 such that contamination of the optical components by particles is reduced or eliminated. In some embodiments, tubes 654, 656 include inert gas inlets 662, 664 connected to inert gas sources, such that inert gas can be directed into tubes 654, 656 to reduce the flow of containments into tubes 654, 656.

Reactant conduit 670 joins chamber 652 with a reactant delivery system. Suitable reactant delivery systems are described above. In principle, chamber 652 can be vented to the atmosphere, possibly through a scrubber. In these embodiments, flow through the chamber is maintained by the reactant stream. However, in some embodiments an exhaust conduit 672 connects with a pump 674. Pump 674 has an exhaust 676 that vents to the atmosphere directly or through a scrubber. A collector, filter or the like 678 can be placed into the flow to the pump to remove extra particles from the flow. Similarly, valves can be included to control the pumping. In some embodiments, the pressure within the chamber ranges from about 80 Torr to about 700 Torr.

Figure 19:
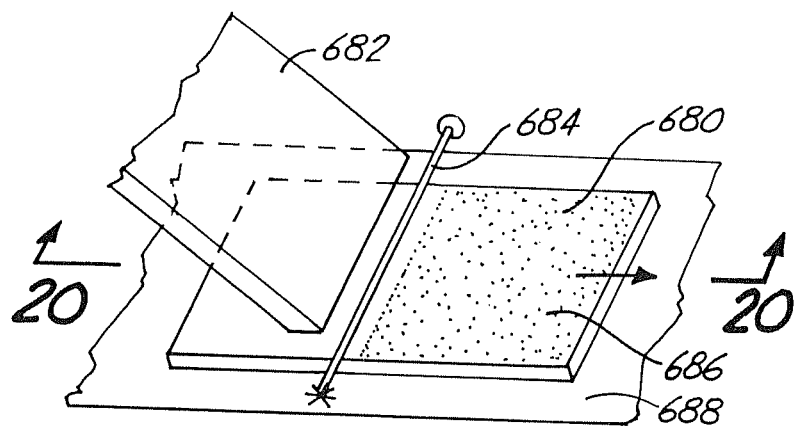
FIG. 19 is a perspective view of a reactant nozzle delivering reactants to a reaction zone positioned near a substrate.
Figure 20:
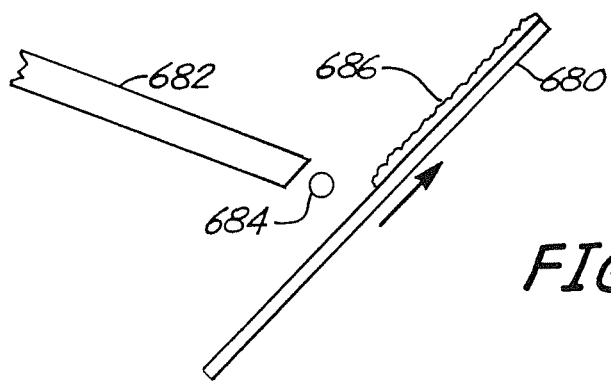
FIG. 20 is a sectional view of the apparatus of FIG. 19 taken along line 20-20.

The inside of the chamber is shown schematically in FIG. 19. A substrate 680 moves relative to a reactant nozzle 682, as indicated by the right directed arrow. Reactant nozzle 682 is located just above substrate 680. An optical path 684 is defined by suitable optical elements that direct a light beam along path 684. Optical path 684 is located between nozzle 682 and substrate 680 to define a reaction zone just above the surface of substrate 680. The hot particles tend to stick to the cooler substrate surface. A sectional view is shown in FIG. 20. A particle coating 686 is formed as the substrate is scanned past the reaction zone.

In general, substrate 680 can be carried on a conveyor 688. In some embodiments, the position of conveyor 688 can be adjusted to alter the distance from substrate 686 to the reaction zone. Changes in the distance from substrate to the reaction zone correspondingly change the temperature of the particles striking the substrate. The temperature of the particles striking the substrate generally alters the properties of the resulting coating and the requirements for subsequent processing, such as a subsequent heat processing consolidation of the coating. The distance between the substrate and the reaction zone can be adjusted empirically to produce desired coating properties. In addition, the stage/conveyor supporting the substrate can include thermal control features such that the temperature of the substrate can be adjusted to higher or lower temperatures, as desired.

Figure 21A:
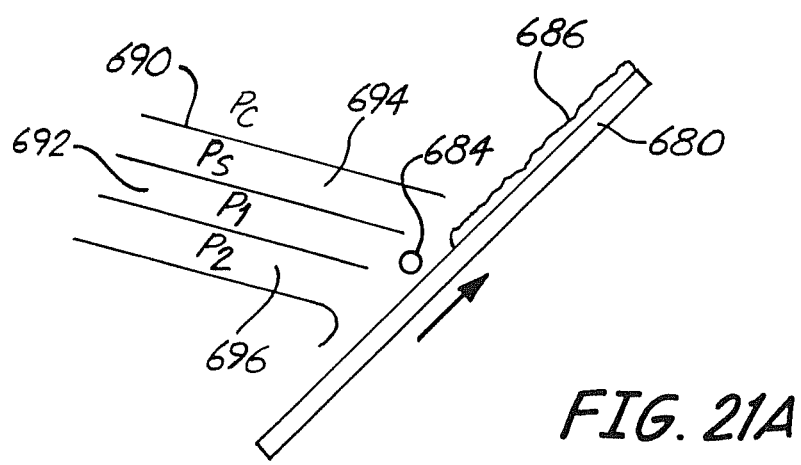
FIG. 21A is a side view of an alternative embodiment of a nozzle depositing reactants in a reaction zone near a substrate surface.

One alternative embodiment of the nozzle is shown in FIG. 21A. Nozzle 690 includes a central reactant conduit 692 at a pressure $P_1$. An adjacent shielding/cooling gas conduit 694 is located downstream relative to the motion of the substrate with respect to the reaction zone. In alternative embodiments, the substrate is moved in the opposite direction with some modification of the deposition conditions. Inert gas at a pressure $P_s$ is directed into the shielding gas/cooling gas conduit. A pump conduit 696 at pressure $P_2$ is located along the other side of the reactant conduit. The chamber pressure is $P_c$. In some embodiments, the order of the pressures is as follows: $P_s \geq P_1 > P_c > P_2$.

The reactants flow down the reactant conduit to the reaction zone at or near where the reactants intersect with the light beam. The shielding/cooling gas helps to prevent the flow of reactant particles through the chamber, and the inert gas further helps to cool the product particles on the surface of the substrate to help the particles condense onto the substrate. The pump conduit is used to remove unreacted gases, inert gases and any residual particles as well as maintain the chamber pressure at desired values. $P_1$, $P_2$ and $P_s$ can be independently set. $P_c$ is determined by the other pressures as well as the chamber design. In general, the pump pressure can be changed to obtain a desired value for the chamber pressure.

Figure 21B:
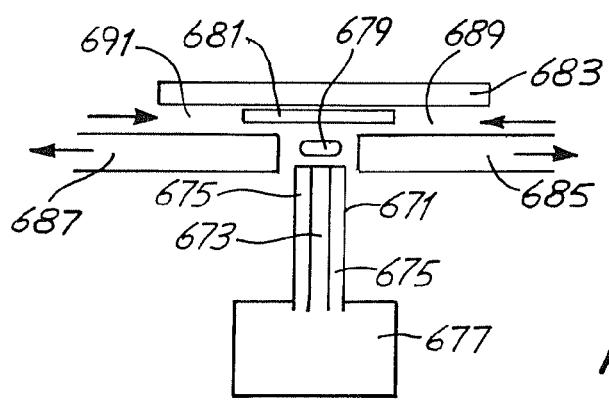
FIG. 21B is a sectional view of another alternative embodiment of a nozzle depositing reactants in a reaction zone near a substrate surface.

Another alternative embodiment of the nozzle is shown in a cross sectional view in FIG. 21B. Reactant delivery nozzle 671 delivers reactants through a central channel 673 and shielding gas through side channels 675. Reactant delivery nozzle 671 is connected to delivery system 677 including reactant sources. Reactant delivery nozzle 671 delivers reactants through a laser beam path 679 such that product particles flow to wafer 681. Wafer 681 is mounted on a movable stage 683 that sweeps wafer 681 though the product stream. Vacuum channels 685, 687 are connected to a suitable pump to maintain the chamber pressure at desired values. Vacuum channels 685, 687 are mounted on either side of the reaction zone where the reactant stream intersects laser beam path 679. Inert buffer gas is directed through gaps 689, 691 between vacuum channels 685, 687 and stage 683.

Figure 22:
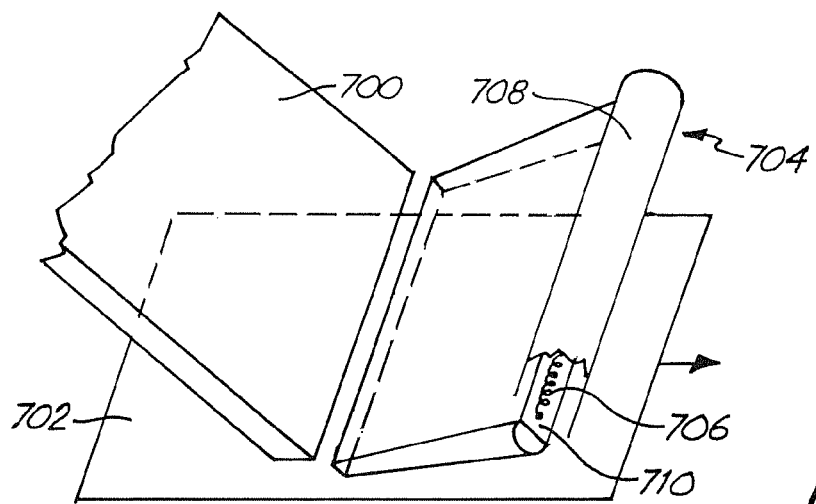
FIG. 22 is a perspective view of an alternative embodiment of a reactant nozzle depositing reactants at a reactant zone near a substrate surface, in which the reaction zone is generated by light from a filament.
Figure 23:
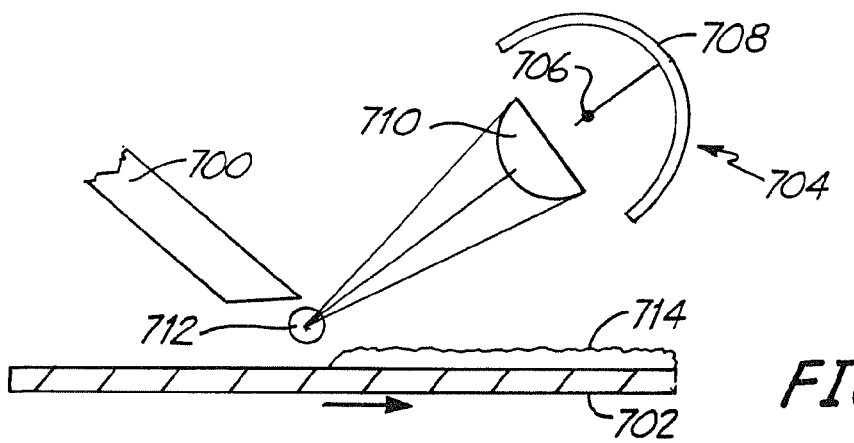
FIG. 23 is a side view of the apparatus of FIG. 22.

For coating within the reaction chamber, it may be desirable to use an incoherent light source located within the chamber rather than a laser. Referring to FIG. 22, reactant nozzle 700 directs reactants toward substrate 702. Substrate 702 moves relative to nozzle 700 as shown with the arrow using a stage, conveyor or the like. As shown in FIGS. 22 and 23, light source 704 includes a linear filament 706, a parabolic mirror 708 and a long cylindrical lens 710. Filament 706 can be selected to emit high intensity infrared light. Parabolic mirror 708 helps to collect light emitted by filament 704 and direct the rays parallel to the axis of the mirror. Cylindrical lens 710 focuses the light at a reaction zone 712 in the path of the reactant stream from nozzle 700. Alternatively, light source 704 can be replaced with a diode laser array or other light emitting diode array of corresponding dimensions and orientation. Substrate 702 moves relative reaction zone 712 as indicated by the arrow. A particle coating 714 results.

5. Control of Particle Production and Coating Deposition

Since a major objective is the generation of substrate coatings with improved uniformity, a significant aspect of achieving this control involves monitoring and adjustment of the processing conditions. Two aspects in particular can be monitored. First, the conditions in the reaction zone can be monitored to ensure uniform products being produced. In addition, the deposition of the particles on the substrate can be monitored to improve the uniformity and flatness of the resulting coating.

Product generation is sensitive to the pressure in the reaction zone. In some embodiments, the pressure in the reaction zone is monitored, for example using a pressure sensor, such as pressure gauge 320, shown in FIG. 5 or comparable pressure sensor in the particular reaction configuration. A processor controller, such as computer 350, can use a feedback loop to maintain the pressure within acceptable ranges. The pressure can be adjusted under computer control by changing the degree of opening of a valve, such as valve 78 of FIG. 3, connected to a pump, adjusting the pumping rate or varying the flow of reactants and/or shielding gas flowing in the vicinity of the reaction zone.

In addition, it may be desirable to control the thermal properties in the reaction zone within a desired range. For example, a thermal detector can be placed in a suitable position to detect energy levels within the reaction zone. To avoid interference with reactant/product flow, the sensor can be placed on or near a wall away from the reactant flow. However, shielding gas generally is used to confine the flow, such that the temperature at a sensor away from the reactant/product flow may not be able to detect the temperature at the reaction zone. However, in one embodiment, a detector includes a broadband infrared detector, such as detector 322 of FIG. 5, oriented to receive infrared emissions from the reaction zone. Suitable detectors include, for example, infrared photodiodes. Infrared emission generally provides an accurate estimate of temperatures in the reaction zone without needing to contact the flow. The temperature of the reaction zone can be maintained within a desired range by a feedback loop controlled by the control computer. For example, the laser power can be adjusted up or down if the temperature reading drops or rises, respectively, relative to the desired range.

While maintaining particle production uniformity is important, the deposition uniformity is also important. The maintenance of a consistent particle production rate may not be sufficient since relatively small fluctuations in precursor delivery may lead to undesirable levels of coating variation if extremely flat coatings are desired. Thus, it is desirable to monitor coating deposition directly to correlate substrate scanning rate with coating deposition.

Figure 24:
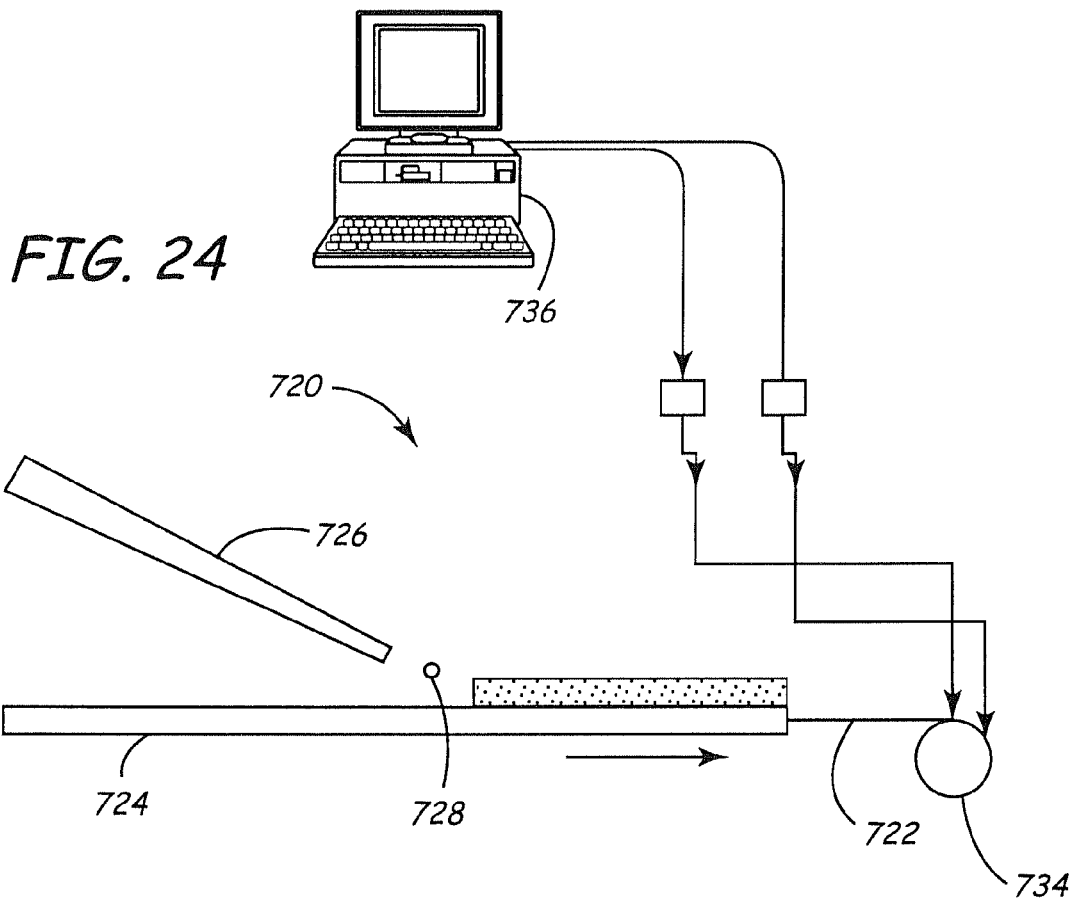
FIG. 24 is a schematic side view of a particle coating apparatus with a beam to control the deposition thickness.
Figure 25:
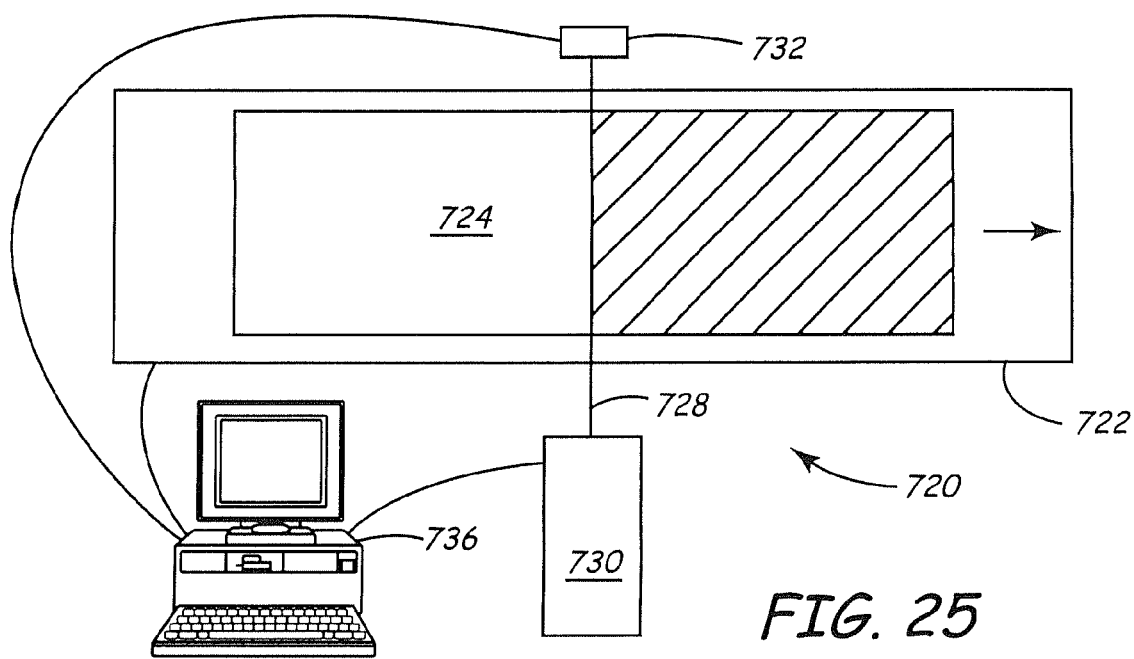
FIG. 25 is a schematic top view of the apparatus of FIG. 24.

Referring to FIGS. 24 and 25, a deposition apparatus 720 includes a conveyor 722 that transports a substrate 724 across the path of a product stream 726. A low power laser beam 728 is directed just above the substrate surface. Laser beam 728 is generated by a laser 730, which can be, for example, a helium/neon laser, a diode laser or any other low power laser. The beam can be focused to a narrow diameter, for example, a one millimeter diameter. The beam is positioned such that the coating blocks a significant portion of the beam when the coating reaches the desired thickness. The beam is terminated by a detector 732, such as a diode detector to measure the laser output that reaches the detector. The measurement system can be mode-locked with a chopper to improve signal-to-noise and to reduce variations from the deposition stream.

Conveyor 722 includes a motor 734, such as a stepper motor or other suitable motor. Conveyor 722 and detector 732 are connected to a control process 736. In some embodiments, conveyor 722 remains at a particular location until the signal from detector 732 indicates that the coating thickness has reached a desired value. Detector values can be calibrated by comparing detector output with coating thicknesses made by visual inspection systems that can make very accurate height measurements. For example, a projected pattern of light can be used in a multiphased structured light measurement system to image an object, as described in U.S. Pat. No. 6,049,384 to Rudd et al., entitled "Method and Apparatus For Three Dimensional Imaging Using Multi-Phased Structured Light," incorporated herein by reference.

When the detector value is reached indicating the desired coating thickness, processor 736 can instruct conveyor 722 to activate motor 734 to advance substrate 724. Substrate 724 is moved to another position until the detector signal again indicates that the desired coating thickness is reached. This process is repeated until the selected portion of the substrate is covered. In alternative embodiments, the substrate can be moved at a slow continuous rate. Measurements from detector 732 can be used to adjust the rate desired amounts to maintain coating thicknesses within acceptable tolerances.

B. Particle Properties

A variety of chemical particles, generally solid particles, can be produced by the methods described herein. Solid particles generally are deposited as powders. Chemical powders of particular interest include, for example, carbon particles, silicon particles, metal particles, and metal/metalloid compounds, such as, metal/metalloid oxides, metal/metalloid carbides, metal/metalloid nitride, metal/metalloid sulfides. Generally, the powders include fine or ultrafine particles with particle sizes in the micron or smaller range.

For some applications, it is desirable to have very uniform particles. Processes using focused radiation are particularly suitable for the formation of highly uniform particles, especially nanoscale particles. In particular, light reactive deposition can produce a collection of particles of interest generally with an average diameter for the primary particles of less than about 750 nm, alternatively from about 3 nm to about 100 ml, similarly from about 3 nm to about 75 nm, and also from about 3 nm to about 50 nm. Particle diameters are evaluated by transmission electron microscopy. Diameter measurements on particles with asymmetries are based on an average of length measurements along the principle axes of the particle.

The agglomeration of nanoparticles is a factor that can affect the coating quality. The flow dynamics of those agglomerates are affected by their size and degree of agglomeration. In general, non-agglomerated particles are more likely to form denser coatings. It should be noted, however, that transmission electron micrographs of particles collected on a filter may not represent the degree of particle agglomeration property shortly after the particles are produced and leave the reaction zone. In many of the light reactive deposition processes, the particles are directly deposited without agglomerating onto the substrate where they are quenched.

The primary particles can have a high degree of uniformity in size. Light reactive deposition, as described above, generally results in particles having a very narrow range of particle diameters. With aerosol delivery of reactants for light reactive deposition, the distribution of particle diameters is particularly sensitive to the reaction conditions. Nevertheless, if the reaction conditions are properly controlled, a very narrow distribution of particle diameters can be obtained with an aerosol delivery system. However, broad distributions of primary particles sizes can also be obtained, if desired, by controlling the flow rates, reactant densities and residence times in light reactive deposition or using other fluid flow reaction systems.

In highly uniform powders, as determined from examination of transmission electron micrographs, the primary particles generally have a distribution in sizes such that at least about 95 percent, and in another embodiment at least about 99 percent, of the primary particles have a diameter in the range(s) greater than about 40 percent of the average diameter and less than about 160 percent of the average diameter. Similarly, in even more highly uniform powders, the primary particles can have a distribution of diameters such that at least about 95 percent, and in another embodiment at least about 99 percent, of the primary particles have a diameter in the range(s) greater than about 60 percent of the average diameter and less than about 140 percent of the average diameter.

Furthermore, in embodiments with highly uniform particles, effectively no primary particles have an average diameter greater than about 4 times the average diameter, with alternative embodiments of greater than about 3 times the average diameter, and greater than about 2 times the average diameter. In other words, the particle size distribution effectively does not have a tail indicative of a small number of particles with significantly larger sizes. This is a result of the small reaction region and corresponding rapid quench of the particles. An effective cut off in the tail of the size distribution indicates that there are less than about 1 particle in 10⁶ have a diameter greater than a specified cut off value above the average diameter. Narrow size distributions, lack of a tail in the distributions and the roughly spherical morphology can be advantageous for obtaining highly uniform coatings.

Small particle size and particle uniformity do contribute overall to the uniformity of the resulting coating. In particular, the lack of particles significantly larger than the average, i.e., the lack of a tail in the particle size distribution, leads to a more uniform coating.

In addition, the particles can have a very high purity level. The nanoparticles produced by the above described methods are expected to have a purity greater than the reactants because the reactions and, when applicable, the crystal formation process tends to exclude contaminants from the particle. Some impurities on the surface of the particles may be removed by heating the particles.

A plurality of types of nanoscale particles can be produced by laser pyrolysis and, alternatively or in addition, by light reactive deposition based on the description above.

Exemplary such nanoscale particles can generally be characterized as comprising a composition including a number of different elements and present in varying relative proportions, where the number and the relative proportions vary as a function of the application for the nanoscale particles. Typical numbers of different elements include, for example, numbers in the range(s) from about 2 elements to about 15 elements, with numbers of 1, 2, 3, 4, 5, 6, 7, 8, 9, 10, 11, 12, 13, 14, and 15 being contemplated. General numbers of relative proportions include, for example, values in the range(s) from about 1 to about 1,000,000, with numbers of about 1, 10, 100, 1000, 10000, 100000, 1000000, and suitable sums thereof being contemplated.

Alternatively or in addition, such nanoscale particles can be characterized as having the following formula:

$$A_a B_b C_c D_d E_e F_f G_g H_h I_i J_j K_k L_l M_m N_n O_o,$$

where each A, B, C, D, E, F, G, H, I, J, K, L, M, N, and O is independently present or absent and at least one of A, B, C, D, E, F, G, H, I, J, K, L, M, N, and O is present and is independently selected from the group consisting of elements of the periodic table of elements comprising Group 1A elements, Group 2A elements, Group 3B elements (including the lanthanide family of elements and the actinide family of elements), Group 4B elements, Group 5B elements, Group 6B elements, Group 7B elements, Group 8B elements, Group 1B elements, Group 2B elements, Group 3A elements, Group 4A elements, Group 5A elements, Group 6A elements, and Group 7A elements; and each a, b, c, d, e, f, g, h, i, j, k, l, m, n, and o is independently selected from a value in the range(s) from about 1 to about 1,000,000, with numbers of about 1, 10, 100, 1000, 10000, 100000, 1000000, and suitable sums thereof being contemplated.

For example, the production of silicon oxide nanoparticles is described in copending and commonly assigned U.S. patent application Ser. No. 09/085,514, now U.S. Pat. No. 6,726,990 to Kumar et al., entitled "Silicon Oxide Particles," incorporated herein by reference. This patent application describes the production of amorphous SiO2. The production of titanium oxide nanoparticles and crystalline silicon dioxide nanoparticles is described in copending and commonly assigned, U.S. patent application Ser. No. 09/123,255, now U.S. Pat. No. 6,387,531 to Bi et al., entitled "Metal (Silicon) Oxide/Carbon Composites," incorporated herein by reference. In particular, this application describes the production of anatase and rutile $TiO_2$.

Amorphous nanoscale powders and glass layers with dopants, such as rare earth dopants and/or other metal dopants, are described in copending and commonly assigned U.S. Provisional Patent Application Ser. No. 60/313,588 to Horne et al., entitled "Doped Glass Materials," incorporated herein by reference. Suitable dopants include rare earth metals, which can impart desirable modifications of properties, such as index-of-refraction. Powders and glass layers can be formed with complex compositions including a plurality of selected dopants in an amorphous material. The powders can be used to form optical materials and the like. The glass layers can be formed by directly depositing a uniform particle coating using light reactive deposition and subsequently annealing the powder into a uniform glass layer.

Amorphous submicron and nanoscale particles can be produced with selected dopants, including rare earth metals, using laser pyrolysis and other flowing reactor systems. Using these approaches a variety of new materials can be produced. The dopants can be introduced at desired stoichiometries by varying the composition of the reactant stream. The dopants are introduced into an appropriate host glass forming material. By appropriately selecting the composition in the reactant stream and the processing conditions, submicron particles incorporating one or more metal or metalloid elements as glass-forming hosts with selected dopants can be formed. Since the host amorphous materials generally are oxides, an oxygen source should also be present in the reactant stream. The conditions in the reactor should be sufficiently oxidizing to produce the oxide materials. Similarly, light reactive deposition can be used to form highly uniform coatings of glasses with dopants including, for example, rare earth dopants and/or complex blends of dopant compositions.

Some metal/metalloid oxides are particularly desirable for optical applications and/or for their ability to anneal into uniform glass layers. Suitable glass forming host oxides for doping include, for example, $TiO_2$, $SiO_2$, $GeO_2$, $Al_2O_3$, $P_2O_5$, $B_2O_3$, $TeO_2$, and combinations and mixtures thereof. While phosphorous is located in the periodic table near the metal elements, it is not generally considered a metalloid element. However, phosphorous in the form of $P_2O_5$ is a good glass former similar to some metalloid oxides, and doped forms of $P_2O_5$ can have desirable optical properties. For convenience, as used herein including in the claims, phosphorous is also considered a metalloid element.

Dopants can be introduced to vary properties of the amorphous particles and/or a resulting glass layer. For example, dopants can be introduced to change the index-of-refraction of the glass. For optical applications, the index-of-refraction can be varied to form specific optical devices that operate with light of a selected frequency range. Dopants can also be introduced to alter the processing properties of the material. In particular, some dopants change the flow temperature, i.e., the glass transition temperature, such that the glass can be processed at lower temperatures. Dopants can also interact within the materials. For example, some dopants are introduced to increase the solubility of other dopants. Rare earth dopants are desirable for their modification of optical properties of the resulting doped material. Rare earth doped glasses are useful in the production of optical amplifiers.

Particles of particular interest include amorphous compositions that form optical glasses with a plurality of dopants. In some embodiments, the one or plurality of dopants are rare earth metals. Rare earth metals are particularly desirable because of their modification of optical properties of the materials. If the particles are annealed into a glass layer, the resulting material can have an index-of-refraction influenced by the rare earth dopants as well as other dopants. In addition, the rare earth dopants influence the optical absorption properties that can alter the application of the materials for the production of optical amplifiers and other optical devices. Rare earth metals include the transition metals of the group IIIb of the periodic table. Specifically, the rare earth elements include Sc, Y and the Lanthanide series. Other suitable dopants include elements of the actinide series. For optical glasses, the rare earth metals of particular interest as dopants, include, for example, Er, Yb, Nd, La, Y, Pr and Tm. Suitable non-rare earth metal dopants include, for example, Bi, Sb, Zr, Pb, Li, Na, JK, Ba, W and Ca.

To form a uniform glass layer, a layer of amorphous particles can be annealed. To anneal the glass, the powders are heated to a temperature above their flow temperature. At these temperatures, the powders densify to form a uniform layer of glass material. Incorporation of the dopants into the particles results in a distribution of the dopants through the densified material directly as a result of the powder deposition.

Material processing remains a significant consideration in the design of desired optical devices. For example, the composition and properties, such as density, of a material are adjusted to obtain materials with a desired index-of-refraction. Similarly, the thermal expansion and flow temperatures of a material have to be consistent with a reasonable processing approach for forming the materials into a monolithic, integrated structure. The consolidated optical materials can have good optical properties such that light transmission through the materials does not result in undesirable amount of loss. In addition, the materials have to be processable under reasonable conditions to form the integrated devices of the integrated optical circuit or electro-optical circuit. Similar material constraints can be problematic for the formation of state-of-the-art integrated electronic devices.

Doped glasses are useful in the production of optical devices. Using the techniques described herein, the doped glasses can be formulated into planar optical devices. The dopant can change the optical properties of the materials to be particularly suitable for particular optical applications. Rare earth doped glasses are particularly suitable for use in the formation of optical amplifiers. The amplifier material is excited by a pump light signal transversely coupled to the optical material. The pump light excites the rare earth doped materials. An optical input passing through the optical material at a lower frequency than the pump signal is then amplified by stimulated emission. Thus, energy from the pump light is used to amplify the input light signal.

In particular, nanoscale manganese oxide particles have been formed. The production of these particles is described in copending and commonly assigned U.S. patent application Ser. No. 09/188,770, now U.S. Pat. No. 6,506,493 to Kumar et al., entitled "Metal Oxide Particles," incorporated herein by reference. This application describes the production of MnO, $Mn_2O_3$, $Mn_3O_4$ and $Mn_5O_8$.

Also, the production of vanadium oxide nanoparticles is described in U.S. Pat. No. 6,106,798 to Bi et al., entitled "Vanadium Oxide Nanoparticles," incorporated herein by reference. Similarly, silver vanadium oxide nanoparticles have been produced, as described in copending and commonly assigned U.S. patent application Ser. No. 09/246,076 to Horne et al., now U.S. Pat. No. 6,225,007, and Ser. No. 09/311,506, now U.S. Pat. No. 6,394,494 to Reitz et al., both entitled "Metal Vanadium Oxide Particles," both of which are incorporated herein by reference.

Furthermore, lithium manganese oxide nanoparticles have been produced by laser pyrolysis along with or without subsequent heat processing, as described in copending and commonly assigned U.S. patent application Ser. No. 09/188,768 now U.S. Pat. No. 6,607,706 to Kumar et al., entitled "Composite Metal Oxide Particles," and Ser. No. 09/334,203, now U.S. Pat. No. 6,482,374 to Kumar et al., entitled "Reaction Methods for Producing Ternary Particles," and U.S. Pat. No. 6,136,287 to Horne et al., entitled "Lithium Manganese Oxides and Batteries," all three of which are incorporated herein by reference.

The production of aluminum oxide nanoparticles is described in copending and commonly assigned, U.S. patent application Ser. No. 09/136,483 to Kumar et al., entitled "Aluminum Oxide Particles," incorporated herein by reference. In particular, this application disclosed the production of $\gamma$-$Al_2O_3$. The formation of delta-$Al_2O_3$ and theta-$Al_2O_3$ by laser pyrolysis/light reactive deposition along with doped-crystalline and amorphous alumina is described in copending and commonly assigned U.S. patent application Ser. No. 09/969,025 to Chiruvolu et al., entitled "Aluminum Oxide Powders," incorporated herein by reference. Amorphous aluminum oxide materials can be combined with other glass formers, such as $SiO_2$ and/or $P_2O_5$. For example, suitable metal oxide dopants for aluminum oxide for optical glass formation include cesium oxide ($Cs_2O$), rubidium oxide ($Rb_2O$), thallium oxide ($Tl_2O$), lithium oxide ($Li_2O$), sodium oxide ($Na_2O$), potassium oxide ($K_2O$), beryllium oxide (BeO), magnesium oxide (MgO), calcium oxide (CaO), strontium oxide (SrO) and barium oxide (BaO). Glass dopants can affect, for example, the index-of-refraction, sintering temperature and/or the porosity of the glass. Suitable metal oxide dopants for infrared emitters include, for example, cobalt oxide ($Co_3O_4$).

In addition, tin oxide nanoparticles have been produced by laser pyrolysis, as described in copending and commonly assigned U.S. patent application Ser. No. 09/042,227, now U.S. Pat. No. 6,200,674 to Kumar et al., entitled "Tin Oxide Particles," incorporated herein by reference. The production of zinc oxide nanoparticles is described in copending and commonly assigned U.S. patent application Ser. No. 09/266,202, now U.S. Pat. No. 7,423,512 to Reitz, entitled "Zinc Oxide Particles," incorporated herein by reference. In particular, the production of ZnO nanoparticles is described.

Submicron and nanoscale particles and corresponding coatings of rare earth metal oxide particles, rare earth doped metal/metalloid oxide particles, rare earth metal/metalloid sulfides and rare earth doped metal/metalloid sulfides are described in copending and commonly assigned U.S. patent application Ser. No. 09/843,195, now U.S. Pat. No. 6,692,660 to Kumar et al, entitled "High Luminescence Phosphor Particles," incorporated herein by reference. Suitable host materials for the formation of phosphors include, for example, ZnO, ZnS, $Zn_2SiO_4$, SrS, $YBO_3$, $Y_2O_3$, $Al_2O_3$, $Y_3Al_5O_{12}$ and $BaMgAl_{14}O_{23}$. Exemplary non-rare earth metals for activating phosphor particles as dopants include, for example, manganese, silver and lead. Exemplary rare earth metals for forming metal oxide phosphors include, for example, europium, cerium, terbium and erbium. Generally, heavy metal ions or rare earth ions are used as activators in phosphors. For phosphor applications, the particles are generally crystalline.

The production of iron, iron oxide and iron carbide is described in a publication by Bi et al., entitled "Nanocrystalline $\alpha$-Fe, $Fe_3C$, and $Fe_7C_3$ produced by $CO_2$ laser pyrolysis," J. Mater. Res. Vol. 8, No. 7 1666-1674 (July 1993), incorporated herein by reference. The production of nanoparticles of silver metal is described in copending and commonly assigned U.S. patent application Ser. No. 09/311,506, now U.S. Pat. No. 6,394,494 to Reitz et al., entitled "Metal Vanadium Oxide Particles," incorporated herein by reference. Nanoscale carbon particles produced by laser pyrolysis is described in a reference by Bi et al., entitled "Nanoscale carbon blacks produced by $CO_2$ laser pyrolysis," J. Mater. Res. Vol. 10, No. 11, 2875-2884 (November 1995), incorporated herein by reference.

The production of iron sulfide ($Fe_{1-x}S$) nanoparticles by laser pyrolysis is described in Bi et al., Material Research Society Symposium Proceedings, vol. 286, p. 161-166 (1993), incorporated herein by reference. Precursors for laser pyrolysis production of iron sulfide were iron pentacarbonyl ($Fe(CO)_5$) and hydrogen sulfide ($H_2S$).

Cerium oxide can be produced using the laser pyrolysis apparatuses described above. Suitable precursors for aerosol delivery include, for example, cerous nitrate ($Ce(NO_3)_3$), cerous chloride ($CeCl_3$) and cerous oxalate ($Ce_2(C_2O_4)_3$). Similarly, zirconium oxide can be produced using the laser pyrolysis apparatuses described above. Suitable zirconium precursors for aerosol delivery include, for example, zirconyl chloride ($ZrOCl_2$) and zirconyl nitrate ($ZrO(NO_3)_2$).

The deposition of coatings of dielectric materials for chip capacitors is described in copending and commonly assigned U.S. Provisional Patent Application serial number 60/312,234 to Bryan, entitled "Reactive Deposition For The Formation Of Chip Capacitors," incorporated herein by reference. Particularly suitable dielectric materials include a majority of barium titanate ($BaTiO_3$), optionally mixed with other metal oxides. Other dielectric oxides suitable for incorporation into ceramic chip capacitors with appropriate dopants include, for example, $SrTiO_3$, $CaTiO_3$, $SrZrO_3$, $CaZrO_3$, $Nd_2O_3$-$2TiO_3$ and $La_2O_3$-$2TiO_2$.

The production of ternary nanoparticles of aluminum silicate and aluminum titanate can be performed by laser pyrolysis following procedures similar to the production of silver vanadium oxide nanoparticles described in copending and commonly assigned U.S. patent application Ser. No. 09/311,506, now U.S. Pat. No. 6,394,494 to Reitz et al., entitled "Metal Vanadium Oxide Particles," incorporated herein by reference. Suitable precursors for the production of aluminum silicate include, for vapor delivery, a mixture of aluminum chloride ($AlCl_3$) and silicon tetrachloride ($SiCl_4$) and, for aerosol delivery, a mixture of tetra(N-butoxy) silane and aluminum isopropoxide ($Al(OCH(CH_3)_2)_3$). Similarly, suitable precursors for the production of aluminum titanate include, for aerosol delivery, a mixture of aluminum nitrate ($Al(NO_3)_3$) and titanium dioxide ($TiO_2$) powder dissolved in sulfuric acid or a mixture of aluminum isopropoxide and titanium isopropoxide ($Ti(OCH(CH_3)_2)_4$).

The formation of submicron and nanoscale particles along with coatings of metal/metalloid compounds with complex anions is described in copending and commonly assigned U.S. patent application Ser. No. 09/845,985 to Chaloner-Gill et al., entitled "Phosphate Powder Compositions And Methods For Forming Particles With Complex Anions," incorporated herein by reference. Suitable complex anions include, for example, phosphates, silicates and sulfates. The compositions can include multiple metal/metalloid elements.

The synthesis by laser pyrolysis of silicon carbide and silicon nitride is described in copending and commonly assigned U.S. patent application Ser. No. 09/433,202 to Reitz et al., entitled "Particle Dispersions," incorporated herein by reference.

In embodiments in which the coating is performed within the same chamber as the particle production, the reaction zone may be positioned close to the substrate surface. In these embodiments, the particles may impact the surface while still significantly hot. Due to the temperature of the particles, the particles may be deformed and possibly fused upon contacting the surface. This deformation and fusion can be increased by heating the substrate. This deformation and fusion process can facilitate subsequent consolidation of the coating into a uniform surface. Since the heated particles may never cool significantly following their formation, the may not be well characterized as solid particles. The term "particles" is used generally to include melted droplets at high temperature or softened particles that are not fully quenched as well as fully quenched solid particles.

C. Particle Deposition Process and Processing of Particle Coatings

The basic process for the deposition of particle coatings has been described in detail above. The features of the coating can be varied to obtain particular objectives. In particular, the coating can be varied at different locations on the surface. In addition, multiple layers of particles can be deposited in a controlled fashion.

First, the particle coating can be applied over the entire surface of the substrate or only a portion of the substrate, for example, with the use of a mask. The procedures described above can be adapted to apply the coating to desired sections, for example by sweeping the substrate relative to the particle nozzle such that only the desired portion of the substrate is swept past the nozzle.

Similarly, the coating can be made a uniform thickness, or different portions of the substrate can be coated with different thicknesses of particles. Different coating thicknesses can be applied by varying the sweep speed of the substrate relative to the particle nozzle or by making multiple sweeps of portions of the substrate that receive a thicker particle coating. The particle composition can be similarly varied over different portions of the substrate. This can be accomplished, for example, by changing the reactant stream during the coating process, or by performing multiple partial coating sweeps over different portions of the substrates.

The temperature of the substrate during the deposition process can be adjusted to achieve particular objectives. For example, the substrate can be cooled during the deposition process since a relatively cool substrate can attract the particles to its surface. However, in some embodiments, the substrate is heated, for example to about 500° C., during the deposition process. Particles stick better to a heated substrate. In addition, the particles tend to compact and fuse on a heated substrate such that a subsequent consolidation of the coating into a fused glass or other material is facilitated if the coating were formed initially on a heated substrate.

In general, the particle coating thickness can be made as thin or as thick, as desired, within the practice limits of the particle size and apparatus size. Of course, the minimum thickness is a monolayer of particles. From a practice sense, it is difficult to apply directly a monolayer of particles uniformly over the substrate. Therefore, a uniform coating of greater than about five times the average particle thickness can be applied in some embodiments. On the other hand, coatings can be applied at arbitrary thicknesses with the only limitation being that more time is required for additional thicknesses. In some embodiments, the thickness of the coating following heat treatment to consolidate the material into a single layer is generally at least about 100 nm.

The particle coating is held together by relatively weak forces. However, for some applications the coated surface may be useful in that form. For most applications, the particle coating is subjected to additional processing. In some embodiments, a binder is directly added to the particle coating to stabilize the coating. The binder can be, for example, an organic polymer material such as polytetrafluoroethylene, polyvinylidene fluoride, polyethylene oxide, polyethylene, polypropylene, polyurethanes, polyacrylates, ethylene-(propylene-diene monomer) copolymer (EPDM) and mixtures and copolymers thereof. The binders can be added, for example, as polymer solutions in a solvent. Volatile solvents can be used that evaporate after addition of the binder. Alternatively, polymer binders can be applied as melts sprayed onto the coating with the polymers solidifying upon cooling. Inorganic binders, such as metals and metal compounds, can be deposited on the particle coating by vapor deposition techniques.

In some embodiments, the particle coatings are heat treated. Heat treatment can melt and fuse the particles and lead to compaction, i.e., densification, of the coating material. This fusing of the particles is generally referred to as consolidation. Sufficient heating can lead to an essentially uniform material in a coating. Generally, the heating is performed under conditions to melt the particles into a viscous liquid. Because of the high viscosity, the material does not flow significantly on the substrate surface. Processing at higher temperatures to reduce the viscosity of the melt can result in undesirable melting of the substrate, migration of compositions between layers or in flow from a selected area of the substrate. Under desired heating conditions, some remnants of the particle characteristics can be found in the surface of the resulting coating even though the material is essentially uniform through the thickness of the coating.

Suitable processing temperatures and time generally depend on the composition of the particles. Small particles on the nanometer scale generally can be processed at lower temperatures and/or for shorter times due to lower melting points for the nanoparticles in comparison with bulk material. In addition, heat treatment can remove undesirable impurities and/or change the stoichiometry and crystal structure of the material. For example, carbon impurities can be removed by heat treatment.

For silicon dioxide coatings formed by flame hydrolysis deposition, it has been observed that heat treatment at 1050° C. for 20 hours or more in a nitrogen atmosphere can reduce undesirable hydrogen content in the form of OH groups in the glass material. See U.S. Pat. No. 4,038,370 to Tokimoto et al. (the '370 patent), entitled "Method of Producing High-Purity Transparent Vitreous Silica," incorporated herein by reference. As described in the '370 patent, the substrate is coated within the periphery of the flame such that molten particles are deposited directly on the substrate to form a continuous material rather than a particle coating. If particles are deposited following formation by flame hydrolysis, the particles can be heated in an oxygen atmosphere at 1500° C. to sinter the particles. See, for example, U.S. Pat. No. 3,934,061 to Keck et al., entitled "Method of Forming Planar Optical Waveguides," incorporated herein by reference. It has been suggested that sintering of silica particles involving a heating step at lower temperatures of about 500° C. followed by gradual heating to higher temperatures of 1100° C. results in fewer OH groups. See U.S. Pat. No. 5,622,750 to Kilian et al., entitled "Aerosol Process For The Manufacture of Planar Waveguides," incorporated herein by reference. Generally, the smaller particles produced by light reactive deposition can be heated under lower temperatures to achieve the same results.

For the processing of silicon oxide nanoparticles, the particle coatings can be heated to a temperature on the order of 1200° C. However, it has been observed generally that nanoscale powders have lower melting temperatures than the corresponding bulk materials and larger particles. Therefore, lower melting temperatures generally can be used with nanoscale particles, although it may be desirable to use a comparable melting temperature to obtain greater surface smoothness that results from improved melting of the nanoparticles.

Heat treatments can be performed in a suitable oven. It may be desirable to control the atmosphere in the oven with respect to pressure and/or the composition of the gases. Suitable ovens include, for example, an induction furnace or a tube furnace with gas flowing through the tube. The heat treatment can be performed following removal of the coated substrates from the coating chamber. In alternative embodiments, the heat treatment is integrated into the coating process such that the processing steps can be performed sequentially in the apparatus in an automated fashion.

For example, referring to FIG. 15 heating elements can be built into the base of stage 592 such that substrates with particle coatings can be heated from below while other substrates are being coated with particles. The heat treatment can be performed using the natural atmosphere in the coating chamber. Alternatively, it may be possible to alter the local environment of the heated substrate by directing a gas flow at the substrate if the pumping capacity is sufficient to prevent significant flow of gas into the coating chamber.

Figure 26:
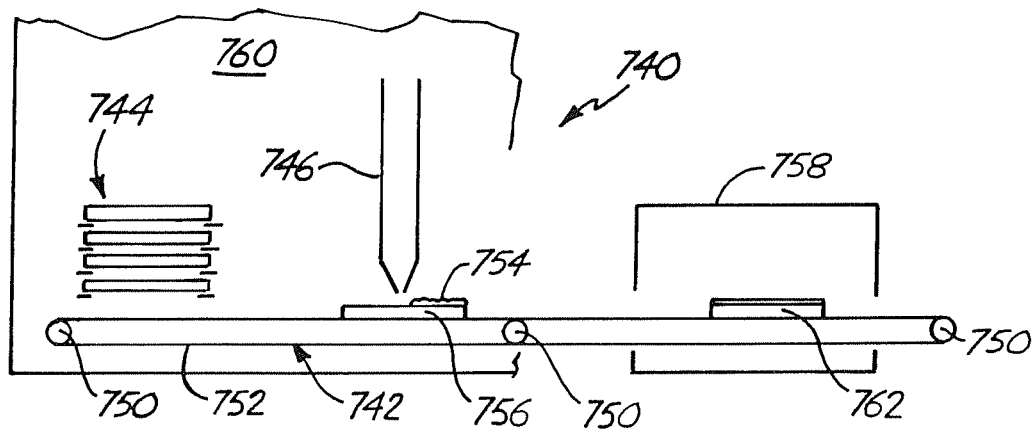
FIG. 26 is a schematic side view of an apparatus that uses a conveyor to transport a substrate with a particle coating into a furnace.

In other embodiments, the substrates with particle coatings are moved to other portions of the apparatus where they can be heated uniformly. This can be accomplished, for example, with a conveyor, such as shown in FIG. 16. Referring to FIG. 26, coating apparatus 740 includes conveyor 742 that transports a substrate from a hopper 744 past a particle nozzle 746. Conveyor 742 can include rollers 750 and a belt 752 or a other comparable structures. A particle coating 754 is placed on substrate 756 at particle nozzle 746.

Conveyor 742 carries a particle coated substrate into oven 758. Oven 758 can be open to the same atmosphere as coating chamber 760, or oven 758 can have separate environmental control. For example, a coated substrate can pass through an air lock to reach oven 758. Alternatively, if oven 758 is connected to a pump, desired gases can be flowed into oven 758. In some embodiments, the pump removes the gases directed into the oven at a sufficient rate to prevent undesired amounts of flow into coating chamber 760 and/or the reaction chamber. Following heating in the oven, heat processed substrates 762 can be collected in a manner consistent with the design of oven 760.

For many applications, it is desirable to apply multiple particle coatings with different compositions. These multiple particle coatings can be arranged adjacent to each other across the x-y plane of the substrate being coated (e.g., perpendicular to the direction of motion of the substrate relative to the product stream), or stacked one on top of the other across the z plane of the substrate being coated, or in any suitable combination of adjacent and stacked layers. Each coating can be applied to a desired thickness. For example, in some embodiments, silicon oxide and doped silicon oxide can be deposited in alternating layers. Specifically, two layers with different compositions can be deposited with one on top of the other, and or additionally or alternatively, with one next to the other, such as layer A and layer B formed as AB. In other embodiments, more than two layers each with different compositions can be deposited, such as layer A, layer B and layer C deposited as three sequential (e.g., stacked one on top of the other, or adjacent to the other, or adjacent and stacked) layers ABC. Similarly, alternating sequences of layers with different compositions can be formed, such as ABABAB . . . or ABCAB-CABC . . . .

For many applications, the desirability of applying multiple particle coatings with different compositions (e.g., adjacent to each other, or stacked one on top of the other) can be suggested by functional requirement(s) for the coated substrate. Thus, for example, in optical applications, it can be desirable to apply multiple coatings with different compositions to achieve one, or any suitable combination of two or more of, the following functions: optical waveguide/conduit/fiber (e.g., Bragg grating), optical attenuator, optical splitter/coupler, optical filter, optical switch, optical amplifier, optical polarizer, optical mirror/reflector, optical phase-retarder, and optical detector. Suitable particle coating materials for each such optical function can be selected from those particles discussed above.

The material with multiple particle coatings can be heat treated after the deposition of each layer or following the deposition of multiple layers or some combination of the two. The optimal processing order generally would depend on the melting point of the materials. Generally, however, heat treating and consolidating the composite layers can occur simultaneously. If the heating temperatures are picked at reasonable values, the melted materials remain sufficiently viscous that the layers do not merge undesirable amounts at their edges. Slight merging of the layers generally does not effect performance unacceptable amounts, especially if the layers are slightly thicker than minimum requirements.

Light reactive deposition (LRD) is a particularly suitable approach for the application of multiple particle layers for simultaneous consolidation through heat treatments. Due to the uniformity that is possible with the LRD approach, multiple layers can be deposited without reaching unacceptable levels of surface smoothness.

In addition, multiple materials with different compositions can be simultaneously produced by laser pyrolysis and simultaneously deposited in a sequential fashion on a substrate. For example, referring to FIG. 27, three laser reaction chambers 770, 772, 774 direct particles along three conduits 776, 778, 780 to substrate 782. The reaction chambers can be configured to produce particles with a different composition or the same composition as the other reaction chambers. Thus, a substrate can be coated with one, two or three different compositions with this embodiment. If two different materials are produced, the different material can be between or adjacent the two layers formed from the same material. As substrate 782 moves along on conveyor 784, particles from conduits 776, 778, 780 are sequentially deposited. The particles can be simultaneously deposited such that all three types of particles are deposited in one pass of the substrate past the conduits.

Figure 28:
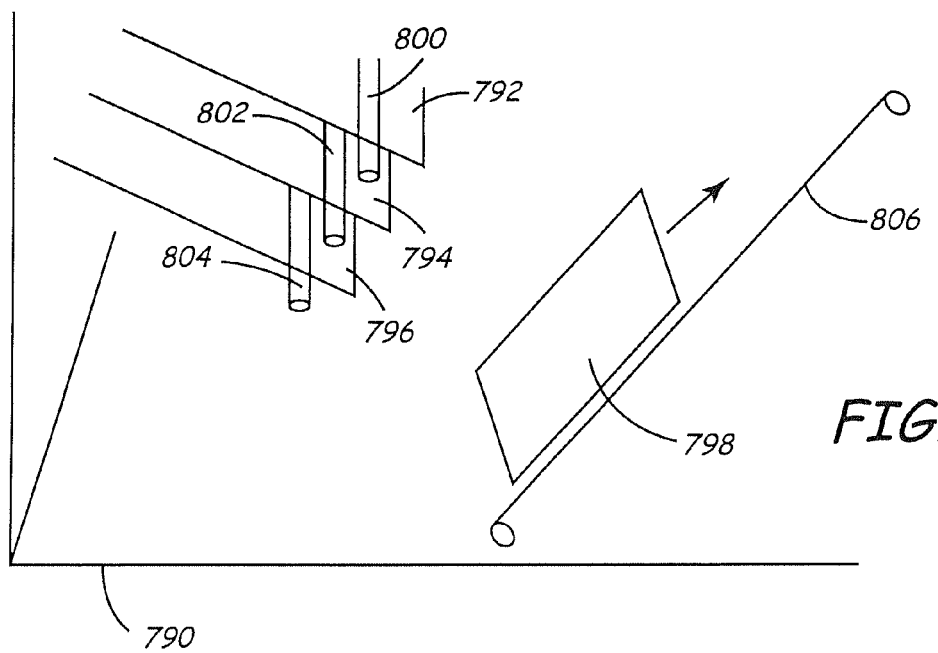
FIG. 28 is a schematic perspective view of three particle streams generated within a reaction chamber that simultaneously deposit particles on a single substrate.

In addition, multiple particle flows can be simultaneously deposited within a single reaction chamber. Referring to FIG. 28, a reaction chamber 790 includes three reactant flows 792, 794, 796 directed toward a substrate 798. In some embodiments, each reactant flow includes a blanket of shielding gas such that the three reactions are isolated from each other by the shielding gas. Three laser beams 800, 802, 804 are directed at reactant flows 792, 794, 796, respectively, to drive the three separate reactions. As substrate 798 moves on conveyor 806, substrate 798 is coated sequentially by particles produced from reactant streams 792, 794, 796. The reactions can be performed simultaneously, such that one pass of the substrate provides a coating with the three reaction products. A reactant stream can have the same or different compositions from the other reactant streams.

Figure 27:
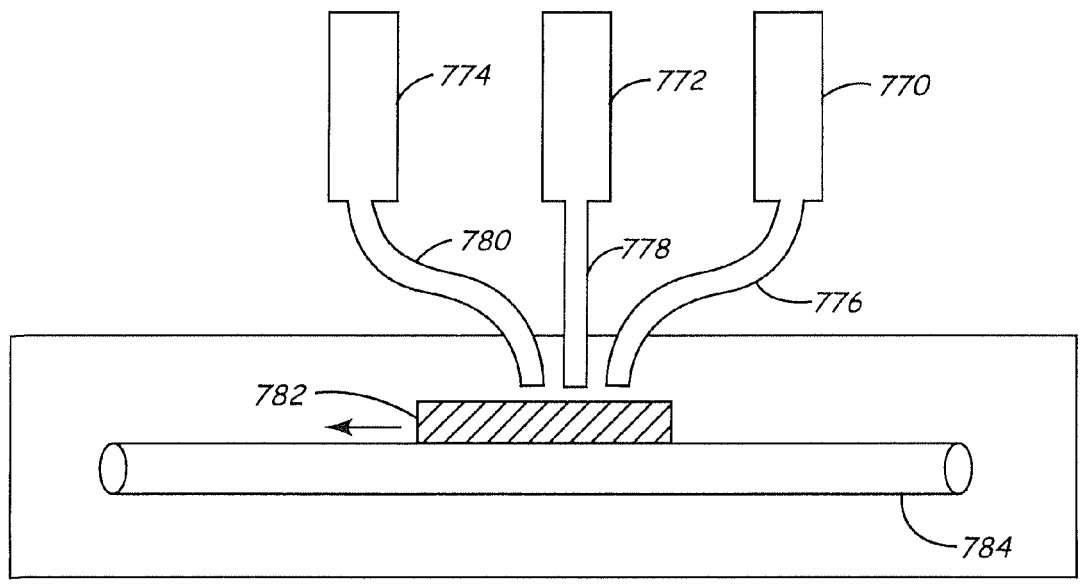
FIG. 27 is a schematic side view of a coating apparatus with three particle conduits connected to three reaction chambers.

In FIGS. 27 and 28, two embodiments are described for the simultaneous deposition of multiple particle layers. Based on the description above, many variations of these embodiments can be straightforwardly generated.

It may be desirable to etch or otherwise process one or more heat treated layers before depositing additional particle layers, as described further below for the formation of planar waveguides. The processing order generally is influenced by the device to be formed and the structure of the device.

D. Optical Device Formation

While the coatings described herein can have a variety of applications, as noted above, optical devices formed on a substrate surface are of particular interest. The control of light propagation along the optical devices requires variation in the index of refraction in adjacent materials. A device can be distinguished by boundaries of a material with an index of refraction that is different from adjacent materials that thereby define the boundaries of the device. A basic feature of the optical devices is that they are produced from a crystalline or amorphous material that is transparent to the electromagnetic radiation to be transmitted through the device. Devices of interest include, for example, optical waveguides and optical couplers.

Waveguides placed on a substrate surface are referred to as planar waveguides. Planar waveguides are useful in the production of integrated optical circuits for optical communication and other opto-electronics applications. Light propagates along a material having a higher refractive index than the surroundings. In some embodiments, the planar waveguides have a thickness approximately equal to the wavelength of the light, i.e., electromagnetic radiation, to be transmitted along the waveguide. In some embodiments, waveguides do not significantly attenuate the light transmitted through the material.

To produce a planar optical waveguide by particle coating technology, generally three layers are deposited. A core layer forms the optical component on an under-cladding layer, and a over-cladding layer encloses the optical component. The under-cladding layer generally is applied between the substrate and the core layer since the substrate generally does not have an appropriate index of refraction. In other words, the core layer may be formed directly onto the substrate surface, however, one or more strata generally are deposited between the core layer and the substrate.

In one embodiment, the substrate is formed from silicon. An under-cladding layer of silicon dioxide is deposited over the substrate. A core layer is then deposited over the cladding layer. The under-cladding layer generally is consolidated prior to the addition of an additional layer, although both layers can be consolidated simultaneously if the heat treatment is performed under suitably mild conditions. If the particles forming the core layer are added after consolidation of the under-cladding layer, the core layer is consolidated following deposition of the particles forming the core layer. The core layer should have an index of refraction greater than the cladding layer. A convenient approach to the production of a layer with a higher index of refraction is to use a doped silicon oxide. Suitable dopants include, for example, titanium oxide, tantalum oxide, tin oxide, niobium oxide, zirconium oxide, aluminum oxide, lanthanum oxide, germanium oxide, boron oxide, other suitable dopants identified herein or combinations thereof.

As the index of refraction of the core material increases, the desired thickness of the layer decreases because of changes in the wavelength with index of refraction. Thus, the correlation between these parameters should be controlled accordingly. The use of excessive amounts of dopants should be avoided since excessive dopants can result in the loss of transparency of the material with respect to the light. The upper limit on the amount of dopant depends on the dopant, although for all materials there would generally be less than about 40% by weight dopant. The undercladding layer and the core layer do not need to be deposited by the same approach, although in some embodiments the layers are sequentially deposited by light reactive deposition followed by a suitable heat treatment.

The core layer can be deposited over selected portions of the substrate to form specific structures. Alternatively, after consolidation of the core layer, the material can be contoured to produce desired devices. The contouring can be performed by patterning with photolithography combined with etching and/or with other techniques used in the formation of electronic integrated circuits. After the formation of the desired structures from the core material, an over-cladding layer generally is applied. The over-cladding layer also has a lower index of refraction than the core layer. The formation of planar waveguides by flame hydrolysis deposition is described further in U.S. Pat. No. 3,934,061 to Keck et al., entitled "Method of Forming Planar Optical Waveguides," incorporated herein by reference.

Figure 29:
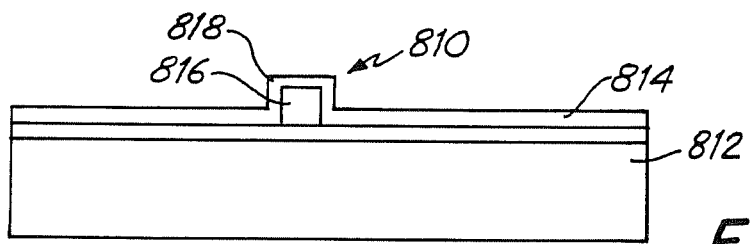
FIG. 29 is a schematic side view of an optical device on a substrate.

An exemplary structure is shown schematically in FIG. 29. Optical component 810 is located on substrate 812. Under-cladding layer 814 is located adjacent substrate 812. Core structure 816 is located on top of cladding layer 814. Over-cladding layer 818 is located on top of core layer 816. Such a structure can be formed by patterning and etching a core layer to form the patterned core structure 816.

Figure 30:
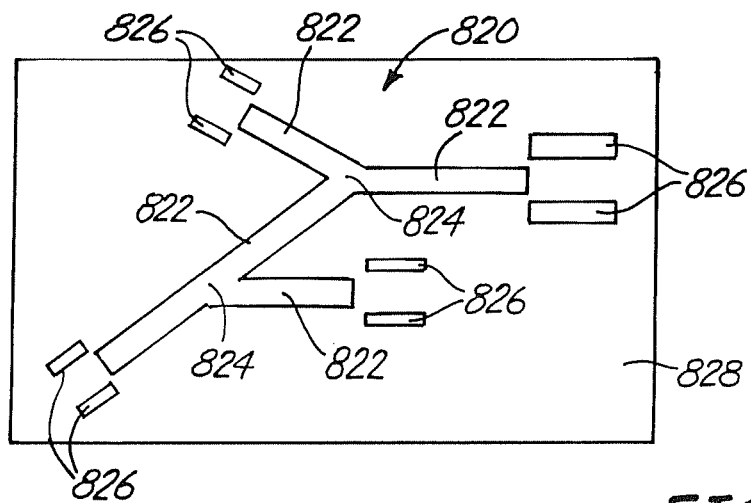
FIG. 30 is a schematic view of coupled optical waveguides on a substrate.

In order to form integrated optical devices on the substrate surface, it can be desirable to form various coupling devices to connect with planar optical waveguides. A variety of devices can be formed. Examples of an integrated structure 820 are shown in FIG. 30. Sections of planar waveguides 822 are connected by branches 824. A plurality of guides 826 is placed on substrate 828. Guides 826 can be used to align and secure components such a fiber optical cables, solid state lasers, detectors and the like in contact with ends of waveguides 822 to couple the different elements. Waveguides 822, branches 824 and guides 826 can be formed by etching the deposited layers to have desired shapes. The formation of such coupling elements is described further in U.S. Pat. No. 4,735,677 to Kawachi et al., entitled "Method For Fabricating Hybrid Optical Integrated Circuit," incorporated herein by reference.

As utilized herein, the term "in the range(s)" or "between" comprises the range defined by the values listed after the term "in the range(s)" or "between", as well as any and all subranges contained within such range, where each such subrange is defined as having as a first endpoint any value in such range, and as a second endpoint any value in such range that is greater than the first endpoint and that is in such range.

EXAMPLES

This example describes the successful coating of a silicon substrate with a silicon oxide glass using light reactive deposition.

Particle coating was been performed using light reactive deposition in which wafer coating was been performed within the reaction chamber by sweeping the substrate through a product particle stream. This example focuses on this embodiment, although successful coating of a wafer within the reaction chamber has also been performed in preliminary experiments with a fixed substrate.

Figure 31:
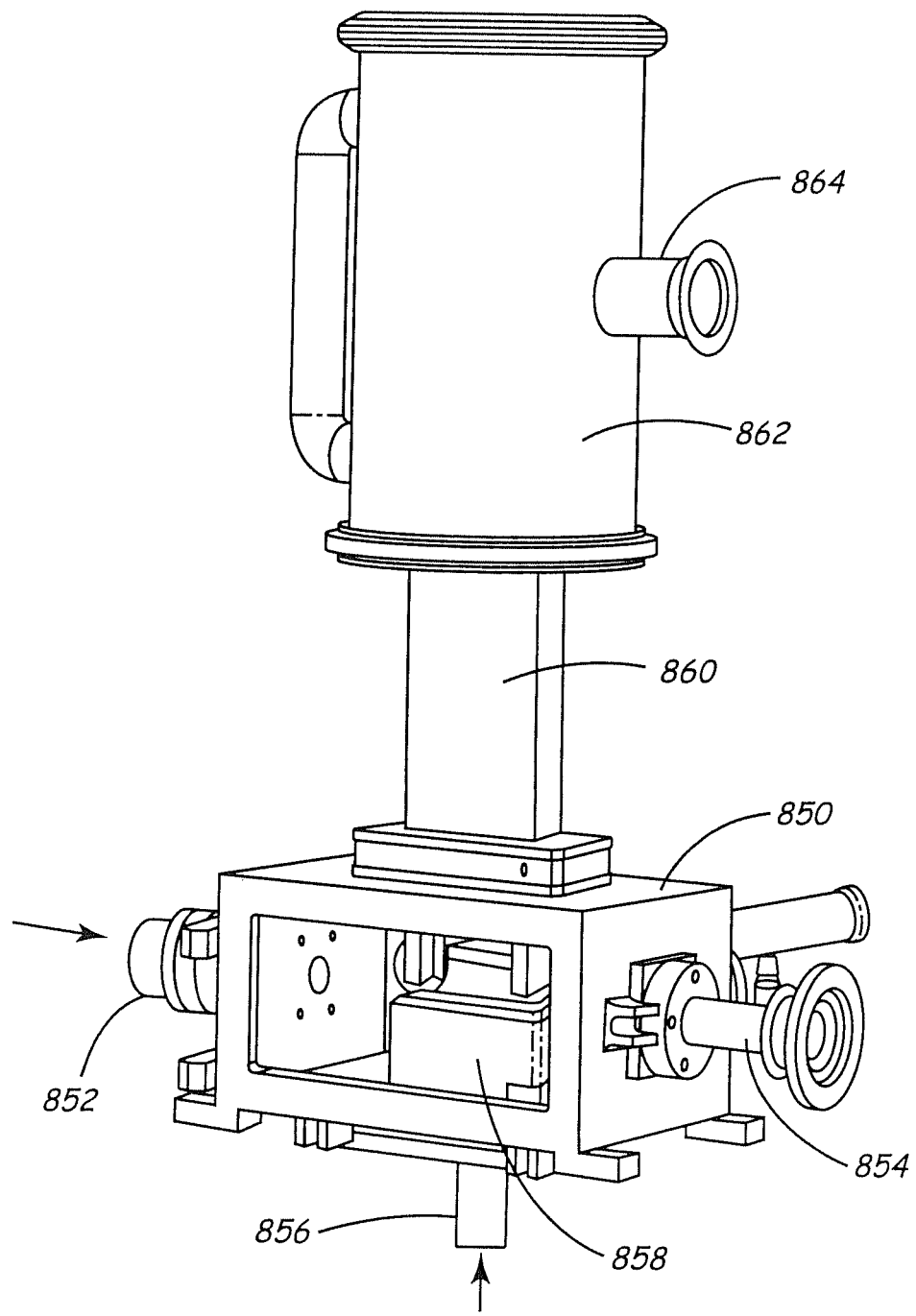
FIG. 31 is a perspective view of a process chamber used for wafer coating with silicon oxide with a panel removed to expose the interior of the chamber.
Figure 32:
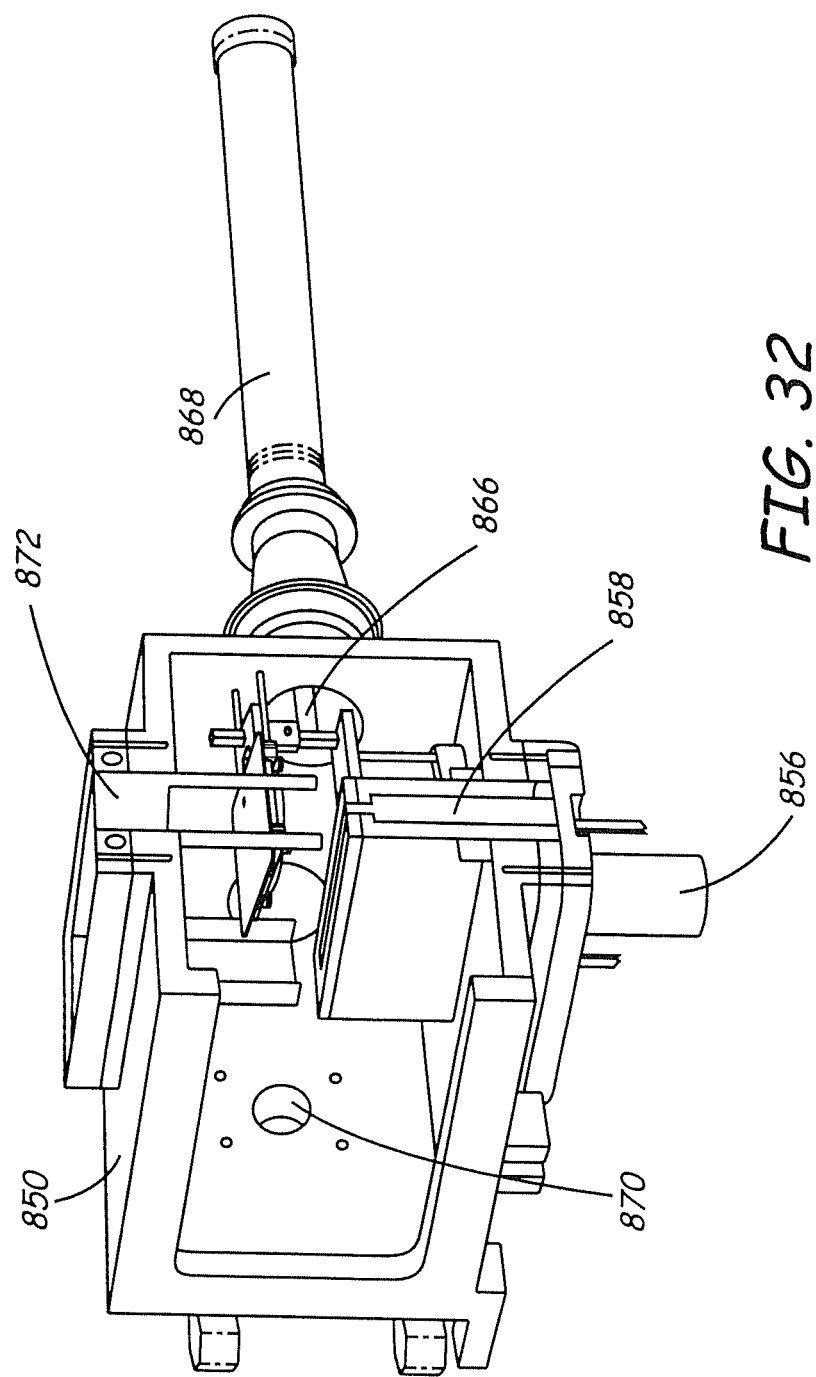
FIG. 32 is an expanded view of the process chamber of FIG. 31.
Figure 33:
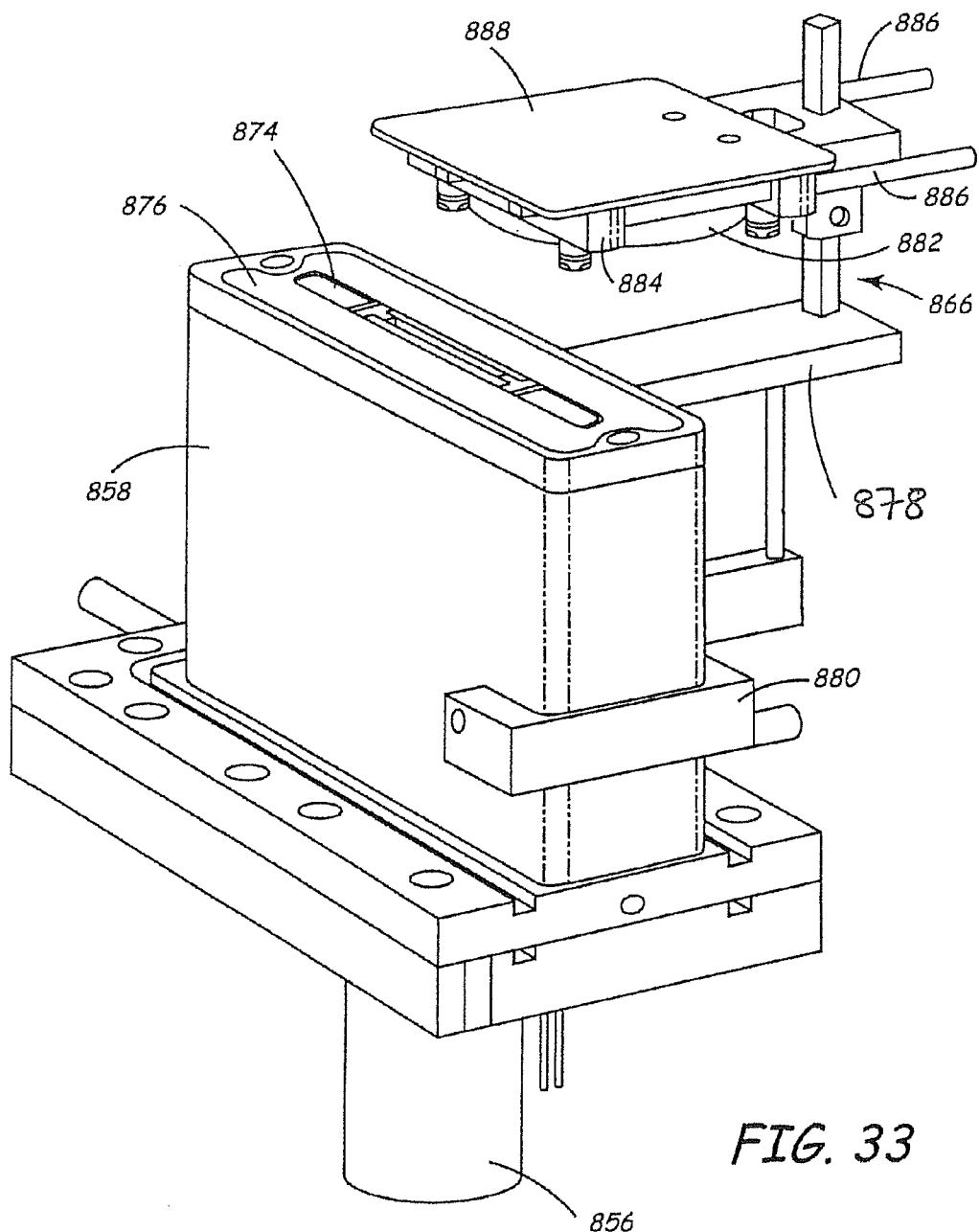
FIG. 33 is an expanded view of the process nozzle and wafer support of the process chamber of FIG. 32.

The apparatus used to coat a substrate/wafer moved through the reaction stream is shown in FIGS. 31-33. Referring to FIG. 31, process chamber 850 includes a light tube 852 connected to a $CO_2$ laser and a light tube 854 connected to a beam dump. An inlet tube 856 connects with a precursor delivery system that delivers vapor reactants and carrier gases. Inlet tube 856 leads to process nozzle 858. A particle transport tube 860 connects to process chamber 850 along the flow direction from process nozzle 858. Particle transport tube 860 leads to a particle filtration chamber 862. Particle filtration chamber 862 connects to a pump at pump connector 864.

An expanded view of process chamber 850 is shown in FIG. 32. A wafer carrier 866 supports a wafer above process nozzle 858. Wafer carrier 866 is connected with an arm 868, which translates the wafer carrier to move the wafer through the particle stream emanating from the reaction zone where the laser beam intersects the precursor stream from process nozzle 858. Arm 868 includes a linear translator that is shielded with a tube. A laser entry port 870 is used to direct a laser beam between process nozzle 858 and the wafer. Unobstructed flow from process nozzle would proceed directly to exhaust nozzle 872, which leads to particle transport tube 860.

Figure 34:
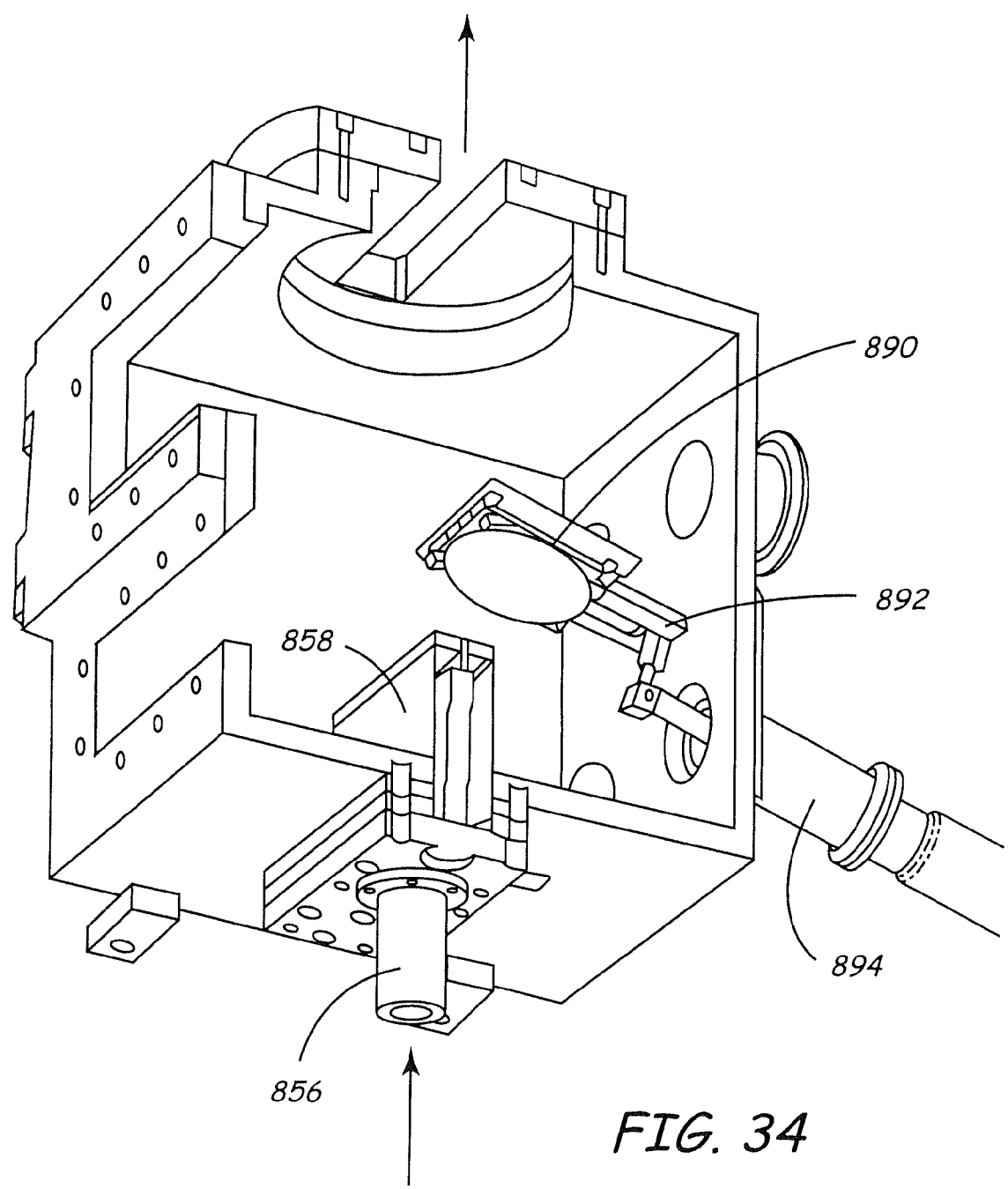
FIG. 34 is an alternative embodiment of the process chamber of FIG. 31.

An expanded view of wafer carrier 866 and process nozzle 858 is shown in FIG. 33. The end of process nozzle 858 has an opening for precursor delivery 874 and a shielding gas opening 876 around precursor opening to confine the spread of precursor and product particles. Wafer carrier 866 includes a support 878 that connects to process nozzle 858 with a bracket 880. A circular wafer 882 is held in a mount 884 such that wafer 882 slides within mount 884 along tracks 886 to move wafer 882 into the flow from the reaction zone. Backside shield 888 prevents uncontrolled deposition of particles on the back of wafer 882. Tracks 886 connect to arm 868. An alternative embodiment, not used for the present examples is shown in FIG. 34. In the embodiment of FIG. 34, wafer 890 is held with a wafer carrier 892 at an angle relative to the flow from process nozzle 858. Linear translator 894 is placed at a similar angle to move wafer 890 through the flow at the selected angle.

$SiO_2$ was coated onto a silicon wafer by light reactive deposition. The reaction was carried out in a chamber comparable to the chamber shown in FIGS. 30-33 with a precursor delivery system similar the system shown schematically in FIG. 5. Silicon tetrachloride (Strem Chemical, Inc., Newburyport, Mass.) precursor vapor was carried into the reaction chamber by bubbling $N_2$ carrier gas through $SiCl_4$ liquid in a container at room temperature. Dopants for the ultimate silica glass were also introduced by bubbling $N_2$ carrier gas through liquid precursors. Dopant precursors were $POCl_3$ and/or $GeCl_4$. Argon gas was mixed with the reactant stream as a diluent/inert gas to moderate the reaction. $C_2H_4$ gas was used as a laser absorbing gas. $O_2$ was used as an oxygen source and was mixed with the reactants. The reactant gas mixture containing $SiCl_4$, argon, nitrogen, dopant precursor ($POCl_3$ and/or $GeCl_4$) and $C_2H_4$ was introduced into the reactant gas nozzle for injection into the process chamber.

During a run, the wafer was moved through the product stream twice at a rate of 0.5 to 1.0 cm/sec. A majority of the powder produced was deposited on the wafer with a portion collected in the pumping system. Representative reaction conditions for the production of silicon oxide coatings are described in Table 1.

TABLE 1

| Sample | 1 | 2 |
|---|---|---|
| Pressure (Torr) | 500 | 350 |
| Ar-Win (slm) | 10 | 10 |
| Ar-Sld. (slm) | 2.8 | 2.8 |
| Ethylene (slm) | 0.75 | 0.75 |
| Carrier Gas for $SiCl_4$—$N_2$ (slm) | 0.41 | 0.41 |
| Carrier Gas for $POCl_3$—$N_2$ (slm) | 0.992 | 1.24 |
| Carrier Gas for $GeCl_4$ (slm) | 0 | 0.2 |
| Oxygen (slm) | 1.268 | 1.268 |
| Argon Dilution Gas (slm) | 5.88 | 5.88 |
| Laser Power - Input (watts) | 1200 | 1200 |
| Laser Power - Output (watts) | 995 | 1000 |
| Run Time (minutes) | 10 | 10 | slm = standard liters per minute
Argon - Win. = argon flow through inlets positions in tubes holding the laser windows.
Argon - Sld. = argon flow as shielding gas surrounding the reactant flow.

Following completion of the coating run, the wafers appeared to have a powdery white coating that appeared uniform across the surface of the wafer. The coating had a thickness of roughly 5 to 6 microns, as measured by scanning electron microscopy (SEM).

The coated wafers were heated in an oven at 1300° C. for 2 hours. After being removed from the oven, the wafers had a clear glass on their surface. The root mean square (RMS) surface roughness s low as about 0.25 to about 0.5 nm was achieved on some wafers. Surface roughness was measured using atomic force microscopy with a 20 by 20 micron scan on a 3000 AFM Instrument from Veeco Instruments, Inc.

The embodiments described above are intended to be illustrative and not limiting. Additional embodiments are within the claims below. Although the present invention has been described with reference to specific embodiments, workers skilled in the art will recognize that changes may be made in form and detail without departing from the spirit and scope of the invention.

What is claimed is:

1. A coating apparatus comprising:
   a reactant inlet defining a reactant stream path wherein the opening of the reactant inlet is elongated in one dimension and wherein the reactant inlet has dimensions selected to coat the entire substrate in a single pass;
   a shielding gas duct positioned to form a blanket of inert gases along the sides of the reactant stream path and connected to a shielding gas source;
   a reactant supply system connected to the reactant inlet to supply all reactants to a flow along the reactant stream path as a reactant stream wherein the reactant supply system comprises a reactant source and a source of light absorbing gas;
   a continuous wave laser initiating a light path;
   optical elements, configured to direct the light path to intersect the reactant stream at a reaction zone with a product stream continuing from the reaction zone in a product stream path, wherein the light path is oriented to project along the elongated dimension of the reactant inlet, wherein the product stream comprises particles downstream from the reaction zone and wherein the light absorbing gas and reactants are selected for absorption of laser light by the light absorbing gas to drive a chemical reaction between the reactants in the reaction zone;
   a first substrate positioned in the product stream path and the first substrate receives deposited particles thereon as a fused particle coating, wherein the first substrate is positioned such that the substrate does not intersect with the light path;
   a motor connected to the apparatus such that the motor is configured to translate the first substrate relative to the product stream path to coat the substrate in a single pass; and
   a chamber sealed from the ambient atmosphere and a pump connected to the chamber, wherein the reactant inlet and the first substrate are within the chamber.

2. The apparatus of claim 1 wherein the motor moves the reactant inlet relative to the chamber.

3. The apparatus of claim 1 wherein the reactant inlet is positioned to deliver the reactant stream in a downward direction.

4. The apparatus of claim 1 wherein the reactant inlet is configured to deliver the reactant stream in an upward direction.

5. The apparatus of claim 1 wherein the chamber and pump are designed for operation over a pressure range from about 250 Torr to about 700 Torr.

6. The apparatus of claim 1 wherein the optical elements comprise a cylindrical lens.

7. The apparatus of claim 1 further comprising a conveyor system interfaced with the motor and supporting the first substrate and a second substrate and configured to translate the first substrate past the product stream and subsequently transport the second substrate into a position for translation past the product stream.

8. The apparatus of claim 1 wherein the reactant supply system comprises a source of gaseous reactants.

9. The apparatus of claim 1 wherein the reactant supply system comprises a source of vapor reactants.

10. The apparatus of claim 1 wherein the reactant supply system comprises an aerosol generator.

11. The apparatus of claim 1 wherein the deposition apparatus further comprises a stage supporting the first substrate and connected to the motor and wherein the motor moves the stage relative to the product stream path to direct the product stream path at different portions of the first substrate.

12. The apparatus of claim 1 wherein the product stream has a shape of a line of particles on the substrate and wherein a motion caused by the motor moves the product stream to sweep the line across the substrate surface.

13. The apparatus of claim 1 wherein a reactant from the reactant source is the light absorbing gas and the reactant source is also the source of light absorbing gas.

* * * * *